US012336427B2

(12) United States Patent
Lin et al.

(10) Patent No.: US 12,336,427 B2
(45) Date of Patent: Jun. 17, 2025

(54) ORGANIC ELECTROLUMINESCENT MATERIALS AND DEVICES

(71) Applicant: Universal Display Corporation, Ewing, NJ (US)

(72) Inventors: Chun Lin, Yardley, PA (US); Nicholas J. Thompson, New Hope, PA (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 891 days.

(21) Appl. No.: 17/360,227

(22) Filed: Jun. 28, 2021

(65) Prior Publication Data

US 2022/0013731 A1 Jan. 13, 2022

Related U.S. Application Data

(60) Provisional application No. 63/049,901, filed on Jul. 9, 2020.

(51) Int. Cl.
| | |
|---|---|
| *H10K 50/12* | (2023.01) |
| *H10K 85/30* | (2023.01) |
| *H10K 85/40* | (2023.01) |
| *H10K 85/60* | (2023.01) |
| *H10K 50/11* | (2023.01) |
| *H10K 101/00* | (2023.01) |
| *H10K 101/10* | (2023.01) |
| *H10K 101/30* | (2023.01) |

(52) U.S. Cl.
CPC ....... *H10K 85/6572* (2023.02); *H10K 85/324* (2023.02); *H10K 85/342* (2023.02); *H10K 85/346* (2023.02); *H10K 85/371* (2023.02); *H10K 85/381* (2023.02); *H10K 85/40* (2023.02); *H10K 85/622* (2023.02); *H10K 85/623* (2023.02); *H10K 85/624* (2023.02); *H10K 85/654* (2023.02); *H10K 85/6574* (2023.02); *H10K 85/6576* (2023.02); *H10K 50/11* (2023.02); *H10K 2101/10* (2023.02); *H10K 2101/30* (2023.02); *H10K 2101/90* (2023.02)

(58) Field of Classification Search
None
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | VanSlyke et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,528,187 B1 | 3/2003 | Okada | |
| 6,687,266 B1 | 2/2004 | Ma et al. | |
| 6,835,469 B2 | 12/2004 | Kwong et al. | |
| 6,921,915 B2 | 7/2005 | Takiguchi et al. | |
| 7,087,321 B2 | 8/2006 | Kwong et al. | |
| 7,090,928 B2 | 8/2006 | Thompson et al. | |
| 7,154,114 B2 | 12/2006 | Brooks et al. | |
| 7,250,226 B2 | 7/2007 | Tokito et al. | |
| 7,279,704 B2 | 10/2007 | Walters et al. | |
| 7,332,232 B2 | 2/2008 | Ma et al. | |
| 7,338,722 B2 | 3/2008 | Thompson et al. | |
| 7,393,599 B2 | 7/2008 | Thompson et al. | |
| 7,396,598 B2 | 7/2008 | Takeuchi et al. | |
| 7,431,968 B1 | 10/2008 | Shtein et al. | |
| 7,445,855 B2 | 11/2008 | Mackenzie et al. | |
| 7,534,505 B2 | 5/2009 | Lin et al. | |
| 2002/0034656 A1 | 3/2002 | Thompson et al. | |
| 2002/0134984 A1 | 9/2002 | Igarashi | |
| 2002/0158242 A1 | 10/2002 | Son et al. | |
| 2003/0138657 A1 | 7/2003 | Li et al. | |
| 2003/0152802 A1 | 8/2003 | Tsuboyama et al. | |
| 2003/0162053 A1 | 8/2003 | Marks et al. | |
| 2003/0175553 A1 | 9/2003 | Thompson et al. | |

(Continued)

FOREIGN PATENT DOCUMENTS

| | | | | |
|---|---|---|---|---|
| CN | 108735910 A | * | 11/2018 | ......... H01L 51/5012 |
| CN | 108807704 A | * | 11/2018 | ......... H01L 51/5028 |

(Continued)

OTHER PUBLICATIONS

Machine translation of WO-2019240545-A1, translation generated Mar. 2024, 25 pages. (Year: 2024).*
Machine translation of CN-108807704-A, translation generated Mar. 2024, 9 pages. (Year: 2024).*
Franz, Alexandra, et al. Acta Crystallographica Section B: Structural Science, Crystal Engineering and Materials 76.2 (2020): 267-274. (Year: 2020).*
Passarelli, James V., et al. Journal of the American Chemical Society 140.23 (2018): 7313-7323. (Year: 2018).*
Zhang, Xin, et al. The Journal of Physical Chemistry C 123.50 (2019): 30099-30105. (Year: 2019).*

(Continued)

*Primary Examiner* — Robert S Loewe
(74) *Attorney, Agent, or Firm* — DUANE MORRIS LLP

(57) ABSTRACT

Provided is an OLED that includes, sequentially: an anode; a first emissive region; and a cathode; wherein the first emissive region comprises: a first compound; and a second compound; wherein the first compound is capable of functioning as a perovskite emitter in an OLED; wherein the second compound is capable of functioning as an emitter in an OLED, wherein the second compound is selected from the group consisting of phosphorescent emitters, fluorescent emitters, and delayed fluorescent emitters.

20 Claims, 3 Drawing Sheets

(56) References Cited

U.S. PATENT DOCUMENTS

| | | |
|---|---|---|
| 2003/0230980 A1 | 12/2003 | Forrest et al. |
| 2004/0036077 A1 | 2/2004 | Ise |
| 2004/0137267 A1 | 7/2004 | Igarashi et al. |
| 2004/0137268 A1 | 7/2004 | Igarashi et al. |
| 2004/0174116 A1 | 9/2004 | Lu et al. |
| 2005/0025993 A1 | 2/2005 | Thompson et al. |
| 2005/0112407 A1 | 5/2005 | Ogasawara et al. |
| 2005/0238919 A1 | 10/2005 | Ogasawara |
| 2005/0244673 A1 | 11/2005 | Satoh et al. |
| 2005/0260441 A1 | 11/2005 | Thompson et al. |
| 2005/0260449 A1 | 11/2005 | Walters et al. |
| 2006/0008670 A1 | 1/2006 | Lin et al. |
| 2006/0202194 A1 | 9/2006 | Jeong et al. |
| 2006/0240279 A1 | 10/2006 | Adamovich et al. |
| 2006/0251923 A1 | 11/2006 | Lin et al. |
| 2006/0263635 A1 | 11/2006 | Ise |
| 2006/0280965 A1 | 12/2006 | Kwong et al. |
| 2007/0190359 A1 | 8/2007 | Knowles et al. |
| 2007/0278938 A1 | 12/2007 | Yabunouchi et al. |
| 2008/0015355 A1 | 1/2008 | Schafer et al. |
| 2008/0018221 A1 | 1/2008 | Egen et al. |
| 2008/0106190 A1 | 5/2008 | Yabunouchi et al. |
| 2008/0124572 A1 | 5/2008 | Mizuki et al. |
| 2008/0220265 A1 | 9/2008 | Xia et al. |
| 2008/0297033 A1 | 12/2008 | Knowles et al. |
| 2009/0008605 A1 | 1/2009 | Kawamura et al. |
| 2009/0009065 A1 | 1/2009 | Nishimura et al. |
| 2009/0017330 A1 | 1/2009 | Iwakuma et al. |
| 2009/0030202 A1 | 1/2009 | Iwakuma et al. |
| 2009/0039776 A1 | 2/2009 | Yamada et al. |
| 2009/0045730 A1 | 2/2009 | Nishimura et al. |
| 2009/0045731 A1 | 2/2009 | Nishimura et al. |
| 2009/0101870 A1 | 4/2009 | Prakash et al. |
| 2009/0108737 A1 | 4/2009 | Kwong et al. |
| 2009/0115316 A1 | 5/2009 | Zheng et al. |
| 2009/0165846 A1 | 7/2009 | Johannes et al. |
| 2009/0167162 A1 | 7/2009 | Lin et al. |
| 2009/0179554 A1 | 7/2009 | Kuma et al. |
| 2018/0090709 A1* | 3/2018 | Meng ................... H10K 50/171 |
| 2018/0182977 A1* | 6/2018 | Hirose ................. H10K 50/115 |
| 2020/0220094 A1* | 7/2020 | Matsushima .......... H10K 50/12 |
| 2020/0287153 A1* | 9/2020 | Li ........................ H10K 50/125 |
| 2021/0130686 A1* | 5/2021 | Lim ...................... C09K 11/565 |
| 2021/0210707 A1* | 7/2021 | Levermore .......... H10K 50/852 |
| 2021/0217996 A1* | 7/2021 | Hamilton ............. H10K 50/868 |
| 2021/0305529 A1* | 9/2021 | Lee ........................ H10K 50/16 |
| 2022/0002618 A1* | 1/2022 | Li ........................... C09K 11/66 |
| 2022/0195290 A1* | 6/2022 | Aoki ................... C09K 11/665 |
| 2022/0393128 A1* | 12/2022 | Lee ........................ H10K 50/13 |

FOREIGN PATENT DOCUMENTS

| | | | |
|---|---|---|---|
| EP | 0650955 | 5/1995 | |
| EP | 1725079 | 11/2006 | |
| EP | 2034538 | 3/2009 | |
| JP | 200511610 | 1/2005 | |
| JP | 2007123392 | 5/2007 | |
| JP | 2007254297 | 10/2007 | |
| JP | 2008074939 | 4/2008 | |
| KR | 20200077201 A * | 6/2020 | ............. H01L 51/50 |
| WO | 01/39234 | 5/2001 | |
| WO | 02/02714 | 1/2002 | |
| WO | 02015654 | 2/2002 | |
| WO | 03040257 | 5/2003 | |
| WO | 03060956 | 7/2003 | |
| WO | 2004093207 | 10/2004 | |
| WO | 2004107822 | 12/2004 | |
| WO | 2005014551 | 2/2005 | |
| WO | 2005019373 | 3/2005 | |
| WO | 2005030900 | 4/2005 | |
| WO | 2005089025 | 9/2005 | |
| WO | 2005123873 | 12/2005 | |
| WO | 2006009024 | 1/2006 | |
| WO | 2006056418 | 6/2006 | |
| WO | 2006072002 | 7/2006 | |
| WO | 2006082742 | 8/2006 | |
| WO | 2006098120 | 9/2006 | |
| WO | 2006100298 | 9/2006 | |
| WO | 2006103874 | 10/2006 | |
| WO | 2006114966 | 11/2006 | |
| WO | 2006132173 | 12/2006 | |
| WO | 2007002683 | 1/2007 | |
| WO | 2007004380 | 1/2007 | |
| WO | 2007063754 | 6/2007 | |
| WO | 2007063796 | 6/2007 | |
| WO | 2008056746 | 5/2008 | |
| WO | 2008101842 | 8/2008 | |
| WO | 2008132085 | 11/2008 | |
| WO | 2009000673 | 12/2008 | |
| WO | 2009003898 | 1/2009 | |
| WO | 2009008311 | 1/2009 | |
| WO | 2009018009 | 2/2009 | |
| WO | 2009021126 | 2/2009 | |
| WO | 2009050290 | 4/2009 | |
| WO | 2009062578 | 5/2009 | |
| WO | 2009063833 | 5/2009 | |
| WO | 2009066778 | 5/2009 | |
| WO | 2009066779 | 5/2009 | |
| WO | 2009086028 | 7/2009 | |
| WO | 2009100991 | 8/2009 | |
| WO | WO-2019240545 A1 * | 12/2019 | ......... H01L 51/0003 |

OTHER PUBLICATIONS

Matsushima, Toshinori, et al. Advanced Materials 30.38 (2018): 1802662. (Year: 2018).*

Billing, David G. et al. CrystEngComm 9.3 (2007): 236-244. (Year: 2007).*

Di Stasio, Francesco, et al. Chemistry of Materials 29.18 (2017): 7663-7667. (Year: 2017).*

Machine translation of KR-20200077201-A, translation generated Mar. 2024, 18 pages. (Year: 2024).*

Gao, Chun-Hong, et al. "84% efficiency improvement in all-inorganic perovskite light-emitting diodes assisted by a phosphorescent material." RSC advances 8.28 (2018): 15698-15702. (Year: 2018).*

Matsushima, Toshinori, et al. "Enhanced Electroluminescence from Organic Light-Emitting Diodes with an Organic-Inorganic Perovskite Host Layer." Advanced Materials 30.38 (2018): 1802662. (Year: 2018).*

Adachi, Chihaya et al., "Organic Electroluminescent Device Having a Hole Conductor as an Emitting Layer," Appl. Phys. Lett., 55(15): 1489-1491 (1989).

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 1, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

Hamada, Yuji et al., "High Luminance in Organic Electroluminescent Devices with Bis(10-hydroxybenzo[h]quinolinato) beryllium as an Emitter, " Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

(56) References Cited

OTHER PUBLICATIONS

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).
Huang, Jinsong et al., "Highly Efficient Red-Emission Polymer Phosphorescent Light-Emitting Diodes Based on Two Novel Tris(1-phenylisoquinolinato-C2, N)iridium(III) Derivatives," Adv. Mater., 19:739-743 (2007).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of CHF3," Appl. Phys. Lett., 78(5):673-675 (2001).
Ikai, Masamichi et al., "Highly Efficient Phosphorescence From Organic Light-Emitting Devices with an Exciton-Block Layer," Appl. Phys. Lett., 79(2):156-158 (2001).
Ikeda, Hisao et al., "P-185 Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis [2-(2-benzothiazoyl)phenolato]zinc(II) as host material," Appl. Phys. Lett., 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).
Kwong, Raymond C. et al., "High Operational Stability of Electrophosphorescent Devices," Appl. Phys. Lett., 81(1) 162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Lo, Shih-Chun et al., "Blue Phosphorescence from Iridium(III) Complexes at Room Temperature," Chem. Mater., 18 (21)5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10): 1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).

Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota, Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based On Silole Derivatives And Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91: 209-215 (1997).
Shirota, Yasuhiko et al., "Starburst Molecules Based on pi-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing NÔCÔN-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. östergård et al., "Langmuir-Blodgett Light-Emitting Diodes Of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2- α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69 (15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).

* cited by examiner

ORGANIC ELECTROLUMINESCENT MATERIALS AND DEVICES

CROSS-REFERENCE TO RELATED APPLICATIONS

This application claims priority under 35 U.S.C. § 119(e) to U.S. Provisional Application No. 63/049,901, filed on Jul. 9, 2020, the entire contents of which are incorporated herein by reference.

FIELD

The present disclosure generally relates to organometallic compounds and formulations and their various uses including as emitters in devices such as organic light emitting diodes and related electronic devices.

BACKGROUND

Opto-electronic devices that make use of organic materials are becoming increasingly desirable for various reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials.

OLEDs make use of thin organic films that emit light when voltage is applied across the device. OLEDs are becoming an increasingly interesting technology for use in applications such as flat panel displays, illumination, and backlighting.

One application for phosphorescent emissive molecules is a full color display. Industry standards for such a display call for pixels adapted to emit particular colors, referred to as "saturated" colors. In particular, these standards call for saturated red, green, and blue pixels. Alternatively, the OLED can be designed to emit white light. In conventional liquid crystal displays emission from a white backlight is filtered using absorption filters to produce red, green and blue emission. The same technique can also be used with OLEDs. The white OLED can be either a single emissive layer (EML) device or a stack structure. Color may be measured using CIE coordinates, which are well known to the art.

SUMMARY

In one aspect, the present disclosure provides an OLED device with perovskite materials functioning as sensitizer, acceptor, or light recycling agent is described. Perovskite materials containing at least one deuterium atom or other novel functioning group is also described. Different methods of producing such device are also described here.

Provided is an OLED comprising, sequentially: an anode; a first emissive region; and a cathode; wherein the first emissive region comprises: a first compound; and a second compound; wherein the first compound is a material that is capable of functioning as a perovskite emitter in an OLED at room temperature; and the second compound is a material that is capable of functioning as an emitter in an OLED at room temperature, wherein the second compound is selected from the group consisting of phosphorescent emitters, fluorescent emitters, and delayed fluorescent emitters.

In yet another aspect, the present disclosure provides a consumer product comprising the OLED of the present disclosure.

A formulation comprising the first compound and the second compound is also provided.

A method for fabricating the OLED of the present disclosure is also provided.

Also disclosed is a premixed co-evaporation source that is a mixture of a first compound and a second compound; where the co-evaporation source is a co-evaporation source configured as a powder mixture or a solid mixture formatted to fit in an evaporation crucible for a vacuum deposition process or an OVJP process. In the premixed co-evaporation source, the first compound is a material that is capable of functioning as a perovskite emitter in an OLED at room temperature, and the second compound is selected from the group consisting of: (1) a compound that is capable of functioning as a phosphorescent emitter at room temperature; (2) a compound that can meet at least one of the following conditions: (a) a compound that is capable of functioning as a TADF emitter in an OLED at room temperature; and (b) a compound that is capable of forming an exciplex with another compound in the mixture when the two compounds are in an OLED at room temperature; and (3) a compound that is capable of functioning as a fluorescent emitter in an OLED at room temperature. In the mixture of the first compound and the second compound, the first compound has an evaporation temperature Temp1 of 150 to 350° C.; where the second compound has an evaporation temperature Temp2 of 150 to 350° C.; where absolute value of Temp1−Temp2 is less than 20° C.; where the first compound has a concentration C1 in said mixture and a concentration C2 in a film formed by evaporating the mixture in a vacuum deposition tool at a constant pressure between $1\times10^{-6}$ Torr to $1\times10^{-9}$ Torr, at a 2 Å/sec deposition rate on a surface positioned at a predefined distance away from the mixture being evaporated; and where absolute value of (C1−C2)/C1 is less than 5%.

DETAILED DESCRIPTION

A. Terminology

Figure 1:
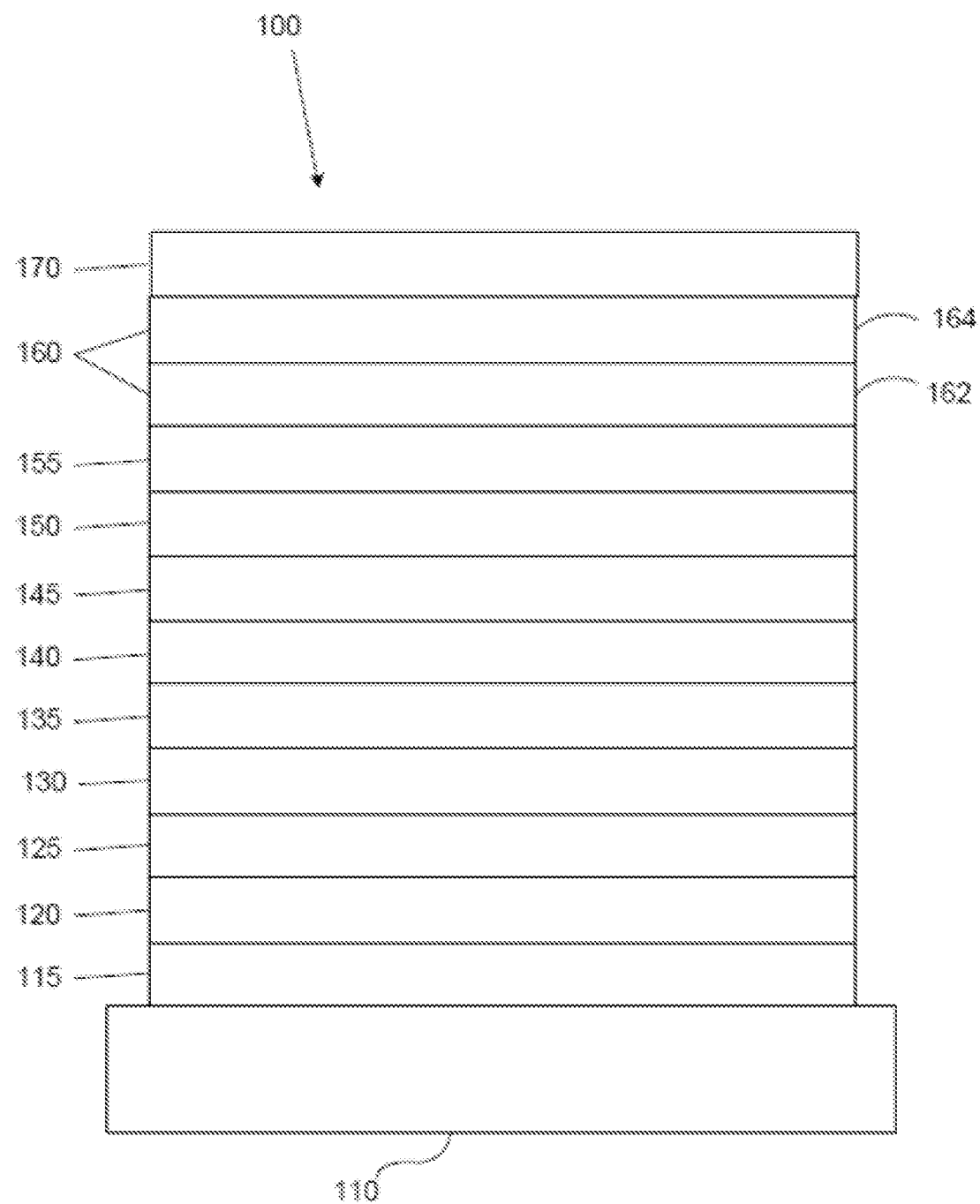
FIG. 1 shows an organic light emitting device.

Unless otherwise specified, the below terms used herein are defined as follows:

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

The terms "halo," "halogen," and "halide" are used interchangeably and refer to fluorine, chlorine, bromine, and iodine.

The term "acyl" refers to a substituted carbonyl radical (C(O)—$R_s$).

The term "ester" refers to a substituted oxycarbonyl (—O—C(O)—$R_s$ or —C(O)—O—$R_s$) radical.

The term "ether" refers to an —O$R_s$ radical.

The terms "sulfanyl" or "thio-ether" are used interchangeably and refer to a —S$R_s$ radical.

The term "selenyl" refers to a —Se$R_s$ radical.

The term "sulfinyl" refers to a —S(O)—$R_s$ radical.

The term "sulfonyl" refers to a —$SO_2$—$R_s$ radical.

The term "phosphino" refers to a —P($R_s$)$_3$ radical, wherein each $R_s$ can be same or different.

The term "silyl" refers to a —Si($R_s$)$_3$ radical, wherein each $R_s$ can be same or different.

The term "germyl" refers to a —Ge($R_s$)$_3$ radical, wherein each $R_s$ can be same or different.

The term "boryl" refers to a —B($R_s$)$_2$ radical or its Lewis adduct —B($R_s$)$_3$ radical, wherein $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group may be optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group may be optionally substituted.

The term "alkenyl" refers to and includes both straight and branched chain alkene radicals. Alkenyl groups are essentially alkyl groups that include at least one carbon-carbon double bond in the alkyl chain Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group may be optionally substituted.

The term "alkynyl" refers to and includes both straight and branched chain alkyne radicals. Alkynyl groups are essentially alkyl groups that include at least one carbon-carbon triple bond in the alkyl chain. Preferred alkynyl groups are those containing two to fifteen carbon atoms. Additionally, the alkynyl group may be optionally substituted.

The terms "aralkyl" or "arylalkyl" are used interchangeably and refer to an alkyl group that is substituted with an aryl group. Additionally, the aralkyl group may be optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, germyl, boryl, selenyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, boryl, and combinations thereof.

In some instances, the more preferred general substituents are selected from the group consisting of deuterium, fluorine, alkyl, cycloalkyl, alkoxy, aryloxy, amino, silyl, boryl, aryl, heteroaryl, sulfanyl, and combinations thereof.

In yet other instances, the most preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents zero or no substitution, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (*Reviews*) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2, 2' positions in a biphenyl, or 1, 8 position in a naphthalene, as long as they can form a stable fused ring system.

B. The OLED of the Present Disclosure

Perovskite light emitting devices have recently shown great advances in performance and have reached over 20% external quantum efficiency (EQE). A key feature of perovskite materials is the small Stokes shifts, which can lead to the re-absorption and re-emission process. The inventive OLED architecture disclosed herein utilizes this key feature to recycle the light in an OLED device. Meanwhile, perovskite material itself can also function as a sensitizer or an acceptor in a sensitizing device.

The perovskite materials described in this invention has general formula of $ABX_3$ for 3-D structure, in which A and B are cations and X are anions that octahedrally coordinate to B. The large A-site cations and the smaller B-site cations, allowing $BX_6$ octahedra to corner-share in a 3D framework, with the A-site cations located in the framework cavities. When at least one of A, B, or X ions are organic, typically, the A cation is organic, the material is called organic-inorganic hybrid perovskite.

The perovskite materials described herein can also refer to lower-dimensional perovskites, which normally result from different cuts of the 3-D structure, including the most common <100>-, <110>-, and <111>-oriented families. In the organic-inorganic hybrid perovskites, the organic cations provide a remarkable structural tunability for the material, which in turn provides various property tunability. According to the present disclosure, the organic cations with some novel functional groups have also been disclosed. For example, the deuterium atom, which can provide better stability due to the isotope effect; some other groups, such as cycloalkyl, and aromatic fused rings having at least two rings, which should provide more tunable features to this class of material.

Although perovskite-based light emitting devices have realized over 20% EQE, calculations show that the recycling events should enable EQEs in excess of 40%. This suggests that the current devices may not have achieved the charge-to-excited state conversion of 100%. Meanwhile, organic light emitting devices based on phosphorescent emitters have demonstrated EQE near the maximum for their dipole orientation which indicates near unity charge-to-excited state conversion. Therefore, a light emitting device where the perovskite material is sensitized by a typical organic light emitting material can realize the advantages of the OLED device for charge-to-excited state conversion while also benefiting from the photon recycling of the perovskite.

For sensitization to work in this embodiment, the excited state energy of the organic light emitting element should be higher than that of the perovskite material and the final emission of light emitting device is at least 50% due to the perovskite material. In some embodiments of these devices, the organic light emitting material may be inter-mixed with the perovskite-based light emitting material while in other embodiments it may be beneficial to have distinct layers of each material. Further, some device may require additional hole blocking or electron blocking layers to maximize performance by containing excited states or charges to the emissive region.

In addition to the benefit of photon recycling from the perovskite material, the inclusion of perovskite material in the emissive layer and the energy transfer of the excited state from the organic emitting material to the perovskite emitting material in some cases can result in a shortening of the excited state lifetime. If this were to occur, then the device may be stabilized. Without being bound to theory, one can hypothesize that as the concentration of excited states is reduced under operation at a fixed current density due to the decreased excited state lifetime, then the concentration of excited states in the emissive layer is lessened. This will lead to a smaller number of multi-state interactions that are often thought to be responsible for degradation of LED devices, organic LED devices in particular. In some cases, the energy transfer from or to the perovskite material occurs in ways that do not modify the excited state lifetime. These cases include, but are not limited to, photon emission followed by absorption.

In another example, where a light emitting device architecture using only the organic emitting materials fulfills all of the end application requirements except that the efficiency is not high enough, adding the perovskite-based material to the emissive region recycles the waveguided light and will result in higher efficiency devices. In this embodiment, the excited state of the perovskite is higher in energy than that of the organic emissive material and the perovskite can re-absorb the emission from the organic material and energy transfer its excited state to the organic emissive material, i.e. recycle photons. Enabling photon recycling increases efficiency without adding any spectral contamination compared to the organic emitter only device in this embodiment.

The photon recycling benefit can be seen by constructing a simple ray tracing like numeric model for a bottom emitting OLED. In this model, we calculate the total energy distribution of an OLED assuming the following possible final states for energy: (1) light outside the device, (2) energy lost to the plasmonic mode, (3) energy in the substrate waveguide mode, (4) energy in the organic waveguide mode, and (5) heat generated from non-radiative decays of excitons. The difference between substrate guided light and organic waveguide mode is that photon recycling can only occur for light trapped in the organic waveguide mode. The organic waveguide mode occurs within the organic/perovskite materials stack. The substrate waveguide mode occurs in the glass substrate and the transparent conducting electrode layer, if either are present, in bottom emitting OLEDs. In top emitting OLEDs, there would only be organic waveguide mode. The calculation is performed by initiating a fixed number of excitons in the device and then allocating those excitons between the following events: (1) generate light outside the device, (2) lose the exciton to the plasmon mode, (3) lose energy to the substrate waveguide mode, (4) lose energy to the organic waveguide mode, and (5) lose energy to heat for emitters with a photoluminescence quantum yield lower than 100%. After allocating the excitons to those modes, we take the amount of energy that is lost to the organic waveguide mode and absorb a fraction of the photons, generating a new batch of excitons. For these new excitons, we then allocate fractions of them again to the possible events (1) to (5). We then run a fixed number of events where the number of events is set so that the lateral propagation distance is similar to the width of an OLED pixel.

Figure 3:
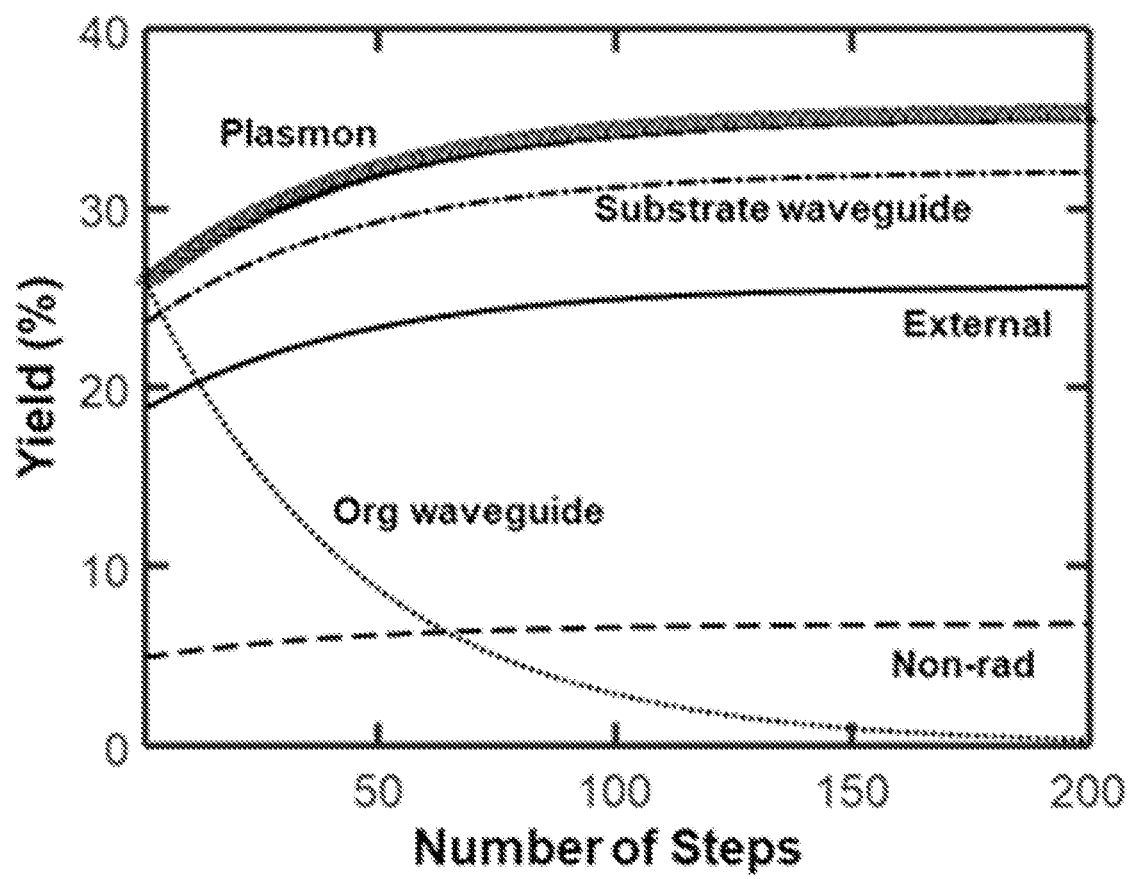
FIG. 3 is an illustration showing the modeled yield of photon recycling process. As the number of steps increases the yield saturates as no additional energy is recycled any more.

In FIG. 3, illustrates the modeled yield of each of the possible pathways for energy discussed above vs. the number of steps taken. At each time step, 25% of the excitons are converted to energy in the plasmon mode, 20% of the excitons are coupled to external light, 1-PLQY (where PLQY is the photoluminescent quantum yield) is coupled to heat and the remaining excitons are coupled to the two waveguide modes. Of the energy going to the waveguide modes, we assumed 50% of it goes into the substrate waveguide mode while the remaining 50% goes to the organic waveguide mode which is available for photon recycling. For each step, we assume that 3% of the photons in the organic waveguide mode are re-absorbed to form excitons. For the model data in FIG. 3, the PLQY was assumed to be 95%. We find that photon recycling increases the possible external quantum yield from 19% (which is the PLQY multiplied by the external coupling fraction for excitons) to 25.6%. In this model, the assumption of only 20% of photons going external is based on an outcoupling fraction for an isotropically oriented emitter in a bottom emitting OLED. In a top emitting OLED, where there is no substrate guided mode, the increases in efficiency could be even greater as there would be more photon recycling events.

The data in FIG. 3 is only to provide guidance on the advantages of photon recycling that it can significantly improve the efficiency of the device. We note that the increased efficiency of the device also means that a pixel would be driven at a lower current density to reach the same brightness, which means the device may also have increased stability.

In some embodiments, the vertical dipole ratio (VDR) of the two materials is not the same. In some embodiments, the VDR is lower for the material that is emitting the majority of the light. The lower the VDR of a material, the larger the fraction of energy, that is emitted by the material, that is converted to light that can be viewed outside the device. In some embodiments, the lowest energy emissive state has the lower VDR, enabling even higher efficiencies to be obtained from the photon recycling process. In some embodiments, the emitting material has a VDR less than 0.2, more preferably a VDR less than 0.15, more preferably a VDR less than 0.1, most preferably a VDR less than 0.05.

Provided is an OLED according to the present disclosure, the OLED comprising, sequentially: an anode; a first emissive region; and a cathode; wherein the first emissive region comprises: a first compound; and a second compound; wherein the first compound is a material that is capable of functioning as a perovskite emitter in an OLED; and the second compound is a material that is capable of functioning as an emitter in an OLED. The second compound can be selected from the group consisting of phosphorescent emitters, fluorescent emitters, and delayed fluorescent emitters.

In some embodiments of the OLED of the present disclosure, the second compound is capable of functioning as a phosphorescent emitter in an OLED at room temperature. In some embodiments, the second compound is capable of functioning as a fluorescent emitter in an OLED at room temperature. In some embodiments, the second compound is capable of functioning as a delayed fluorescent emitter in an OLED at room temperature.

In some embodiments, each of the first compound and the second compound are in separate layers within the first emissive region. In some embodiments, each of the first compound and the second compound are in separate layers next to each other, meaning the two layers are in contact with each other, within the first emissive region.

In some embodiments, the first compound and the second compound are present as a mixture in the first emissive region.

In some embodiments, the first emissive region comprises one or more layers and each of the one or more layers comprises at least one of the first compound and the second compound.

In some embodiments, the first emissive region emits light when a voltage is applied across the OLED, wherein the emission energy of the second compound is higher than the emission energy of the first compound; and excited states are transferred from the second compound to the first compound. This does not mean that the first compound does not emit any light. There can be some non-negligible residual emission from the first compound.

In some embodiments where the first emissive region emits light when a voltage is applied across the OLED, at least 65% of the emission from the first emissive region is produced from the first compound with a luminance of at least 10 cd/m$^2$. In some embodiments, at least 75% of the emission from the first emissive region is produced from the first compound with a luminance of at least 10 cd/m$^2$. In some embodiments, at least 85% of the emission from the first emissive region is produced from the first compound with a luminance of at least 10 cd/m$^2$. In some embodiments, at least 95% of the emission from the first emissive region is produced from the first compound with a luminance of at least 10 cd/m$^2$.

In some embodiments, the first emissive region emits light when a voltage is applied across the OLED, wherein emission energy of the first compound is higher than emission energy of the second compound; and excited states are transferred from the first compound to the second compound. This does not mean that the second compound does not emit any light. There can be some non-negligible residual emission from the second compound.

In some embodiments where the first emissive region emits light when a voltage is applied across the OLED, at least 65% of the emission from the first emissive region is produced from the second compound with a luminance of at least 10 cd/m$^2$. In some embodiments, at least 75% of the emission from the first emissive region is produced from the second compound with a luminance of at least 10 cd/m$^2$. In some embodiments, at least 85% of the emission from the first emissive region is produced from the second compound with a luminance of at least 10 cd/m$^2$. In some embodiments, at least 95% of the emission from the first emissive region is produced from the second compound with a luminance of at least 10 cd/m$^2$.

In some embodiments, the OLED emits light comprising an emission component from both the first compound and the second compound when a voltage is applied across the OLED; wherein at least 30% of the emission spectrum of the second compound is overlapped with the absorption spectrum of the first compound. Because the perovskite material is the first compound, this overlap is needed, otherwise photon recycling cannot occur. If the perovskite does not absorb the emission of the second compound, there cannot be any photon recycling process. In some embodiments, the OLED emits light comprising an emission component from both the first compound and the second compound when a voltage is applied across the OLED; wherein at least 30% of the emission spectrum of the first compound is overlapped with the absorption spectrum of the second compound.

In some embodiments where both the first compound and the second compound emit light, at least 40% of the emission spectrum of the second compound is overlapped with the absorption spectrum of the first compound. In some embodiments, at least 50% of the emission spectrum of the second compound is overlapped with the absorption spectrum of the first compound. In some embodiments, at least 60% of the emission spectrum of the second compound is overlapped with the absorption spectrum of the first compound. In some embodiments, at least 70% of the emission spectrum of the second compound is overlapped with the absorption spectrum of the first compound.

In some embodiments of the OLED, the first compound is a perovskite compound having the formula of $[A]_a[B]_b[X]_c$; where [A] is one or more types of organic cation or metal cation; [B] is one or more types of metal or metalloid cation; and [X] is one or more types of anions; a is an integer from 1 to 6; b is an integer from 1 to 6; and c is an integer from 1 to 21.

In some embodiments of the OLED, the perovskite compound having the formula of $[A]_a[B]_b[X]_c$ is selected from the group consisting of compounds of formula $[A][B][X]_3$, compounds of formula $[A']_2[A]_{n-1}[B]_n[X]_{3n+1}$, compounds of formula $[A']_2[A]_n[B]_n[X]_{3n+2}$, and compounds of formula $[A']_2[A]_{n-1}[B]_n[X]_{3n+3}$; wherein n is an integer from 1 to 6; [A'] is one or more types of organic cation or metal cation; wherein when [A'] is an organic cation, two [A'] can bond together to make $[A']_2$ into [A''] with double charge of [A'].

In some embodiments of the OLED, [A] has the formula selected from the group consisting of Cs$^+$, (R$^A$R$^B$R$^C$R$^D$N)$^+$, (R$^E$R$^F$N=R$^G$R$^H$)$^+$, and combination thereof, wherein each R$^A$, R$^B$, R$^C$, R$^D$, R$^E$, R$^F$, R$^G$, and R$^H$ is independently selected from the group consisting of hydrogen, deuterium, alkyl, cycloalkyl, heteroalkyl, heterocycloalkyl, arylalkyl, amino, aryl, heteroaryl, and combinations thereof. In some embodiments, each R$^A$, R$^B$, R$^C$, R$^D$, R$^E$, R$^F$, R$^G$, and R$^H$ is independently selected from the group consisting of hydrogen, deuterium, alkyl, cycloalkyl, amino, aryl, and combinations thereof. In some embodiments, [A] has the formula selected from the group consisting of (R$^A$H$_3$N)$^+$, (NH$_4$)$^+$, (R$^E$R$^F$N=CHR$^H$)$^+$, (H$_2$N=CHNH$_2$)$^+$, and combinations thereof. In some embodiments, [B] is selected from the group consisting of Sn$^{2+}$, Pb$^{2+}$, Ge$^{2+}$, Mg$^{2+}$, Ca$^{2+}$, Sr$^{2+}$, Cu$^{2+}$, Ni$^{2+}$, Cd$^{2+}$, Mn$^{2+}$, Fe$^{2+}$, Co$^{2+}$, Pd$^{2+}$, Yb$^{2+}$, Eu$^{2+}$, and combinations thereof. In some embodiments, [X] is selected from the group consisting of Cl$^-$, Br$^-$, I$^-$, and combinations thereof.

In some embodiments of the OLED, the perovskite compound is in a form selected from the group consisting of nanocrystals, thin films, large crystalline domains with crystal sizes at least 10 micrometers, single crystals, and combinations thereof.

In some embodiments of the OLED, the perovskite compound is selected from the group consisting of CsPbCl$_x$Br$_{3-x}$, CH$_3$NH$_3$PbBr$_3$, HC(NH$_2$)$_2$PbBr$_3$, CsPbI$_{3-x}$Br$_x$, CH$_3$NH$_3$PbI$_{3-x}$Cl$_x$; and HC(NH$_2$)$_2$PbI$_{3-x}$Cl$_x$; wherein x is a natural number from 0 to 3.

In some embodiments of the OLED, S$_1$-T$_1$ energy gap of the second compound is less than 300 meV. In some embodiments, S$_1$-T$_1$ energy gap of the second compound is less than 250 meV. In some embodiments, S$_1$-T$_1$ energy gap of the second compound is less than 200 meV. In some embodiments, S$_1$-T$_1$ energy gap of the second compound is less than 150 meV. In some embodiments, S$_1$-T$_1$ energy gap of the second compound is less than 100 meV.

In some embodiments of the OLED, the second compound is capable of emitting light from a triplet excited state to a ground singlet state in the OLED at room temperature.

In some embodiments of the OLED, the second compound is a metal coordination complex having a metal-carbon bond. In some embodiments of the OLED, the second compound is a metal coordination complex having a metal-nitrogen bond. In some embodiments of the OLED, the metal is selected from the group consisting of Ir, Rh, Re, Ru, Os, Pt, Au, Ag, and Cu. In some embodiments, the metal is Ir. In some embodiments, the metal is Pt.

In some embodiments of the OLED, the second compound has the formula of $M(L^1)_x(L^2)_y(L^3)_z$; where, L$^1$, L$^2$ and L$^3$ can be the same or different;
x is 1, 2, or 3;
y is 0, 1, or 2;
z is 0, 1, or 2;
x+y+z is the oxidation state of the metal M;
L$^1$, L$^2$ and L$^3$ are each independently selected from the group consisting of:

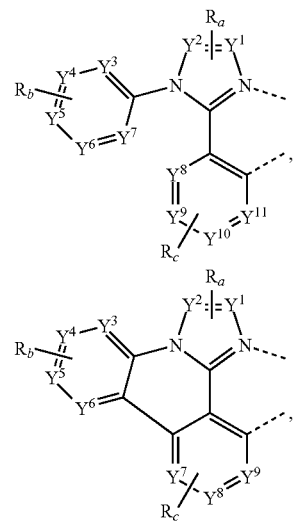

-continued

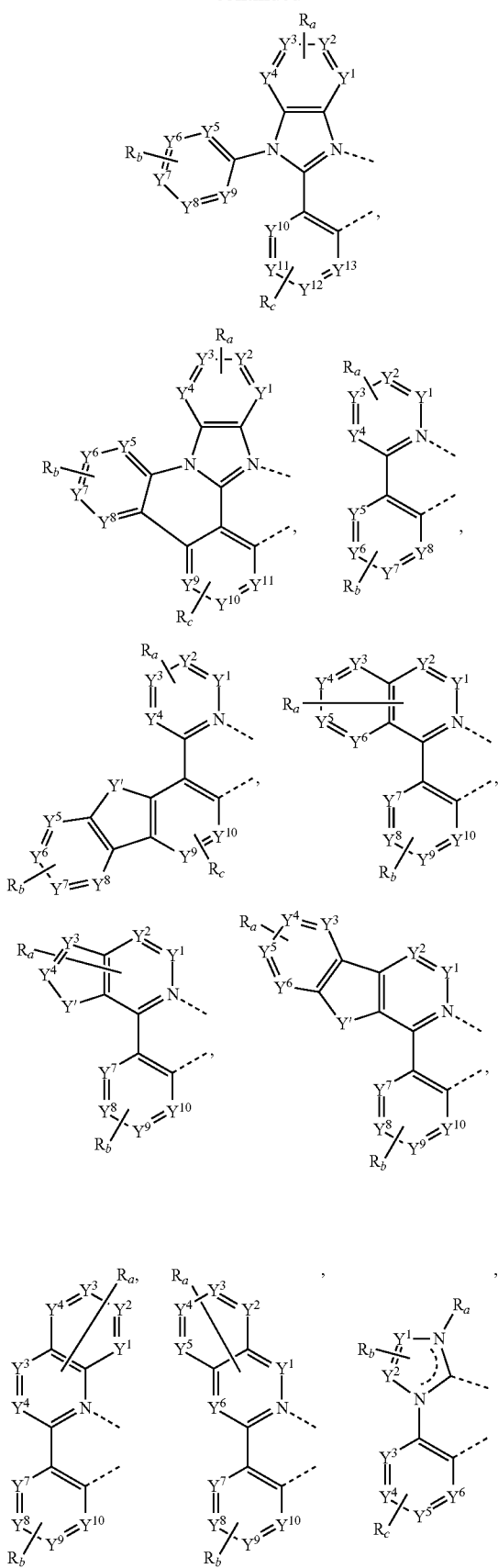

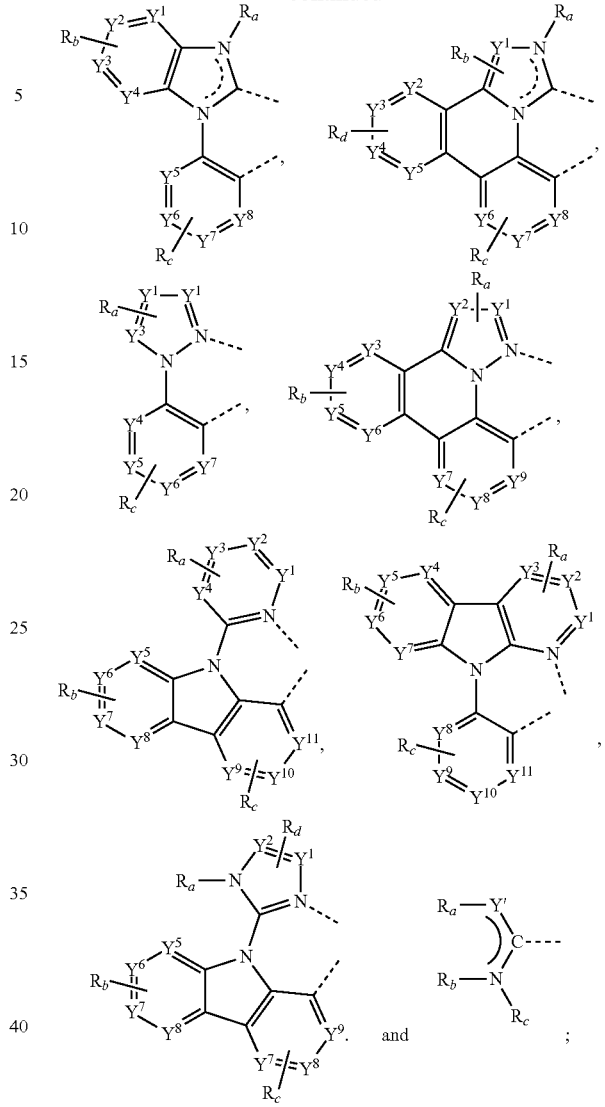

wherein:
L² and L³ can also be

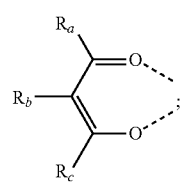

each Y¹ to Y¹³ are independently selected from the group consisting of carbon and nitrogen;
Y' is selected from the group consisting of $BR_e$, $NR_e$, $PR_e$, O, S, Se, C=O, S=O, $SO_2$, $CR_eR_f$, $SiR_eR_f$, and $GeR_eR_f$;
$R_e$ and $R_f$ can be fused or joined to form a ring;
each $R_a$, $R_b$, $R_c$, and $R_d$ can independently represent from mono substitution to the maximum possible number of substitution, or no substitution;
each $R_a$, $R_b$, $R_c$, $R_d$, $R_e$ and $R_f$ is independently selected from the group consisting of hydrogen, deuterium, halogen, alkyl, cycloalkyl, heteroalkyl, heterocycloalkyl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof; and any two adjacent substituents of $R_a$, $R_b$, $R_c$, and $R_d$ can be fused or joined to form a ring or form a multidentate ligand.

In some embodiments of the OLED where the second compound has the formula of $M(L^1)_x(L^2)_y(L^3)_z$, the second compound has a formula selected from the group consisting of $Ir(L_A)_3$, $Ir(L_A)(L_B)_2$, $Ir(L_A)_2(L_B)$, $Ir(L_A)_2(L_C)$, $Ir(L_A)(L_B)(L_C)$, and $Pt(L_A)(L_B)$; wherein $L_A$, $L_B$, and $L_C$ are different from each other in the Ir compounds, wherein $L_A$, and $L_B$ can be same or different in the Pt compounds; and wherein $L_A$, and $L_B$ can be connected to form a tetradentate ligand in the Pt compounds.

In some embodiments of the OLED, the second compound comprises at least one donor group and at least one acceptor group. In some embodiments of the OLED, the second compound is a non-metal complex. In some embodiments of the OLED, the second compound is a Cu, Ag, or Au complex. In some embodiments of the OLED, the second compound comprises at least one of the chemical moieties selected from the group consisting of:

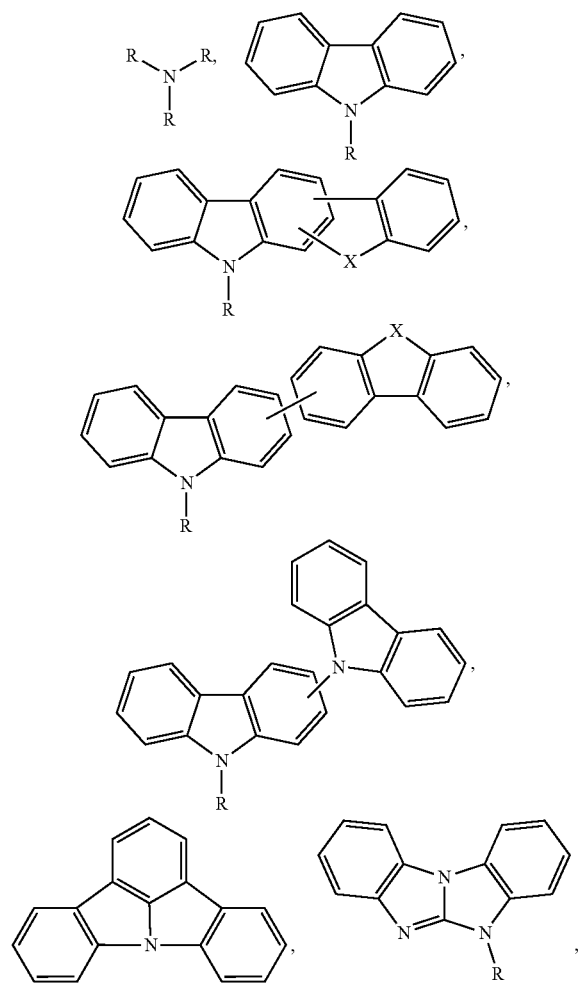

wherein:
X is selected from the group consisting of O, S, Se, and NR;
each R can be same or different and is an acceptor group, or an organic linker bonded to an acceptor group, or a terminal group selected from the group consisting of alkyl, cycloalkyl, heteroalkyl, heterocycloalkyl, arylalkyl, aryl, heteroaryl, and combinations thereof; and
each R' can be same or different and is selected from the group consisting of alkyl, cycloalkyl, aryl, heteroaryl, and combinations thereof.

In some embodiments of the OLED, the second compound comprises at least one of the chemical moieties selected from the group consisting of nitrile, isonitrile, borane, fluoride, pyridine, pyrimidine, pyrazine, triazine, aza-carbazole, aza-dibenzothiophene, aza-dibenzofuran, aza-dibenzoselenophene, aza-triphenylene, imidazole, pyrazole, oxazole, thiazole, isoxazole, isothiazole, triazole, thiadiazole, and oxadiazole.

In some embodiments of the OLED, the second compound comprises at least one organic group selected from the group consisting of:

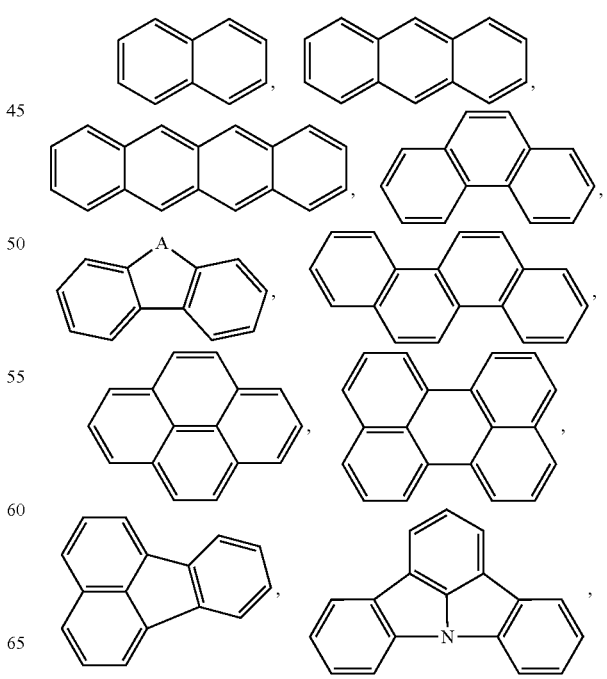

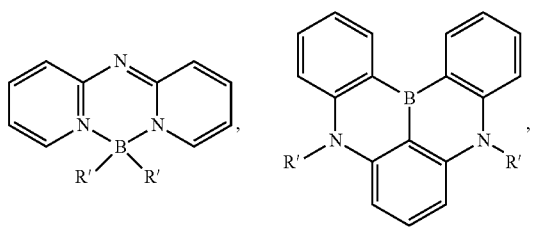
and aza analogues thereof;
wherein A is selected from the group consisting of O, S, Se, NR' and CR'R";
wherein each R' can be same or different and is selected from the group consisting of alkyl, cycloalkyl, aryl, heteroaryl, and combinations thereof.
In some embodiments of the OLED, the second compound is selected from the group consisting of:
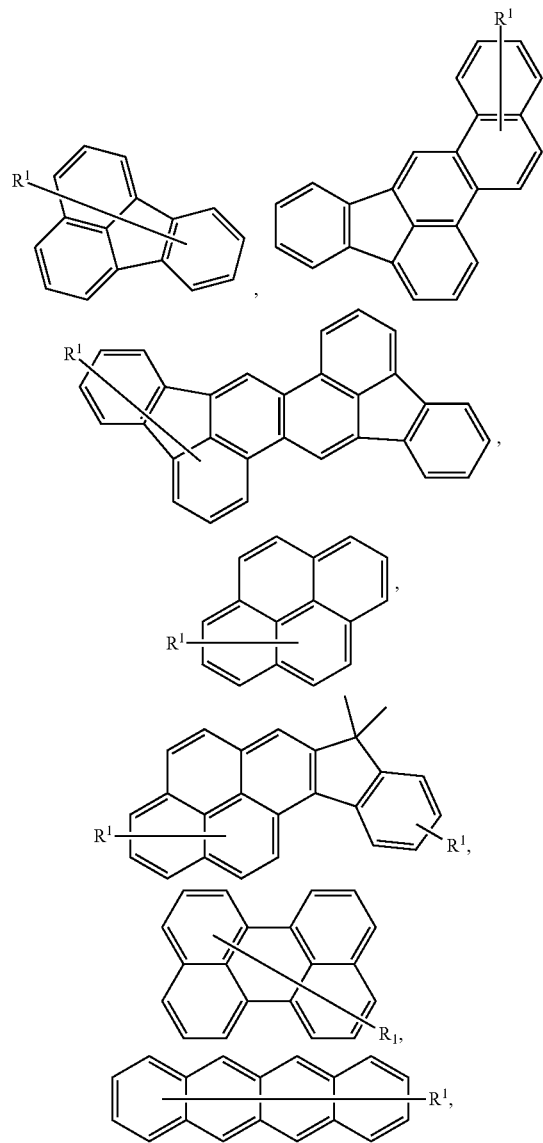
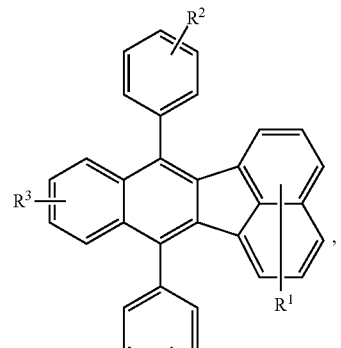
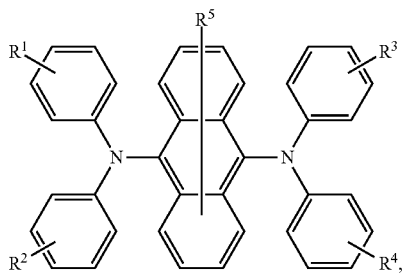
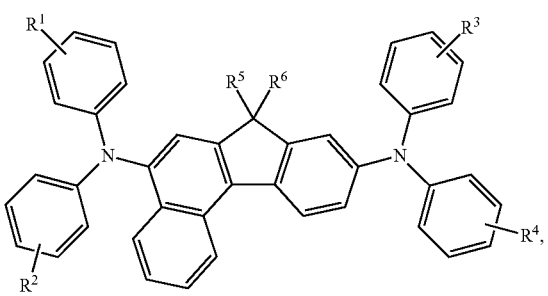
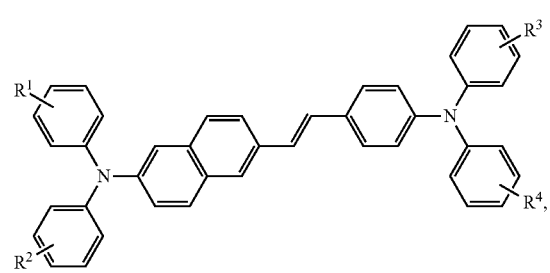
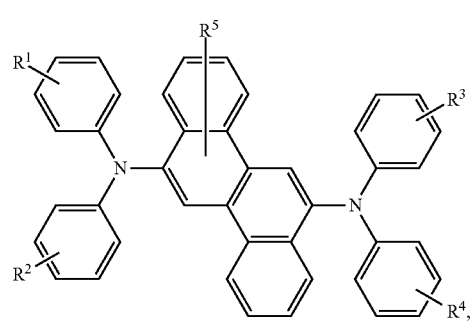

-continued

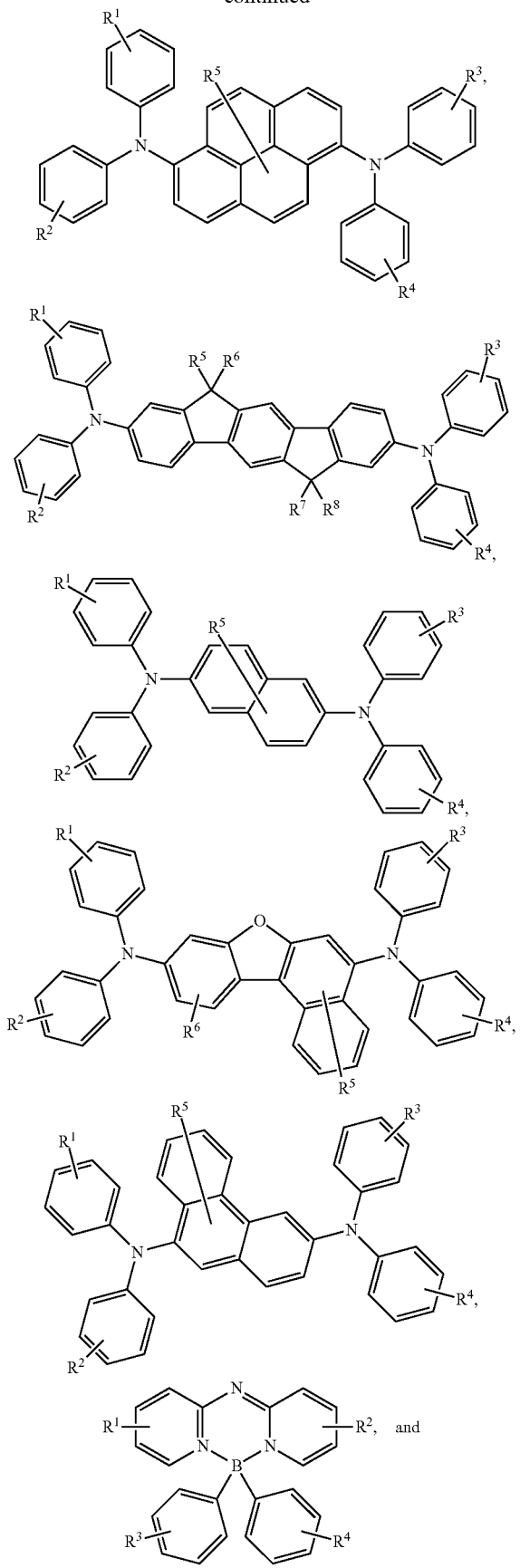

-continued

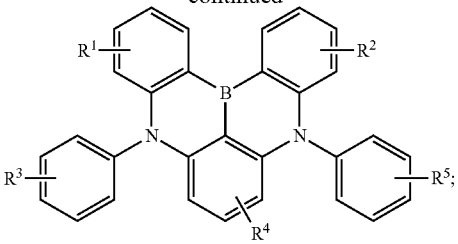

wherein $R^1$ to $R^5$ each independently represents from mono to maximum number of substitutions they can have, or no substitution;

wherein $R^1$ to $R^5$ are each independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof.

In some embodiments of the OLED, the second compound has a chemical structure selected from the group consisting of a monomer, a polymer, a macromolecule, and a supramolecule. In some embodiments of the OLED, the first emissive region further comprises a first host; wherein the first host has highest $S_1$ and $T_1$ energies among all materials in the first emissive region; and wherein the first, and second compounds are dopants. In some embodiments of the OLED, the first emissive region further comprises a second host; where the second host has higher $S_1$ and $T_1$ energies, respectively, than those of the first, and the second compounds. In some embodiments of the OLED, the host comprises at least one chemical group selected from the group consisting of triphenylene, carbazole, dibenzothiphene, dibenzofuran, dibenzoselenophene, azatriphenylene, azacarbazole, aza-dibenzothiophene, aza-dibenzofuran, and aza-dibenzoselenophene.

In some embodiments, the OLED further comprises a hole transporting region between the anode and the first emissive region; wherein the hole transporting region is selected from the group consisting of a hole injection layer, hole transport layer, electron blocking layer, and combinations thereof.

In some embodiments, the OLED further comprises an electron transporting region between the first emissive region and the cathode; wherein the electron transporting region is selected from the group consisting of hole blocking layer, electron transport layer, electron insertion layer, and combinations thereof.

In some embodiments of the OLED, the first compound and the second compound each has an emission energy, and the difference between the emission energy of the first compound and the emission energy of the second compound is at least 0.25 eV. It is not necessary that both the first compound and the second compound emit the light. It is only required that they have emission energy. For example, for PH emitters, the emission energy is $T_1$ energy, for FL emitters, the emission energy is $S_1$ energy. In some embodiments of the OLED, the difference between the emission energy of the first compound and the emission energy of the second compound is at least 0.45 eV. In some embodiments of the OLED, the difference between the emission energy of the first compound and the emission energy of the second compound is at least 0.65 eV.

In some embodiments, the OLED further comprises at least one charge generation layer.

In some embodiments of the OLED, at least one of the first compound and the second compound has photoluminescent quantum yield of at least 0.90. In some embodiments, at least one of the first compound and the second compound has photoluminescent quantum yield of at least 0.95. In some embodiments, at least one of the first compound and the second compound has photoluminescent quantum yield of at least 0.98. In some embodiments, both of the first compound and the second compound have photoluminescent quantum yields of at least 0.90. In some embodiments, both of the first compound and the second compound have photoluminescent quantum yields of at least 0.95. In some embodiments, both of the first compound and the second compound have photoluminescent quantum yields of at least 0.98.

In some embodiments of the OLED, emission spectrum from the first emissive region has FWHM equal or less than the wavelength selected from the group consisting of 45 nm, 40 nm, 35 nm, 30 nm, and 25 nm. In some embodiments, the emission spectrum from the first emissive region has FWHM equal or greater than the wavelength selected from the group consisting of 50 nm, 60 nm, 70 nm, 80 nm, and 90 nm.

In some embodiments of the OLED, the emission spectrum of the OLED has a fraction of light emitted below 455 nm being equal to or less than 30%. In some embodiments, the emission spectrum of the OLED has a fraction of light emitted below 455 nm being equal to or less than 25%. In some embodiments, the emission spectrum of the OLED has a fraction of light emitted below 455 nm being equal to or less than 20%.

In some embodiments, the OLED further comprises a second emissive region deposited between the anode and the cathode; wherein second emissive region comprises a phosphorescent emitting material. In some embodiments, the OLED emits white light when a voltage is applied across the OLED.

In some embodiments of the OLED, the white light has a minimum CRI selected from the group consisting of 70, 75, 80, 85, 90, and 95. 1. In some embodiments of the OLED, the white light has a minimum color temperature selected from the group consisting of 3000K, 4000K, 5000K, 6000K, and 6500K.

As used herein, an emissive component may be described by a range of color within which all, or essentially all, of the energy emitted by the component occurs. For example, as used herein, a "red" layer, material, region, or device refers to one that emits light in the range of about 590-700 nm; a "green" layer, material, region, or device refers to one that has an emission spectrum with a peak wavelength in the range of about 500-590 nm; and a "blue" layer, material, or device refers to one that has an emission spectrum with a peak wavelength in the range of about 400-500 nm. In some arrangements, an emissive component may be described as "deep green" when it has a peak wavelength in the range of 500-550 nm. In some arrangements, an emissive component may be described as "deep blue" or "light blue". As used herein, a "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Some configurations may include separate emissive components that provide light blue and deep blue emission, though each component also may be referred to generally as a "blue" component. Some configurations may include separate emissive components that provide light green and deep green emission, though each component also may be referred to generally as a "green" component. White light emitting components are described by the distance of spectrum from the Plankian locus. The calculation of that distances is the duv of the emission spectrum. In some embodiments, an absolute value of duv less than or equal to 0.03 is an acceptable white color. In other embodiments an absolute value of duv be less than or equal to 0.015 is acceptable and in the most strict embodiments, the absolute value of the duv will be less than or equal to 0.007.

In some embodiments of the OLED, the emission from the first emissive region is blue color; and the emission from the second emissive region is a color selected from the group consisting of green, yellow, and red.

Also disclosed is an OLED that comprises: an anode; a cathode; and an organic stack disposed between the anode and the cathode; wherein the organic stack comprises one or more emissive layers and one or more additional layers selected from the group consisting of a hole injection layer, a hole transport layer, an electron blocking layer, a hole blocking layer, an electron transport layer, and an electron injection layer; wherein at least one of the one or more emissive layers and the one or more additional layers includes a first compound being capable of functioning as a perovskite emitter in an OLED when a voltage is applied across the OLED at room temperature; and wherein the one or more emissive layers include a second compound capable of functioning as an emitter in an OLED when a voltage is applied across the OLED at room temperature, wherein the second compound is selected from the group consisting of phosphorescent emitters, fluorescent emitters, and delayed fluorescent emitters. In some embodiments of the OLED, the OLED emits a luminescent emission comprising an emission component from both the first compound and the second compound when a voltage is applied across the OLED; wherein at least 30% of the emission spectrum of the second compound is overlapped with the absorption spectrum of the first compound. In some embodiments of the OLED, at least a percentage selected from the group consisting of 40%, 50%, 60%, 70%, 80%, and 90% of the emission spectrum of the second compound is overlapped with the absorption spectrum of the first compound.

Also disclosed is a perovskite compound having the formula of $[A]_a[B]_b[X]_c$; where [A] is one or more types of organic cation; [B] is one or more types of metal or metalloid cation; and [X] is one or more types of anions; a is an integer from 1 to 6; b is an integer from 1 to 6; c is an integer from 1 to 21; and where the one or more types of organic cation comprises at least one chemical group selected from the group consisting of deuterium, cycloalkyl, and aromatic fused rings having at least two rings.

In some embodiments of the perovskite compound, the compound having the formula of $[A]_a[B]_b[X]_c$ is selected from the group consisting of compounds having the formula $[A][B][X]_3$, compounds having the formula $[A']_3[A]_{n-1}[B]_n[X]_{3n+1}$, compounds having the formula $[A']_2[A]_n[B]_n[X]_{3n+2}$, and compounds having the formula $[A']_2[A]_{n-1}[B]_n[X]_{3n+3}$; wherein n is an integer from 1 to 6; [A'] is one or more types of organic cation or metal cation; wherein when [A'] is an organic cation, two [A'] can bond together to make $[A']_2$ into [A''] with double charge of [A'].

In some embodiments of the perovskite compound, [A] has the formula selected from the group consisting of $(R^AR^BR^CR^DN)^+$, $(R^ER^FN=CR^GR^H)^+$, and combination thereof, wherein each $R^A$, $R^B$, $R^C$, $R^D$, $R^E$, $R^F$, $R^G$, and $R^H$ is independently selected from the group consisting of hydrogen, deuterium, alkyl, cycloalkyl, heteroalkyl, heterocycloalkyl, arylalkyl, amino, aryl, heteroalyl, and combinations thereof; and wherein at least one of $R^A$, $R^B$, $R^C$, and $R^D$, or at least one of $R^E$, $R^F$, $R^G$, and $R^H$ is selected from the group consisting of deuterium, cycloalkyl, and aromatic fused rings having at least two rings.

In some embodiments of the perovskite compound, the one or more types of organic cation comprises at least one deuterium atom. In some embodiments of the perovskite compound, the one or more types of organic cation is partially deuterated. In some embodiments of the perovskite compound, the one or more types of organic cation is fully deuterated. In some embodiments of the perovskite compound, the one or more types of organic cation comprises at least one cyclopentyl or cyclohexyl group.

In some embodiments of the perovskite compound, the one or more types of organic cation comprises at least one aromatic fused rings having at least two rings. In some embodiments of the perovskite compound, the one or more types of organic cation comprises at least one aromatic fused rings having at least three rings. In some embodiments of the perovskite compound, the one or more types of organic cation comprises at least one aromatic fused rings having at least four rings. In some embodiments of the perovskite compound, the one or more types of organic cation comprises at least one aromatic fused rings having at least five rings.

In some embodiments of the perovskite compound, the one or more types of organic cation comprises at least one chemical moiety selected from the group consisting of triphenylene, naphthalene, anthracene, phenalene, phenanthrene, fluorene, pyrene, chrysene, perylene, azulene, dibenzothiophene, dibenzofuran, dibenzoselenophene, benzofuran, benzothiophene, benzoselenophene, carbazole, indolocarbazole, and aza-variants thereof.

Also disclosed is a device comprising: a first electrode; a second electrode; and a first layer disposed between the first electrode and the second electrode, wherein the first layer comprises a perovskite compound disclosed herein. In some embodiments of the device, the device is selected from the group consisting of a solar cell, an OLED, an organic transistor, and an organic photodetector.

C. Formulation

Also disclosed is a formulation comprising: a first compound; and a second compound; wherein the first compound is capable of functioning as a perovskite emitter in an OLED when a voltage is applied across the OLED at room temperature; and wherein the second compound is capable of functioning as an emitter in an OLED when a voltage is applied across the OLED at room temperature, wherein the second compound is selected from the group consisting of phosphorescent emitters, fluorescent emitters, and delayed fluorescent emitters.

Formation of the emissive region is important for the end commercialized device involving this composition. In some embodiments, the pre-cursors for the perovskite material are deposited simultaneously with the organic emissive material. In other embodiments, the perovskite material itself is co-deposited with the organic emissive material. In other embodiments the perovskite pre-cursors are co-deposited with additional materials that are present in the emissive region and the emissive organic component is deposited from a separate source. These materials include but are not limited to hole transporting organic host molecules or electron transporting host molecules or inert organic host molecules or wide-gap inorganic semiconductors (ex. $Sb_2O_3$) or inorganic oxides. In other embodiments the perovskite itself is co-deposited with additional materials that are present in the emissive region and the emissive organic component is deposited from a separate source. In some embodiments the perovskite is pre-cursors are deposited together while the organic emissive component is co-deposited with additional materials. In some embodiments the perovskite material itself is deposited while the organic emissive component is co-deposited with additional materials.

D. Chemical Structure

Also disclosed is a chemical structure selected from the group consisting of a monomer, a polymer, a macromolecule, and a supramolecule, wherein the chemical structure comprises:
　　a first compound, a monovalent or polyvalent variant thereof; and
　　a second compound, a monovalent or polyvalent variant thereof;
　　wherein the first compound is capable of functioning as a perovskite emitter in an OLED when a voltage is applied across the OLED at room temperature; and
　　wherein the second compound is capable of functioning as an emitter in an OLED when a voltage is applied across the OLED at room temperature, wherein the second compound is selected from the group consisting of phosphorescent emitters, fluorescent emitters, and delayed fluorescent emitters.

E. Premixed (VTE) Co-Evaporation Source Mixture

Often, the emissive layer (EML) of OLED devices exhibiting good lifetime and efficiency requires more than two components (e.g. 3 or 4 components). For this purpose, 3 or 4 source materials are required to fabricate such an EML, which is very complicated and costly compared to a standard two-component EML with a single host and an emitter, which requires only two sources. Typically, in order to fabricate such an EML requiring more than two components, a separate evaporation source for each component is used. Because the relative concentrations of the components of the EML is important for the device performance, the rate of deposition of each component is measured individually during the deposition in order to monitor the relative concentrations. This makes the fabrication process complicated and costly. Thus, when there are more than two components for a layer to be deposited, it is desirable to premix the materials for the two or more components and evaporate them from a single crucible in order to reduce the complexity of the vacuum deposition process.

However, the co-evaporation must be stable, i.e. the composition of the evaporated film should remain constant during the vacuum deposition process. Any composition change may affect the device performance adversely. In order to obtain a stable co-evaporation from a mixture of compounds under vacuum, one would assume that the materials should have the same evaporation temperature under the same condition. However, this may not be the only parameter one has to consider. When the two compounds are mixed together, they may interact with each other and their evaporation properties may differ from their individual properties. On the other hand, materials with slightly different evaporation temperatures may form a stable co-evaporation mixture. Therefore, it is extremely difficult to achieve a stable co-evaporation mixture. "Evaporation temperature" of a material is measured in a high vacuum deposition tool with a chamber base pressure between $1 \times 10^{-6}$ Torr to $1 \times 10^{-9}$ Torr, at a 2 Å/sec deposition rate on a surface positioned at a set distance away from the evaporation source of the material being evaporated, e.g. sublimation crucible in a VTE tool. The various measured values such as temperature, pressure, deposition rate, etc. disclosed herein are expected to have nominal variations because of the expected tolerances in the measurements that produced these quantitative values as understood by one of ordinary skill in the art.

This disclosure describes a novel composition comprising a mixture of two or more organic compounds that can be used as a stable co-evaporation source in vacuum deposition processes (e.g. VTE) is disclosed. Many factors other than temperatures can contribute to the evaporation, such as miscibility of different materials, different phase transition. The inventors found that when two or more materials have similar evaporation temperature, and similar mass loss rate or similar vapor pressure, the two or more materials can co-evaporate consistently. Mass loss rate is defined as percentage of mass lost over time (minute) and is determined by measuring the time it takes to lose the first 10% of the mass as measured by thermal gravity analysis (TGA) under same experimental condition at a same constant given temperature for each compound after the composition reach a steady evaporation state. The constant given temperature is one temperature point that is chosen so that the value of mass loss rate is between about 0.05 to 0.50 percentage/min. Skilled person in this field should appreciate that in order to compare two parameters, the experimental condition should be consistent. The method of measuring mass loss rate and vapor pressure is well known in the art and can be found, for example, in Bull. et al. Mater. Sci. 2011, 34, 7.

Searching for a high-performance mixture for stable single-source co-evaporation could be a tedious process. A process of searching for a stable mixture would include identifying compounds with similar evaporation temperatures and monitoring the composition of the evaporated mixture. It is often the case that the two materials show slight separation as evaporation proceeds. Adjusting the evaporation temperature by changing the chemical structure often, unfortunately, leads to much degraded device performance due to the change in chemical, electrical and/or optical properties. Chemical structure modifications also impact the evaporation temperature much more significantly than needed, resulting in unstable mixtures. Thus, identification of workable premixed co-evaporation sources is useful.

Disclosed herein is a premixed co-evaporation source that is a mixture of a first component and a second component; wherein the co-evaporation source is a co-evaporation source for vacuum deposition process or OVJP process. In the premixed co-evaporation source, the first compound is a material that is capable of functioning as a perovskite emitter in an OLED at room temperature, and the second compound is selected from the group consisting of: (1) a compound that is capable of functioning as a phosphorescent emitter at room temperature; (2) a compound that can meet at least one of the following conditions: (a) a compound that is capable of functioning as a TADF emitter in an OLED at room temperature; and (b) a compound that is capable of forming an exciplex with another compound in the mixture when the two compounds are in an OLED at room temperature; and (3) a compound that is capable of functioning as a fluorescent emitter in an OLED at room temperature. In the mixture of the first compound and the second compound, the first compound has an evaporation temperature Temp1 of 150 to 350° C.; where the second compound has an evaporation temperature Temp2 of 150 to 350° C.; where absolute value of Temp1−Temp2 is less than 20° C.; where the first compound has a concentration C1 in said mixture and a concentration C2 in a film formed by evaporating the mixture in a vacuum deposition tool at a constant pressure between $1 \times 10^{-6}$ Torr to $1 \times 10^{-9}$ Torr, at a 2 Å/sec deposition rate on a surface positioned at a predefined distance away from the mixture being evaporated; and where absolute value of (C1−C2)/C1 is less than 5%.

In some embodiments of the premixed co-evaporation source, the first component has evaporation temperature $T_1$ of 200 to 350° C. and the second component has evaporation temperature $T_2$ of 200 to 350° C. In some embodiments of the premixed co-evaporation source, the absolute value of $(C_1-C_2)/C_1$ is less than 3%. In some embodiments of the premixed co-evaporation source, the first component has a vapor pressure of $P_1$ at $T_1$ at 1 atm, and the second component has a vapor pressure of $P_2$ at $T_2$ at 1 atm; and the ratio of $P_1/P_2$ is within the range of 0.90:1 to 1.10:1.

In some embodiments of the premixed co-evaporation source, the first component has a first mass loss rate and the second component has a second mass loss rate, wherein the ratio between the first mass loss rate and the second mass loss rate is within the range of 0.90:1 to 1.10:1. In some embodiments of the premixed co-evaporation source, the ratio between the first mass loss rate and the second mass loss rate is within the range of 0.95:1 to 1.05:1. In some embodiments of the premixed co-evaporation source, the ratio between the first mass loss rate and the second mass loss rate is within the range of 0.97:1 to 1.03:1.

In some embodiments of the premixed co-evaporation source, the first component and the second component each has a purity in excess of 99% as determined by high pressure liquid chromatography.

In some embodiments of the premixed co-evaporation source, the composition is in liquid form at a temperature less than the lesser of $T_1$ and $T_2$.

F. Method for Fabricating an OLED

Also disclosed is a method for fabricating an organic light emitting device. The method comprises: providing a substrate having a first electrode disposed thereon; depositing a first organic layer over the first electrode by one of the following methods:
1. evaporating a pre-mixed co-evaporation source that is a mixture of a first component and a second component in a high vacuum deposition tool with a chamber base pressure between $1 \times 10^{-6}$ Torr to $1 \times 10^{-9}$ Torr;
2. evaporating a pre-mixed co-evaporation source that is a mixture of a first component and a second component in an OVJP deposition tool;
3. evaporating first component and a second component simultaneously in a high vacuum deposition tool with a chamber base pressure between $1 \times 10^{-6}$ Torr to $1 \times 10^{-9}$ Torr;
4. evaporating first component and a second component simultaneously in an OVJP deposition tool; and 5. solution deposition of a mixture of a first component and a second component; and depositing a second electrode over the first organic layer. In the pre-mixed co-evaporation source, the first component is selected from the group consisting of: a compound capable of functioning as a perovskite emitter in an OLED at room temperature; and a mixed-precursors with stoichiometric ratio to form a compound that is capable of functioning as a perovskite emitter in an OLED at room temperature. In the pre-mixed co-evaporation source, the second component is a compound capable of functioning as an emitter in an OLED at room temperature, wherein the second compound is selected from the group consisting of phosphorescent emitters, fluorescent emitters, and delayed fluorescent emitters; and wherein when method 1 or 2 is applied, the following conditions are met:

the first component has an evaporation temperature T1 of 150 to 350° C.;

the second component has an evaporation temperature T2 of 150 to 350° C.;

the absolute value of T1−T2 is less than 20° C.;

the first component has a concentration C1 in said mixture and a concentration C2 in a film formed by evaporating the mixture in a vacuum deposition tool at a constant pressure between $1\times10^{-6}$ Torr to $1\times10^{-9}$ Torr, at a 2 Å/sec deposition rate on a surface positioned at a predefined distance away from the mixture being evaporated; and the absolute value of (C1−C2)/C1 is less than 5%.

In some embodiments of the method, the solution deposition method is selected from the group consisting of spin cast, doctor blading, ink jet printing, and spray pyrolysis.

In some embodiments, the organic layer may be an emissive layer and the compound as described herein may be an emissive dopant or a non-emissive dopant.

In some embodiments, the organic layer may further comprise a host, wherein the host comprises a triphenylene containing benzo-fused thiophene or benzo-fused furan, wherein any substituent in the host is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C\equiv CC_nH_{2n+1}$, $Ar_1$, $Ar_1$-$Ar_2$, $C_nH_{2n}$—$Ar_1$, or no substitution, wherein n is from 1 to 10; and wherein $Ar_1$ and $Ar_2$ are independently selected from the group consisting of benzene, biphenyl, naphthalene, triphenylene, carbazole, and heteroaromatic analogs thereof.

In some embodiments, the organic layer may further comprise a host, wherein host comprises at least one chemical moiety selected from the group consisting of naphthalene, fluorene, triphenylene, carbazole, indolocarbazole, dibenzothiphene, dibenzofuran, dibenzoselenophene, 5,9-dioxa-13b-boranaphtho[3,2,1-de]anthracene, aza-naphthalene, aza-fluorene, aza-triphenylene, aza-carbazole, aza-indolocarbazole, aza-dibenzothiophene, aza-dibenzofuran, aza-dibenzoselenophene, and aza-(5,9-dioxa-13b-boranaphtho[3,2,1-de]anthracene).

In some embodiments, the host may be selected from the group consisting of:

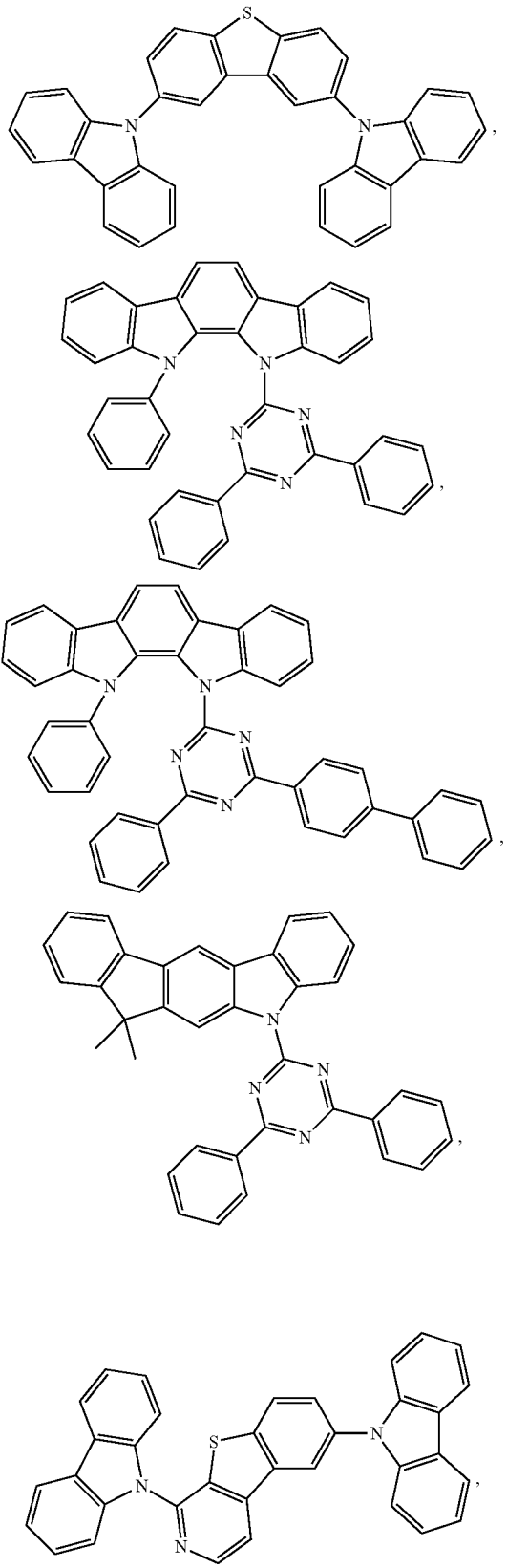

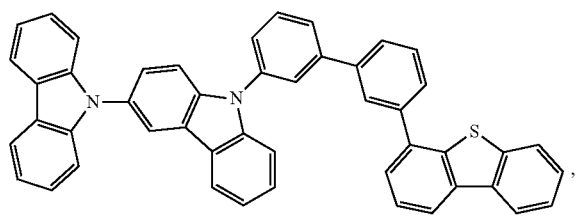
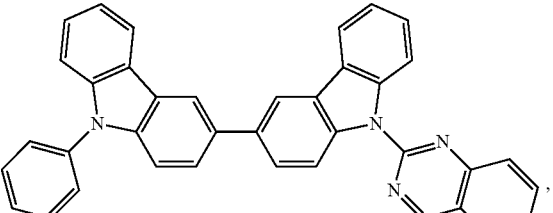
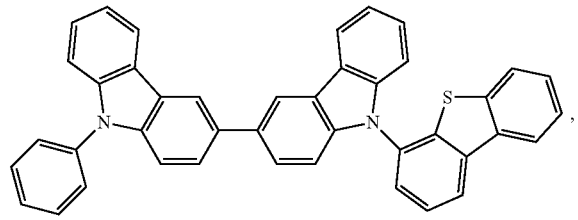
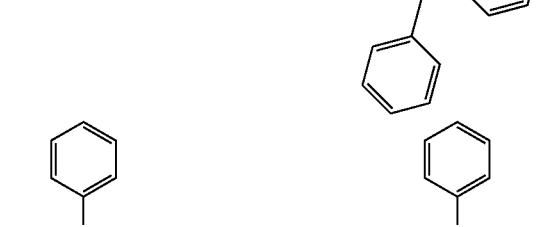
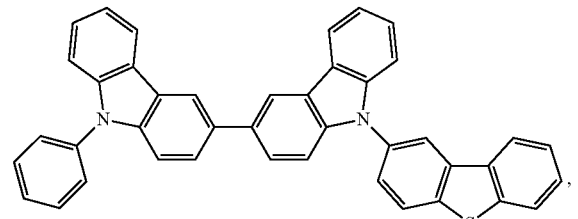
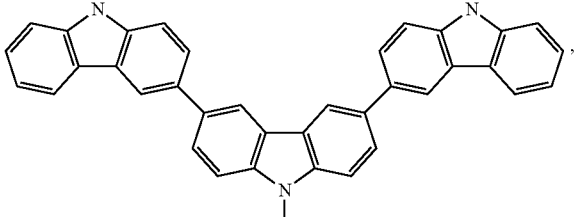
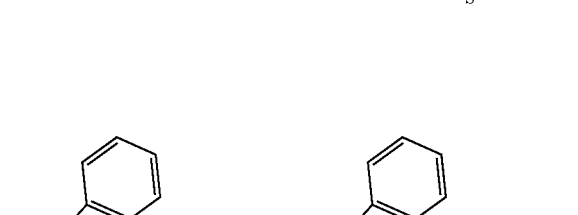
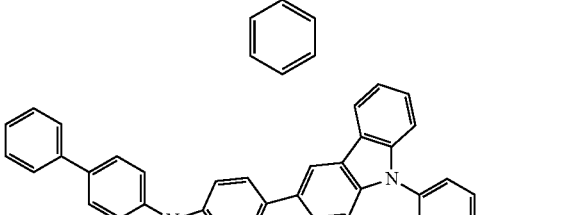
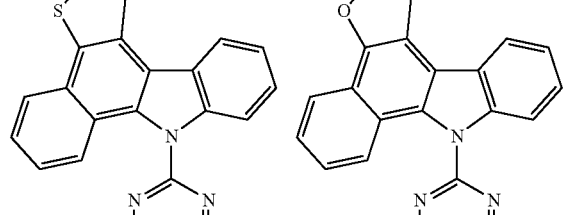
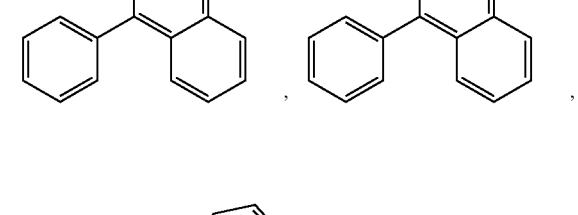
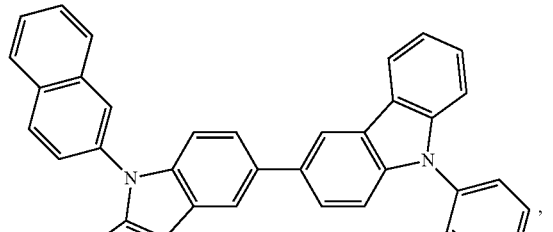
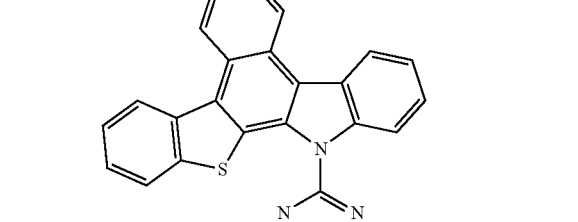
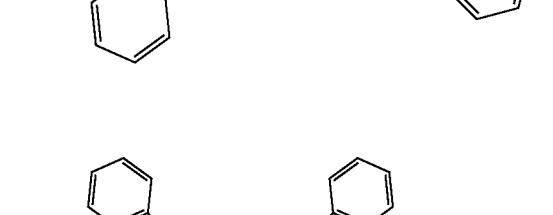
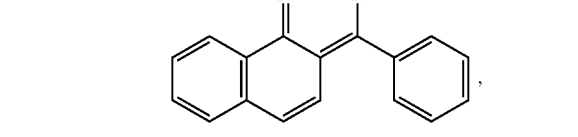
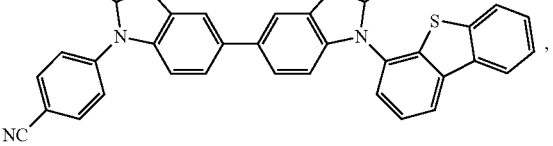

31
-continued
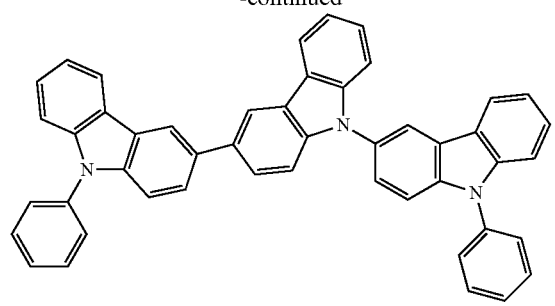
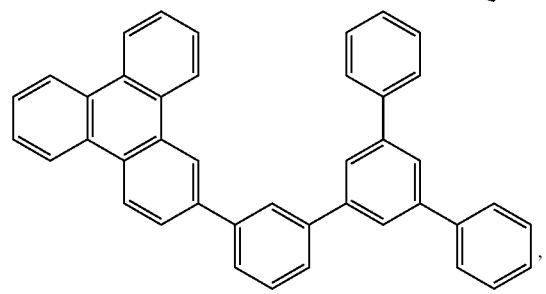
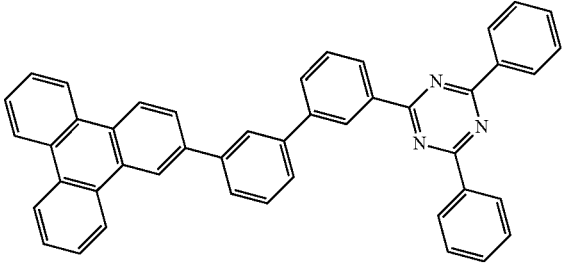
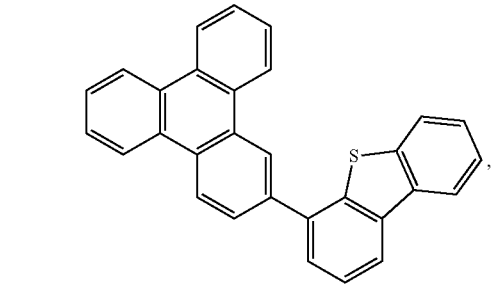
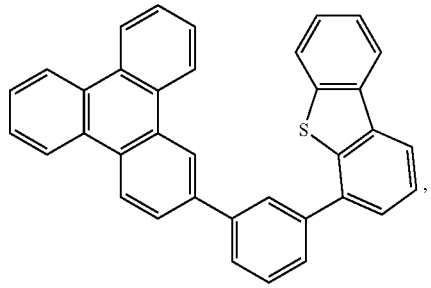
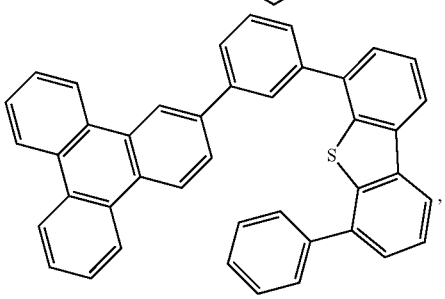
32
-continued
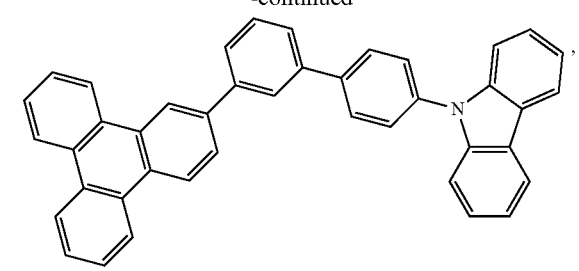
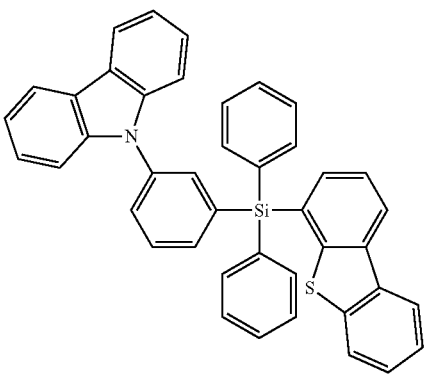
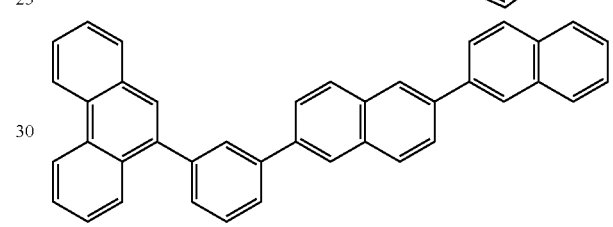
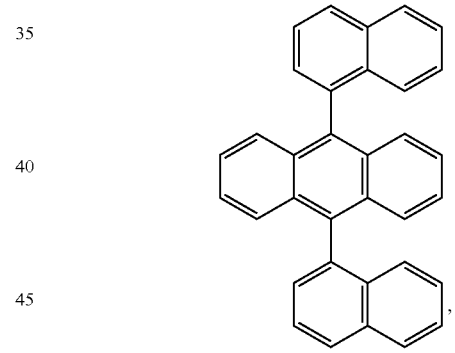
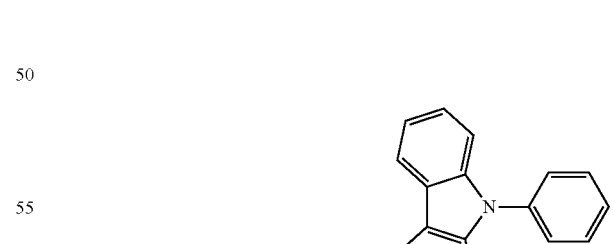
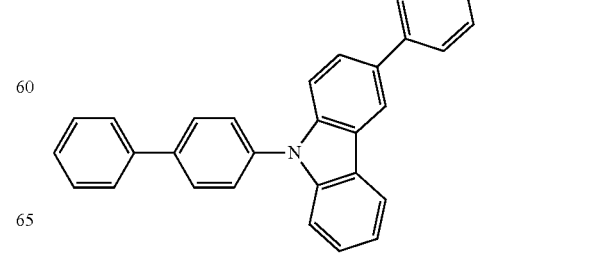

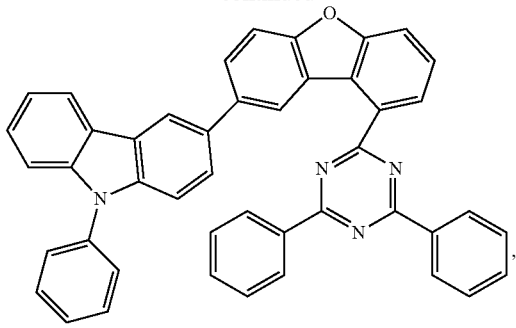

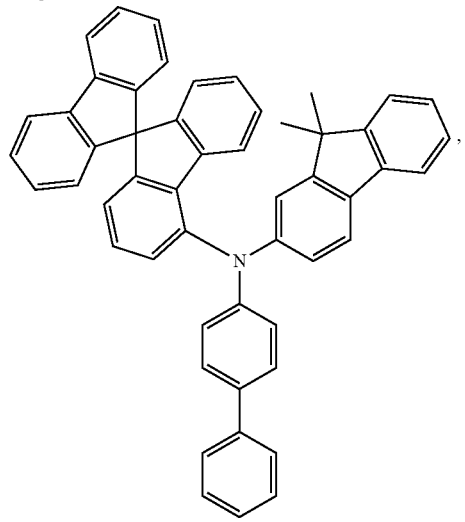

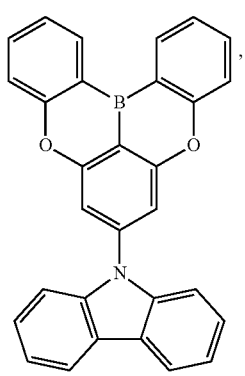

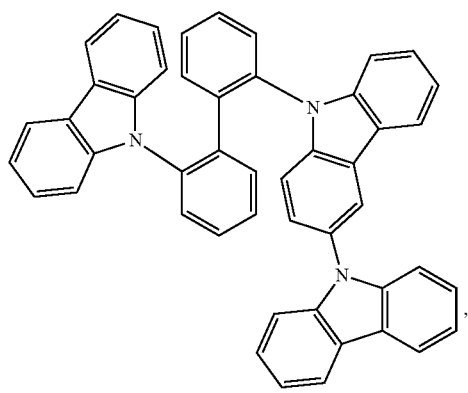

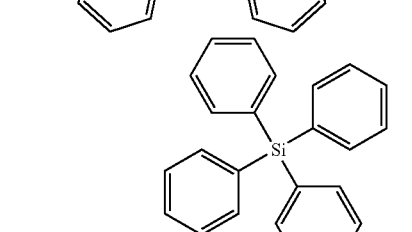

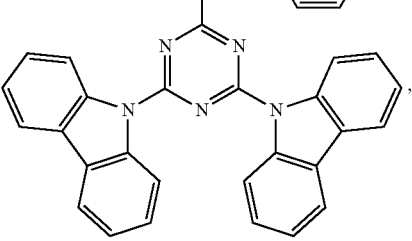

and combinations thereof.

In some embodiments, the organic layer may further comprise a host, wherein the host comprises a metal complex.

In some embodiments, the compound as described herein may be a sensitizer; wherein the device may further comprise an acceptor; and wherein the acceptor may be selected from the group consisting of fluorescent emitter, delayed fluorescence emitter, and combination thereof.

In yet another aspect, the OLED of the present disclosure may also comprise an emissive region containing a compound as disclosed in the above compounds section of the present disclosure.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for intervening layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

In yet another aspect, the present disclosure also provides a consumer product comprising an organic light-emitting device (OLED) having an anode; a cathode; and an organic layer disposed between the anode and the cathode, wherein the organic layer may comprise a compound as disclosed in the above compounds section of the present disclosure.

In some embodiments, the consumer product comprises an OLED comprising, sequentially:
  an anode;
  a first emissive region; and
  a cathode;
  wherein the first emissive region comprises:
    a first compound; and
    a second compound;
  wherein the first compound is capable of functioning as a perovskite emitter when a voltage is applied across the OLED at room temperature;
  wherein the second compound is capable of functioning as an emitter when a voltage is applied across the OLED at room temperature, wherein the second compound is selected from the group consisting of phosphorescent emitters, fluorescent emitters, and delayed fluorescent emitters.

Also disclosed is a consumer product comprising an OLED comprising:
  an anode;
  a cathode; and
  an organic stack disposed between the anode and the cathode;
  wherein the organic stack comprises one or more emissive layers and one or more additional layers selected from the group consisting of a hole injection layer, a hole transport layer, an electron blocking layer, a hole blocking layer, an electron transport layer, and an electron injection layer;

wherein at least one of the one or more emissive layers and the one or more additional layers includes a first compound being capable of functioning as a perovskite emitter in an OLED when a voltage is applied across the OLED at room temperature; and wherein the one or more emissive layers include a second compound capable of functioning as an emitter in an OLED when a voltage is applied across the OLED at room temperature, wherein the second compound is selected from the group consisting of phosphorescent emitters, fluorescent emitters, and delayed fluorescent emitters.

Also disclosed is a consumer product comprising an OLED comprising: a first electrode; a second electrode; and a first layer disposed between the first electrode and the second electrode, wherein the first layer comprises a perovskite compound having the formula of $[A]_a[B]_b[X]_c$; wherein [A] is one or more types of organic cation; [B] is one or more types of metal or metalloid cation; and [X] is one or more types of anions; a is an integer from 1 to 6; b is an integer from 1 to 6; c is an integer from 1 to 21; and wherein the one or more types of organic cation comprises at least one chemical group selected from the group consisting of deuterium, cycloalkyl, and aromatic fused rings having at least two rings.

In some embodiments of the consumer product, the consumer product has an OLED based screen whose refresh rate is equal to or larger than 120 Hz. In some embodiments, the consumer product has a refresh rate equal to or larger than 144 Hz. In some embodiments, the consumer product has a refresh rate equal to or larger than 240 Hz.

In some embodiments, the consumer product can be one of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, a light therapy device, and a sign.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

Several OLED materials and configurations are described in U.S. Pat. Nos. 5,844,363, 6,303,238, and 5,707,745, which are incorporated herein by reference in their entireties.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
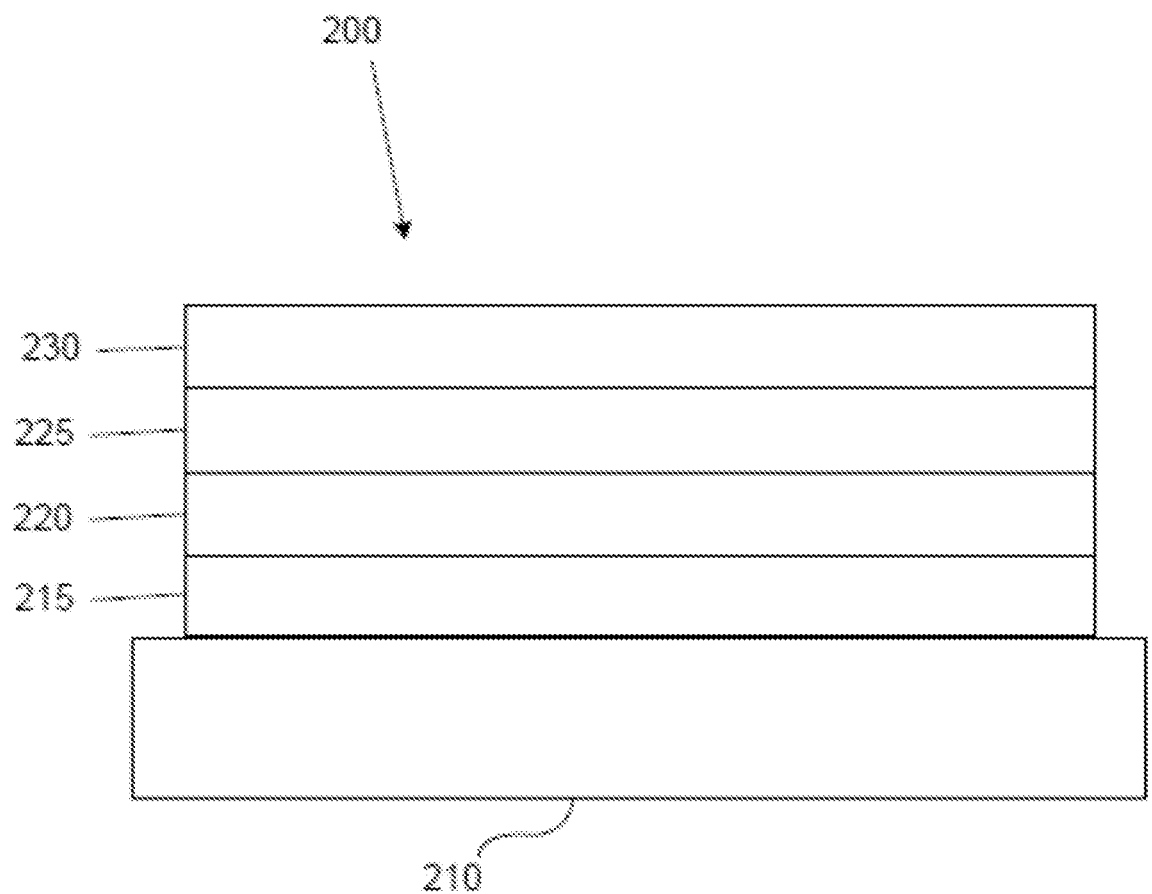
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the present disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons are a preferred range. Materials with asymmetric structures may have better solution processability than those having symmetric structures, because asymmetric materials may have a lower tendency to recrystallize Dendrimer substituents may be used to enhance the ability of small molecules to undergo solution processing.

Devices fabricated in accordance with embodiments of the present disclosure may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the present disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the present disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present disclosure, including passive matrix and active matrix. Many of the devices are intended for use in a temperature range comfortable to humans, such as 18 degrees C. to 30 degrees C., and more preferably at room temperature (20-25° C.), but could be used outside this temperature range, for example, from −40 degree C. to +80° C.

More details on OLEDs, and the definitions described above, can be found in U.S. Pat. No. 7,279,704, which is incorporated herein by reference in its entirety.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes. In some embodiments, the emissive dopant can be a racemic mixture, or can be enriched in one enantiomer. In some embodiments, the compound can be homoleptic (each ligand is the same). In some embodiments, the compound can be heteroleptic (at least one ligand is different from others). When there are more than one ligand coordinated to a metal, the ligands can all be the same in some embodiments. In some other embodiments, at least one ligand is different from the other ligands. In some embodiments, every ligand can be different from each other. This is also true in embodiments where a ligand being coordinated to a metal can be linked with other ligands being coordinated to that metal to form a tridentate, tetradentate, pentadentate, or hexadentate ligands Thus, where the coordinating ligands are being linked together, all of the ligands can be the same in some embodiments, and at least one of the ligands being linked can be different from the other ligand(s) in some other embodiments.

In some embodiments, the compound can be used as a phosphorescent sensitizer in an OLED where one or multiple layers in the OLED contains an acceptor in the form of one or more fluorescent and/or delayed fluorescence emitters. In some embodiments, the compound can be used as one component of an exciplex to be used as a sensitizer. As a phosphorescent sensitizer, the compound must be capable of energy transfer to the acceptor and the acceptor will emit the energy or further transfer energy to a final emitter. The acceptor concentrations can range from 0.001% to 100%. The acceptor could be in either the same layer as the phosphorescent sensitizer or in one or more different layers. In some embodiments, the acceptor is a TADF emitter. In some embodiments, the acceptor is a fluorescent emitter. In some embodiments, the emission can arise from any or all of the sensitizer, acceptor, and final emitter.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

The present disclosure encompasses any chemical structure comprising the novel compound of the present disclosure, or a monovalent or polyvalent variant thereof. In other words, the inventive compound, or a monovalent or polyvalent variant thereof, can be a part of a larger chemical structure. Such chemical structure can be selected from the group consisting of a monomer, a polymer, a macromolecule, and a supramolecule (also known as supermolecule). As used herein, a "monovalent variant of a compound" refers to a moiety that is identical to the compound except that one hydrogen has been removed and replaced with a bond to the rest of the chemical structure. As used herein, a "polyvalent variant of a compound" refers to a moiety that is identical to the compound except that more than one hydrogen has been removed and replaced with a bond or bonds to the rest of the chemical structure. In the instance of a supramolecule, the inventive compound can also be incorporated into the supramolecule complex without covalent bonds.

D. Combination of the Compounds of the Present Disclosure with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

a) Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

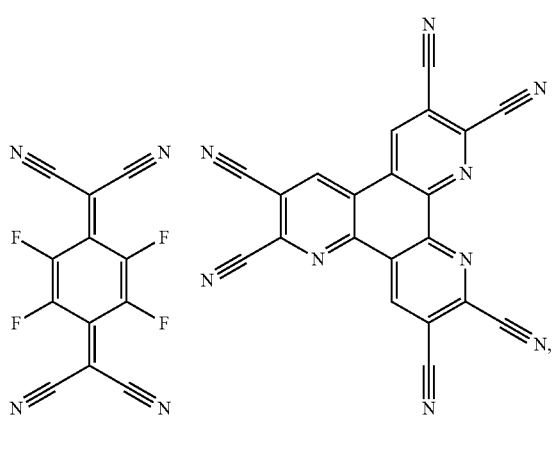

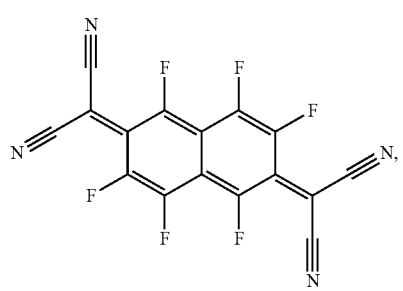

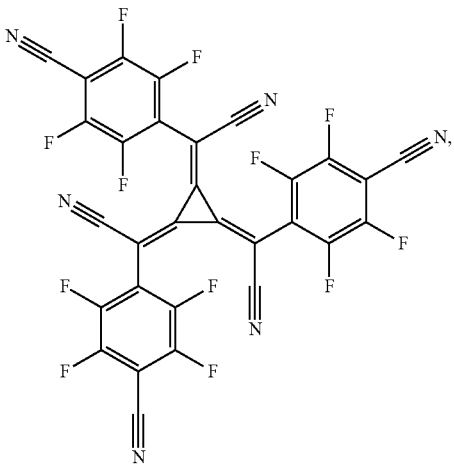

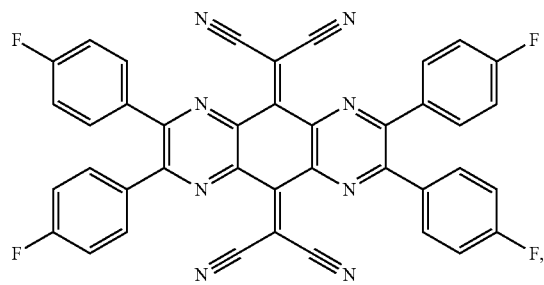

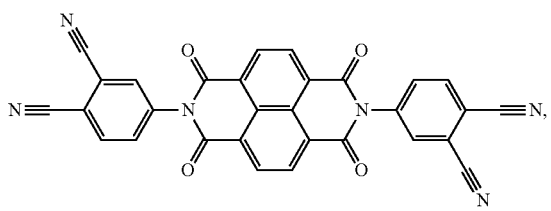

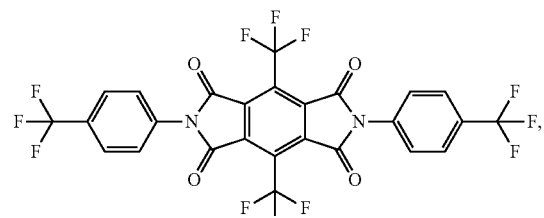

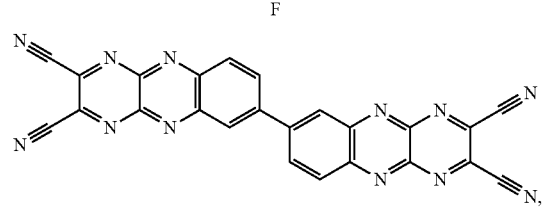

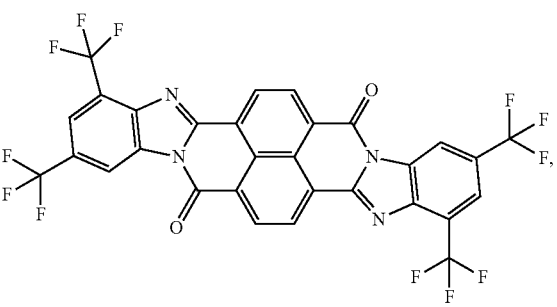

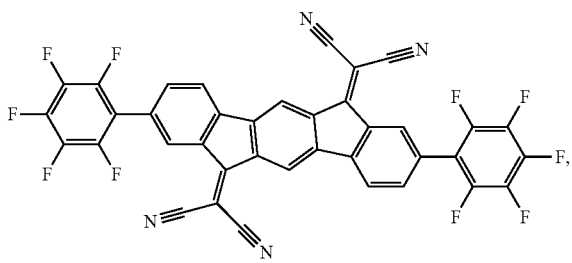

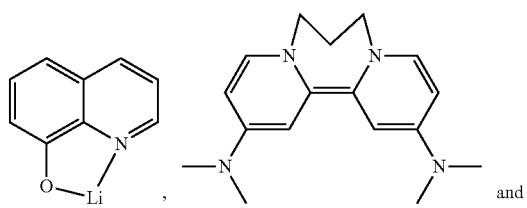

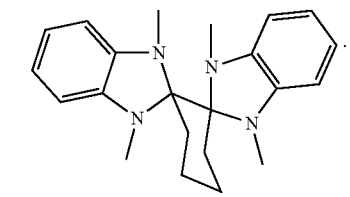

b) HIL/HTL:

A hole injecting/transporting material to be used in the present disclosure is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphoric acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

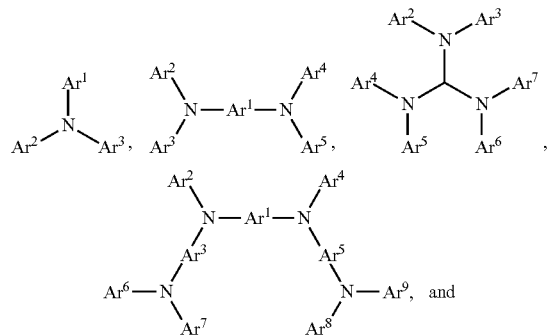

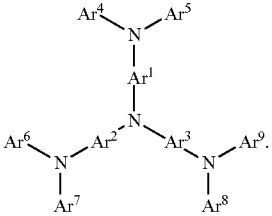

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocathazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroalyl, acyl, carboxylic acids, ether, ester, nitrile, isonitrile, sulfanyl, sulfinyl, sulfonyl, phosphino, and combinations thereof.

In one aspect, $Ar^1$ to $Ar^9$ is independently selected from the group consisting of:

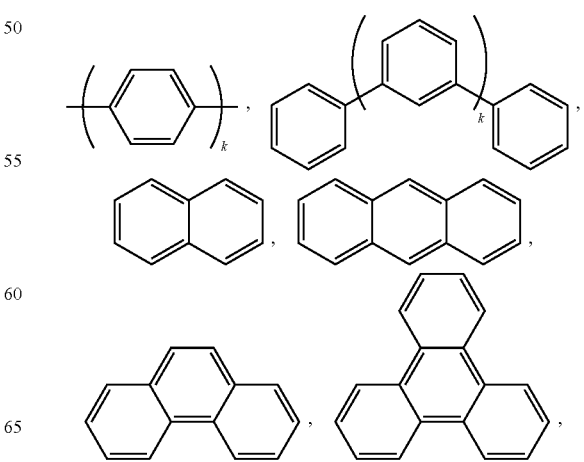

-continued

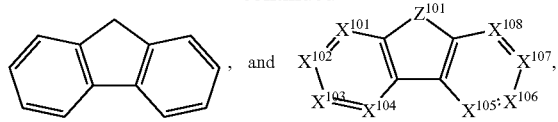

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

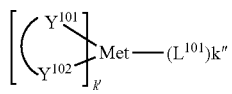

wherein Met is a metal, which can have an atomic weight greater than 40; $(Y^{101}\text{-}Y^{102})$ is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, $(Y^{101}\text{-}Y^{102})$ is a 2-phenylpyridine derivative. In another aspect, $(Y^{101}\text{-}Y^{102})$ is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, US06517957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

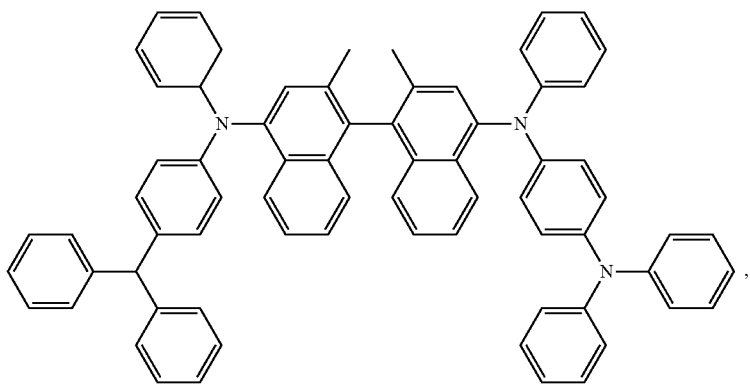

-continued
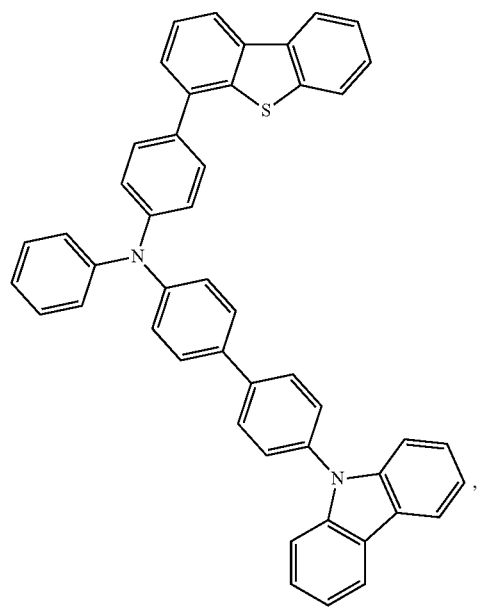
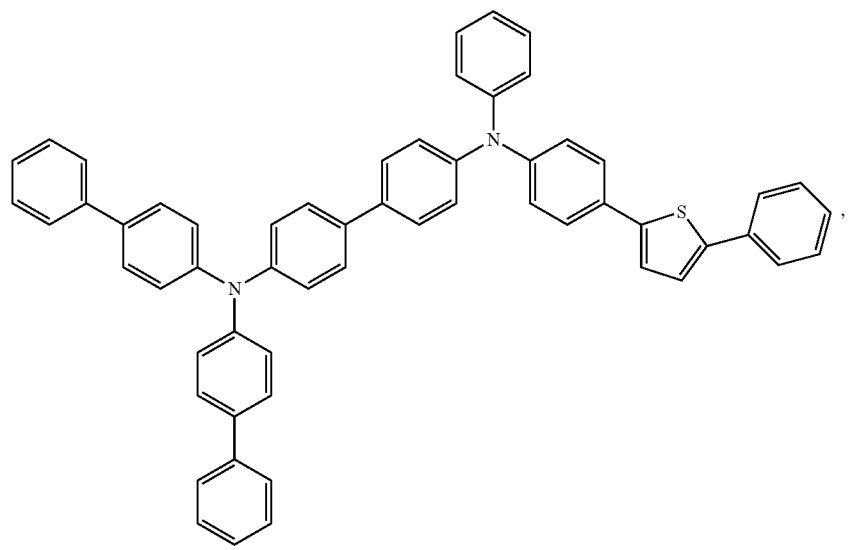
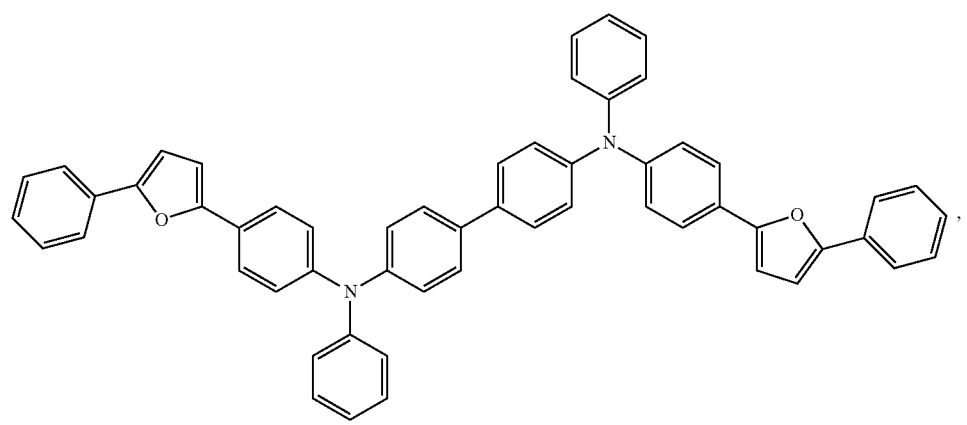

-continued
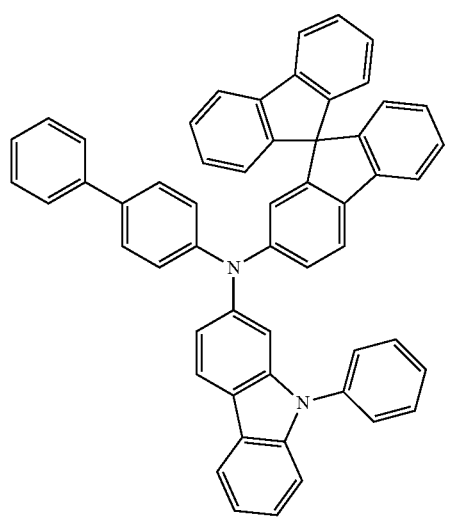
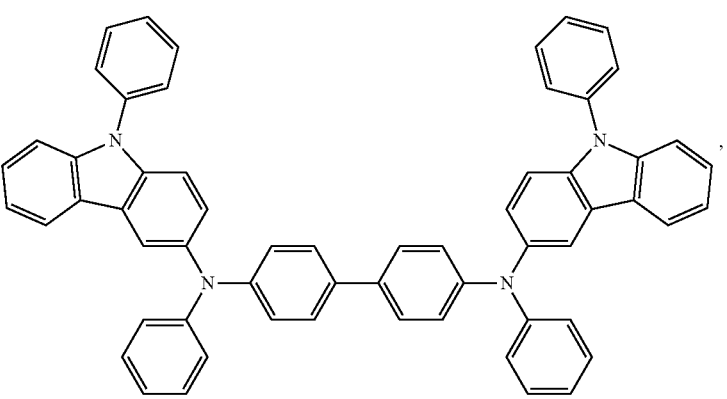
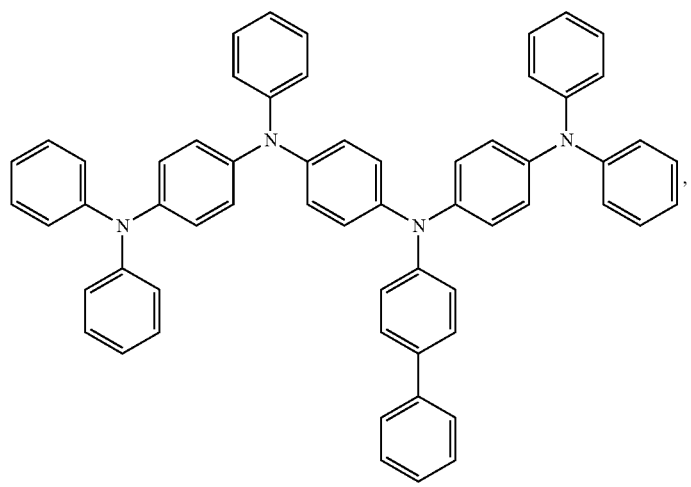
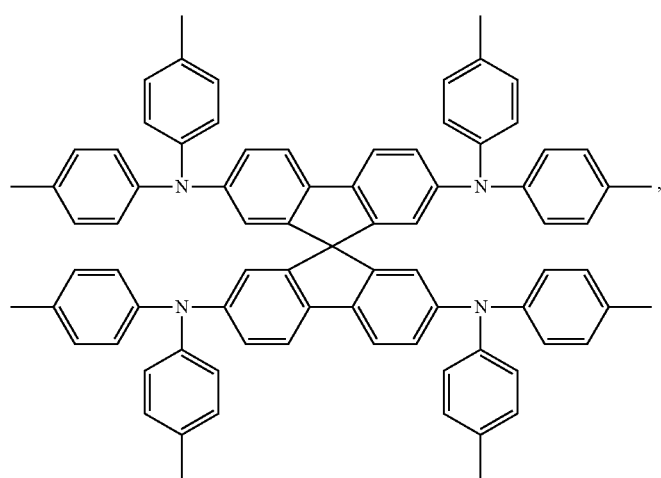

-continued
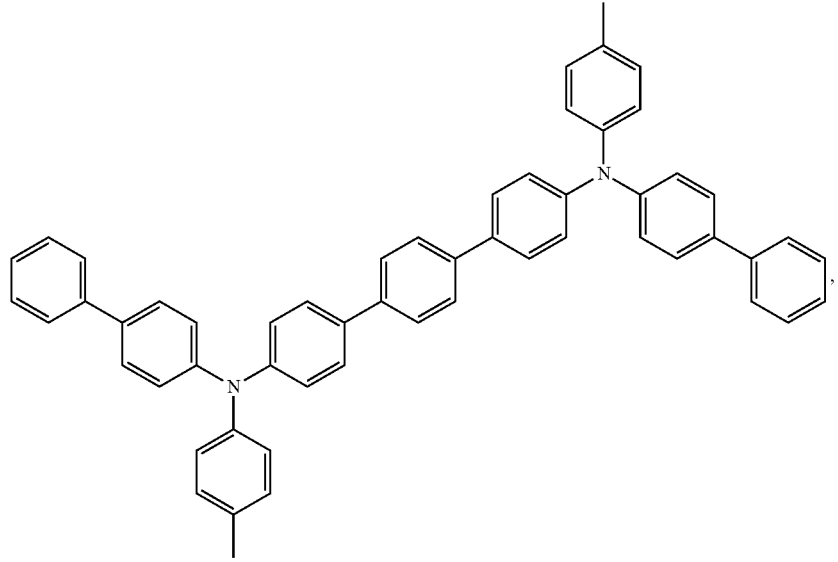
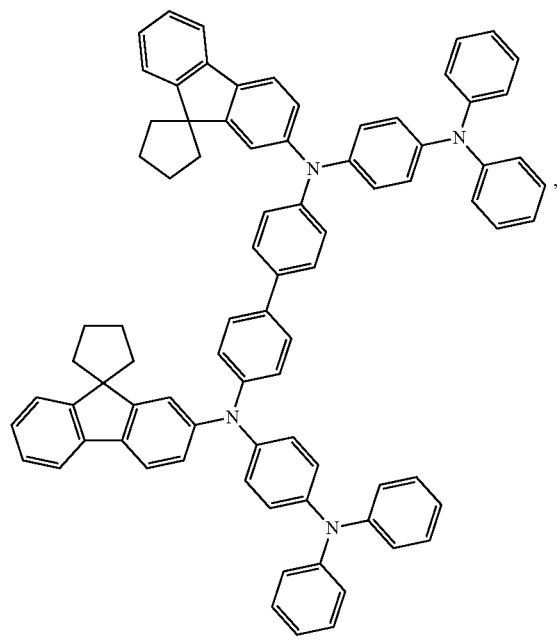
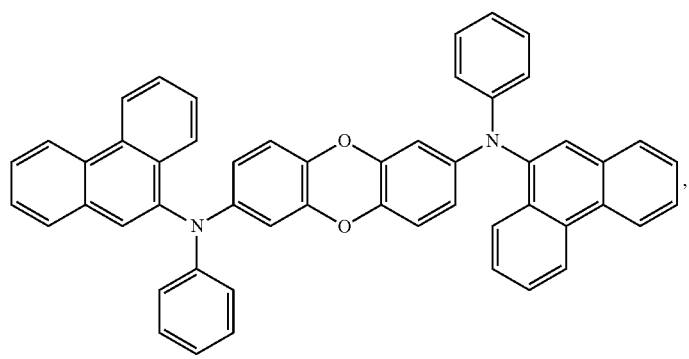

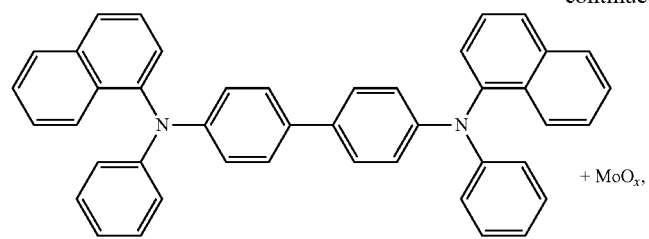
+ MoOx,
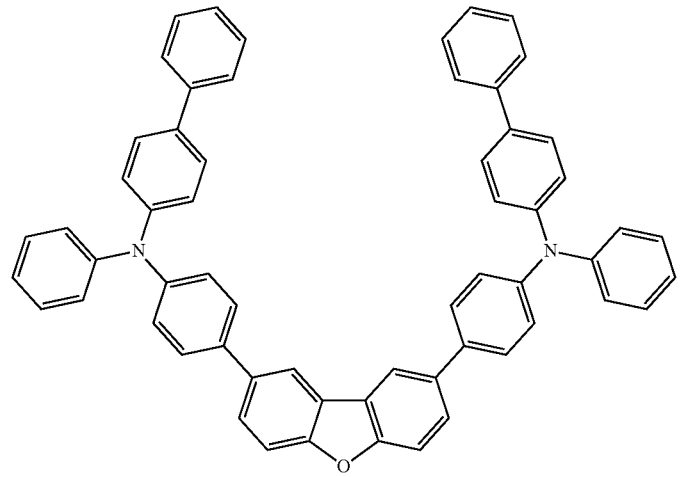
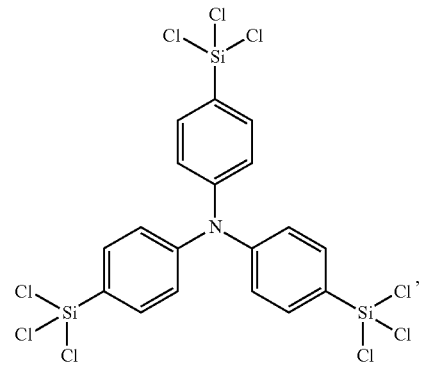
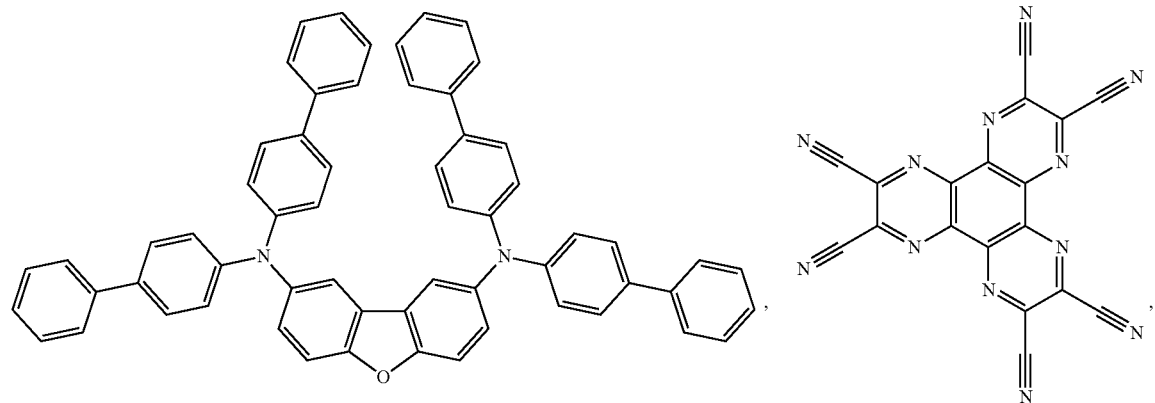
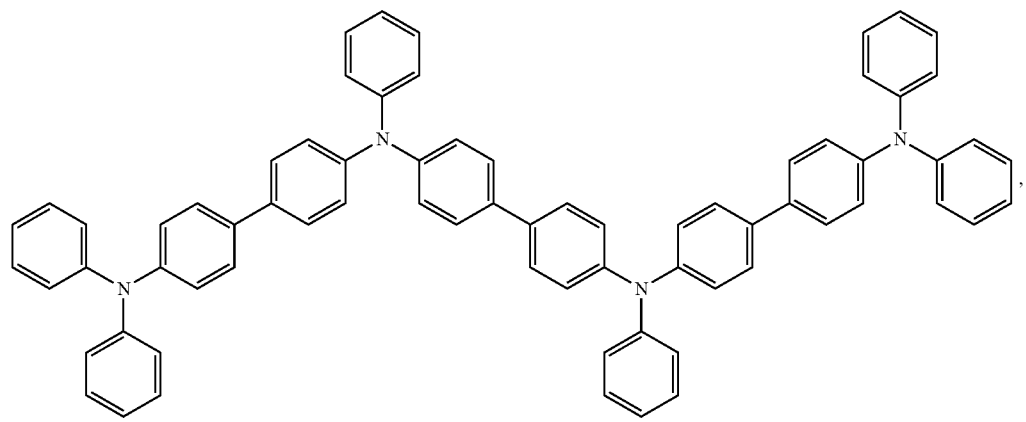

-continued
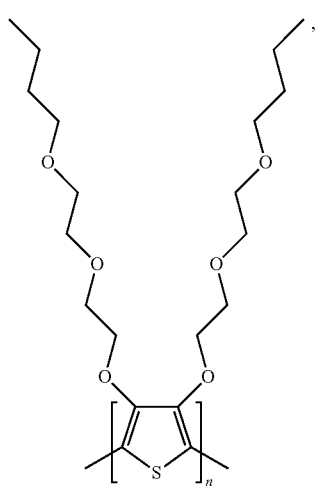
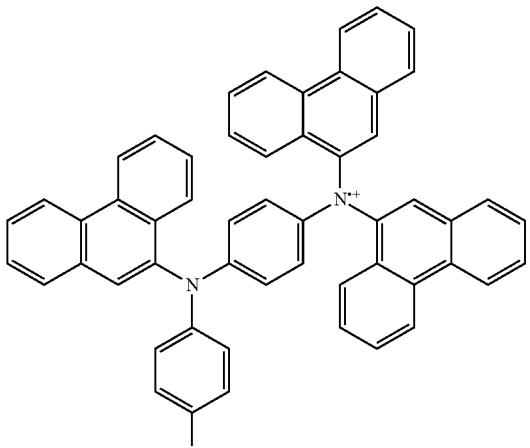
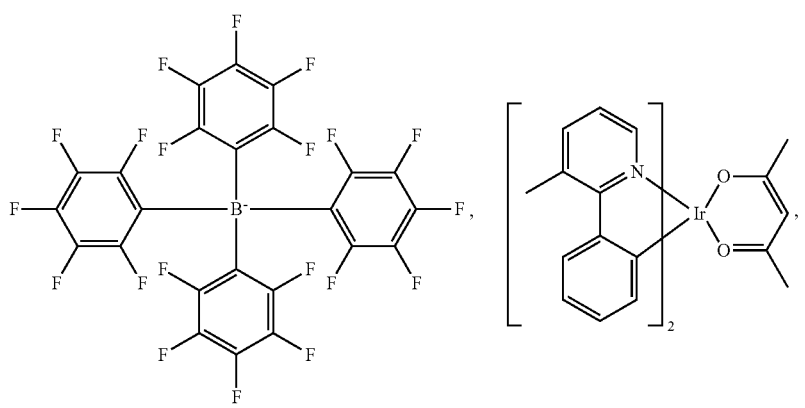
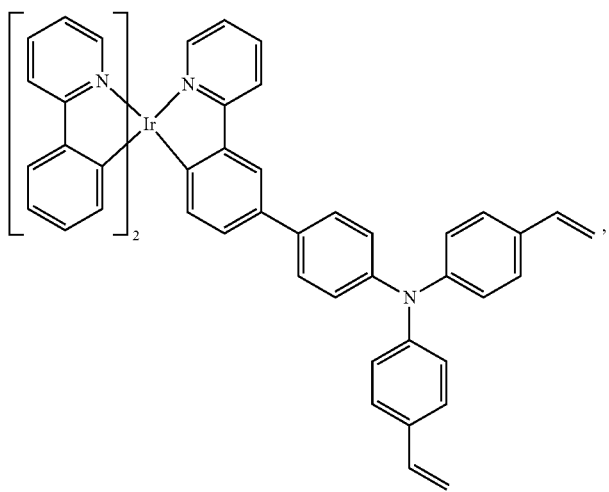

-continued
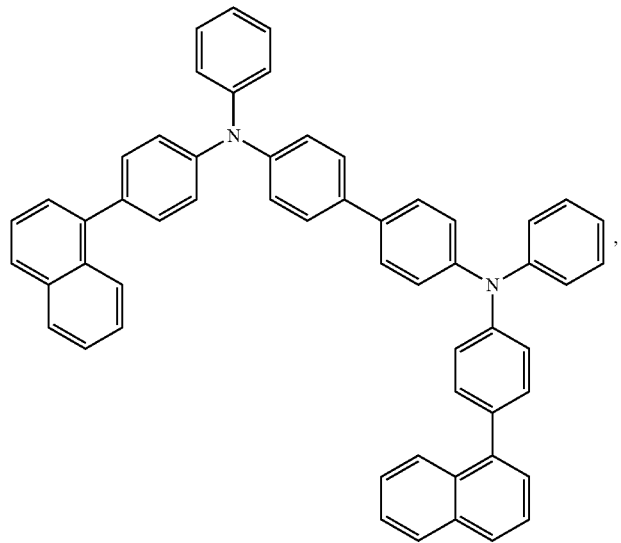
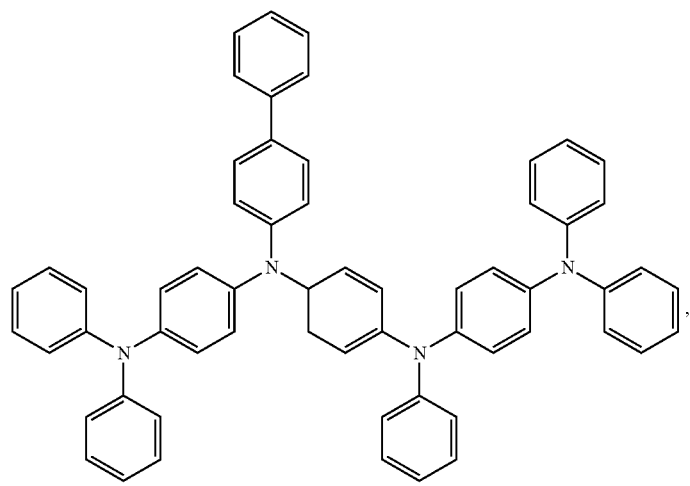
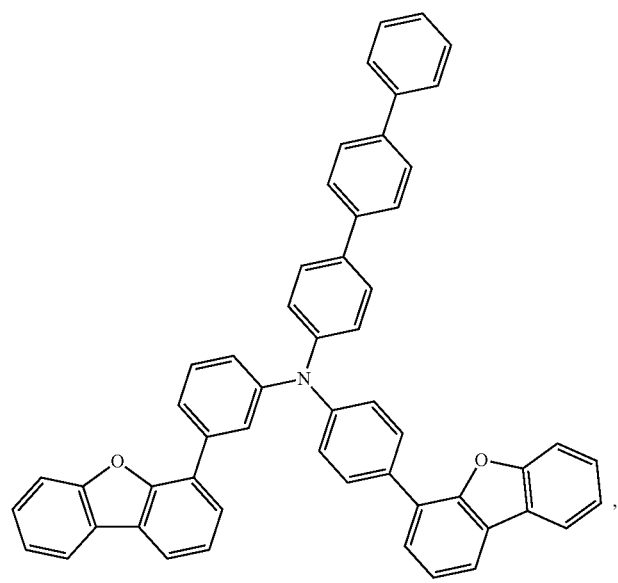

-continued
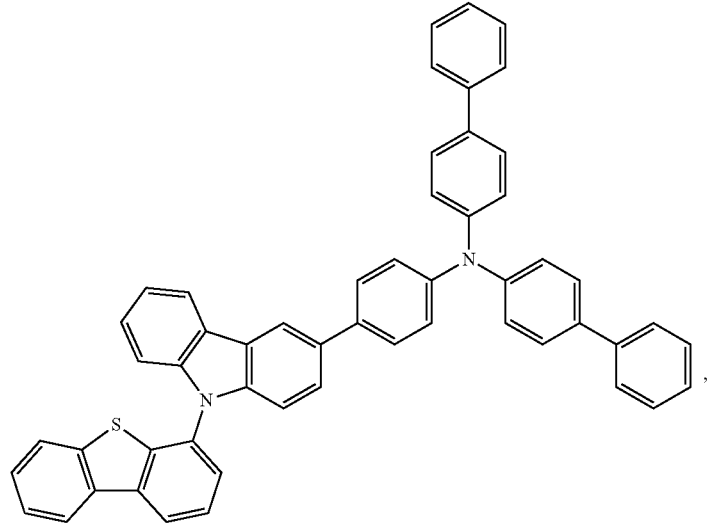
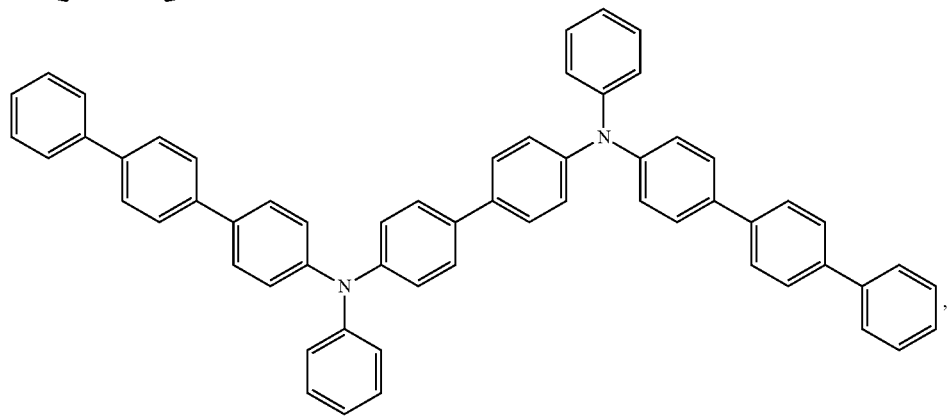
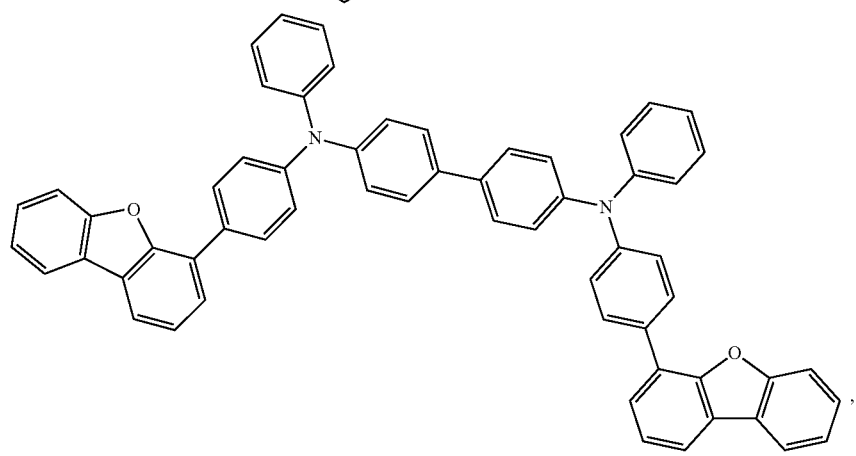
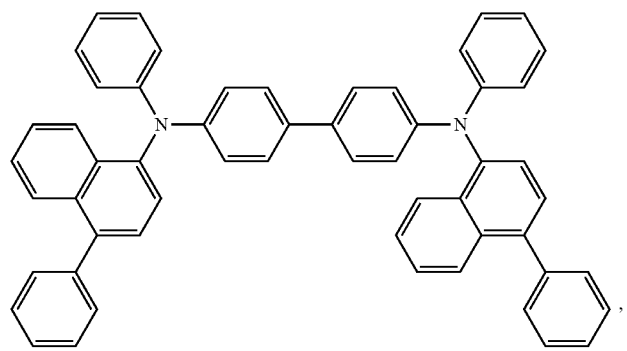

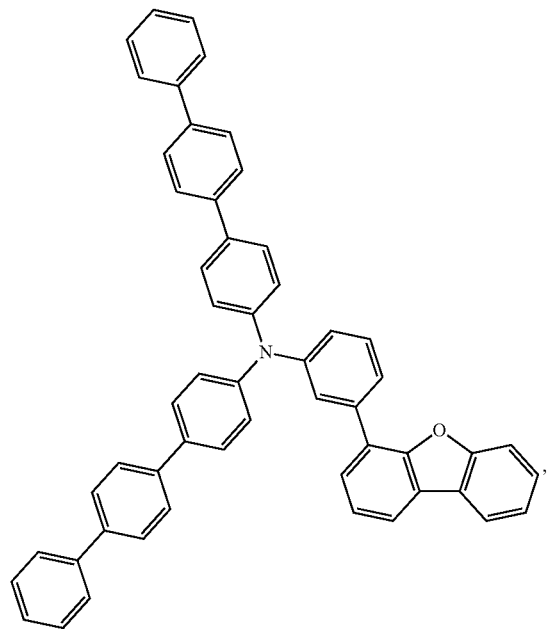
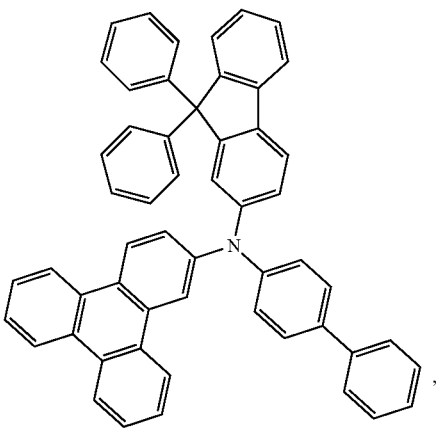
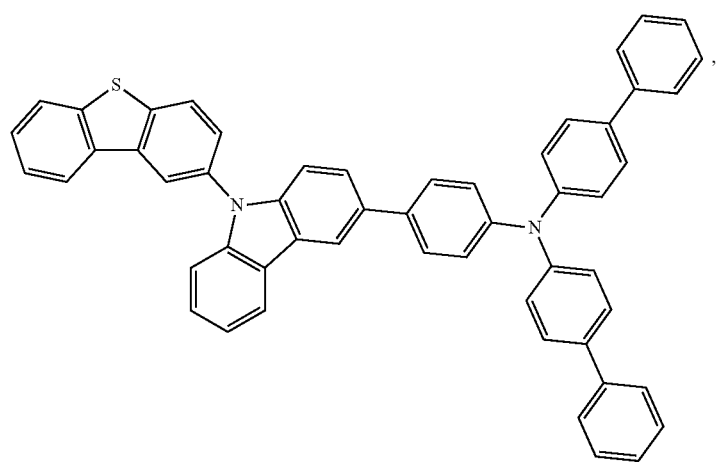
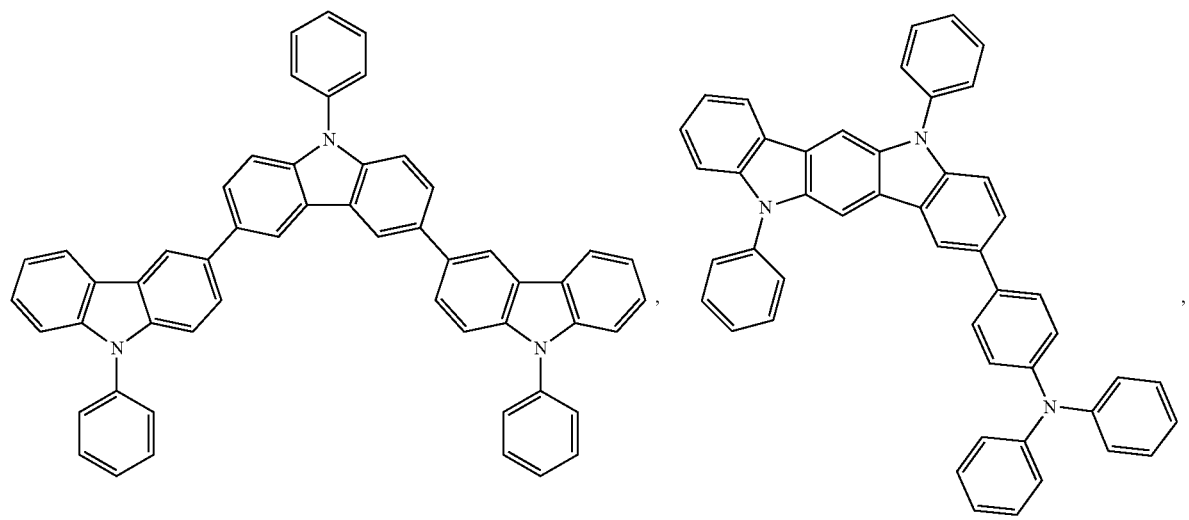

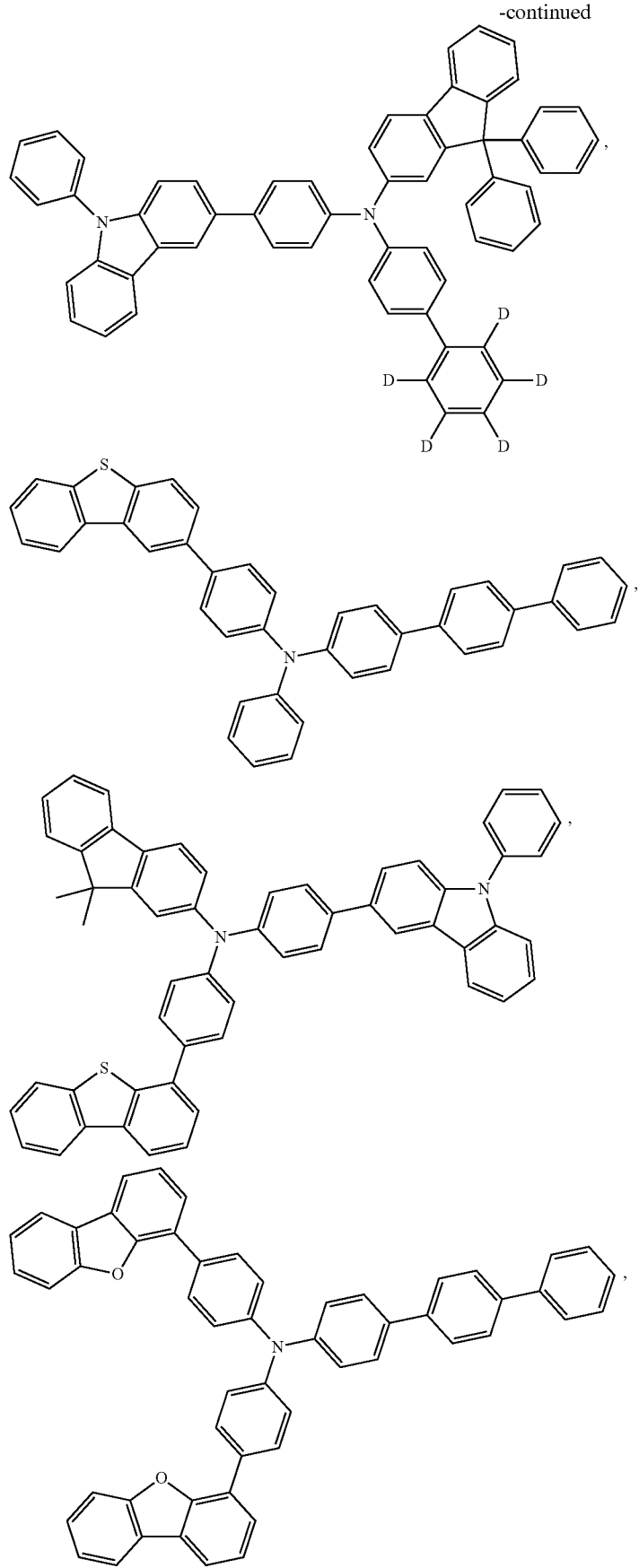

67 68
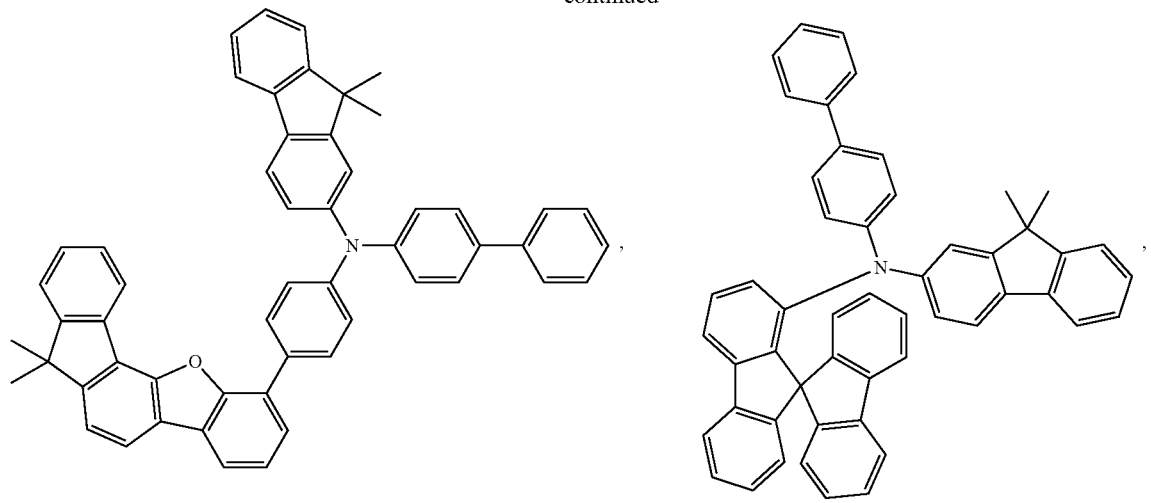
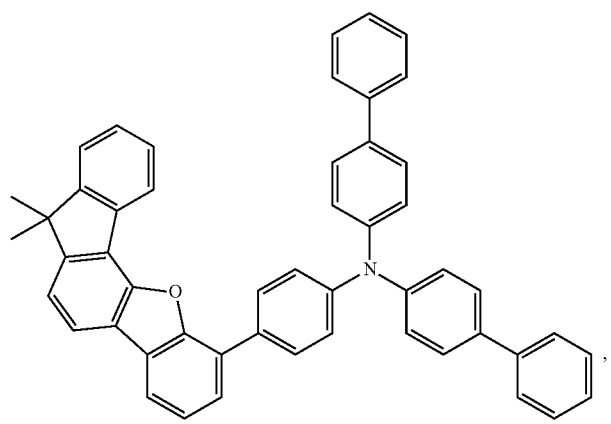
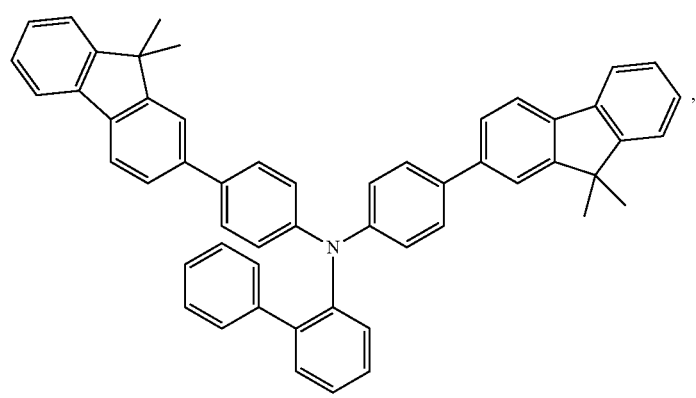

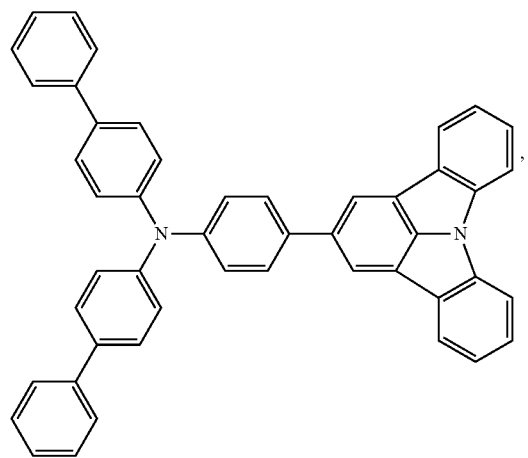
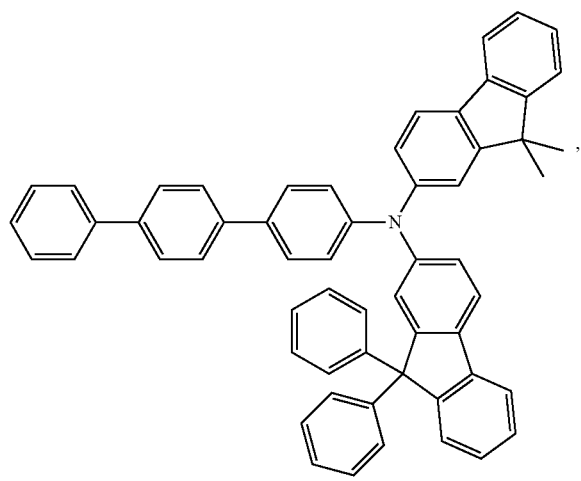
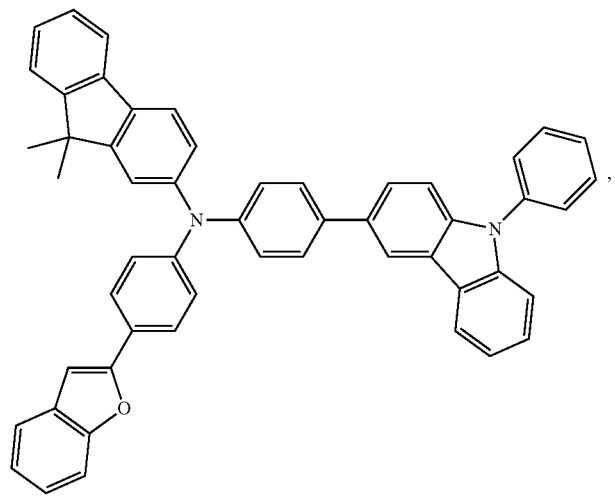
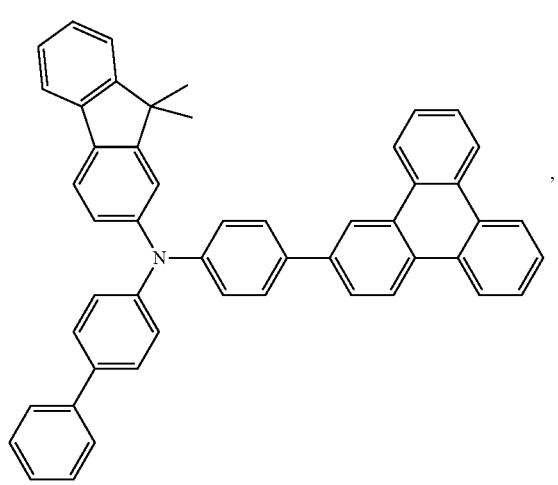
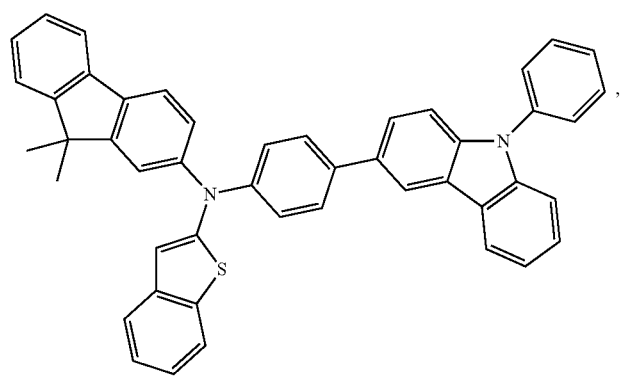

-continued
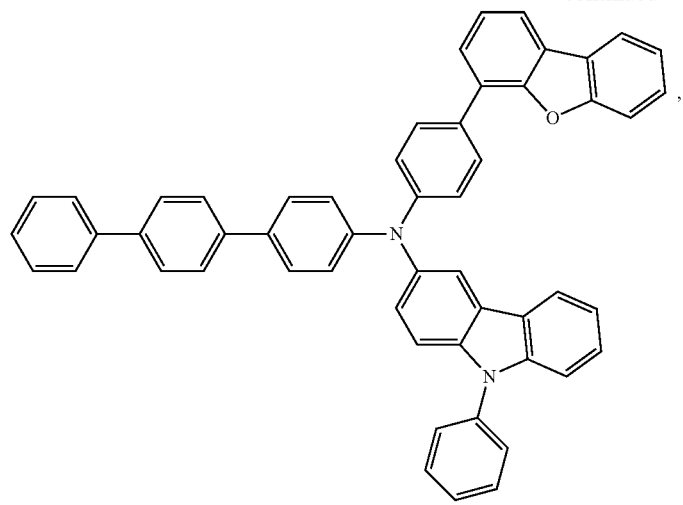
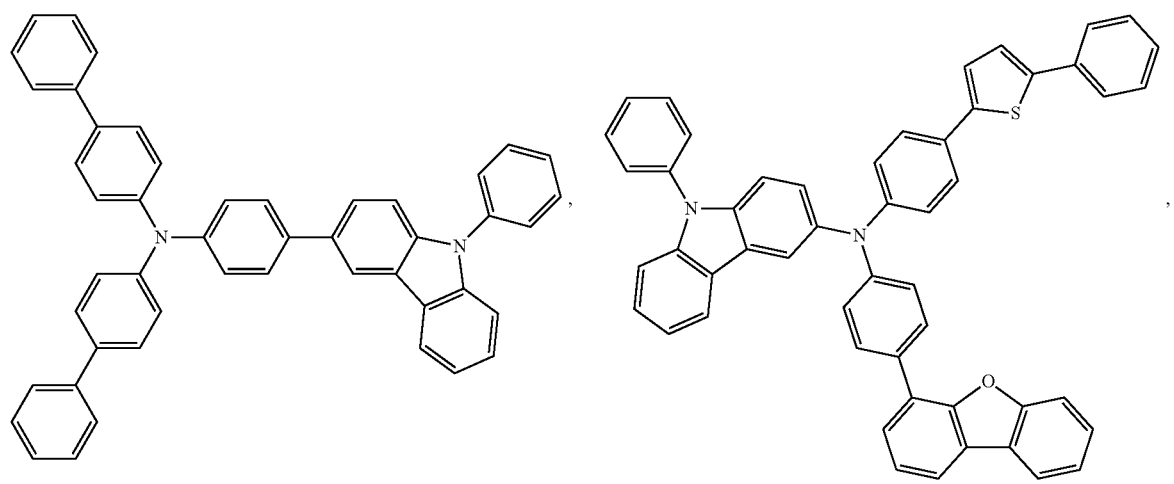
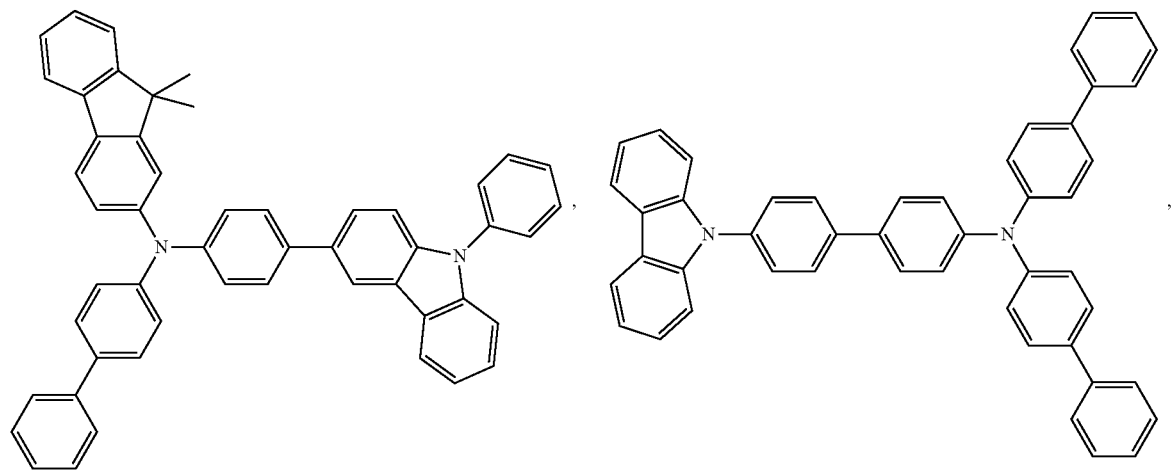

-continued
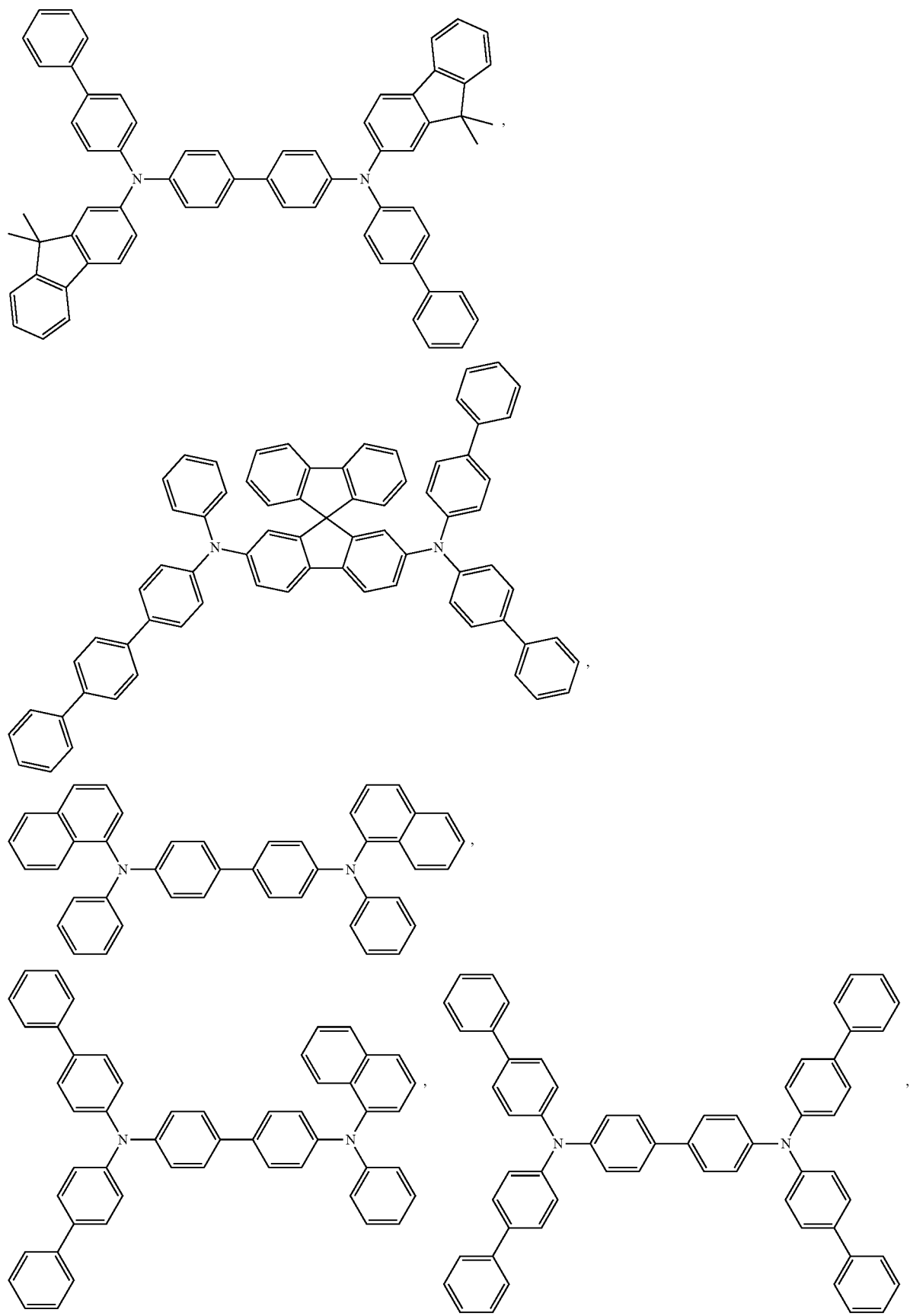

-continued
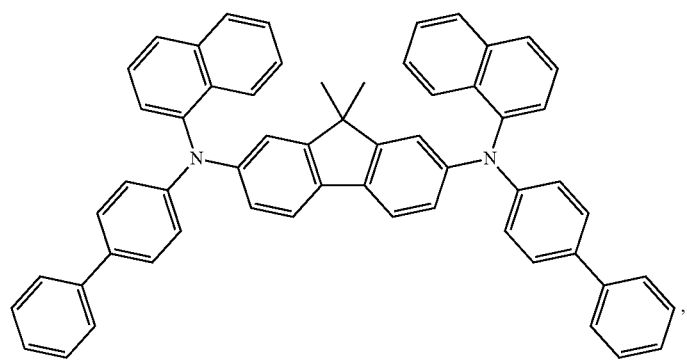
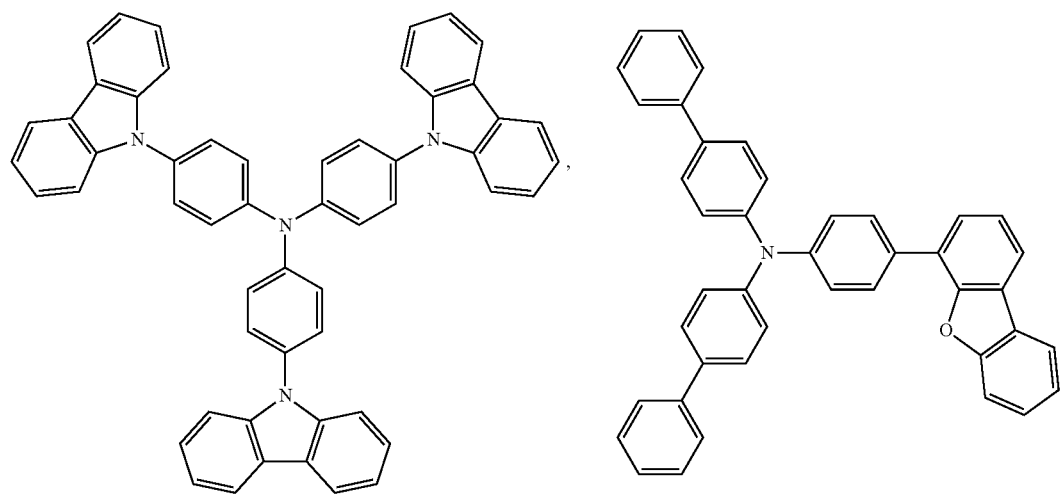
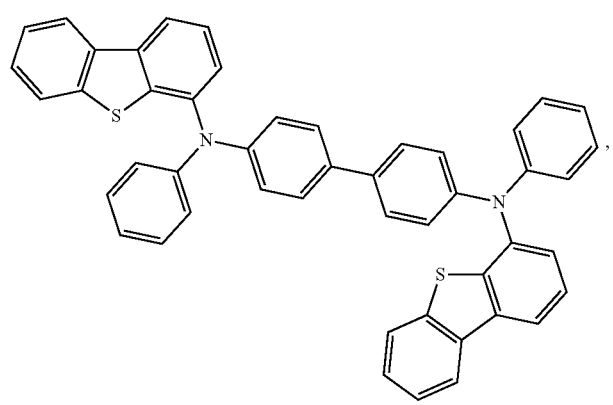

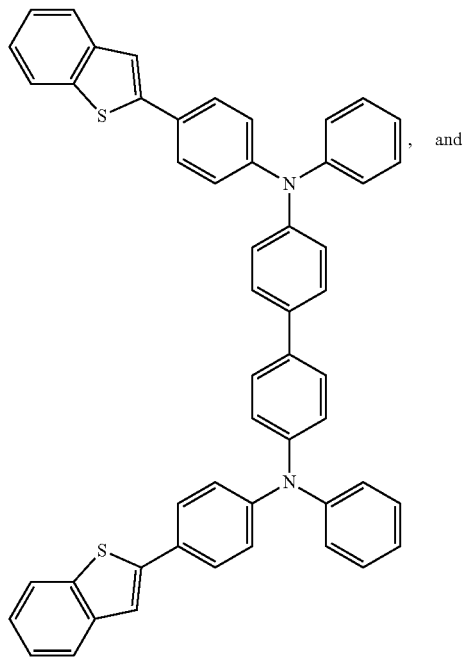

, and

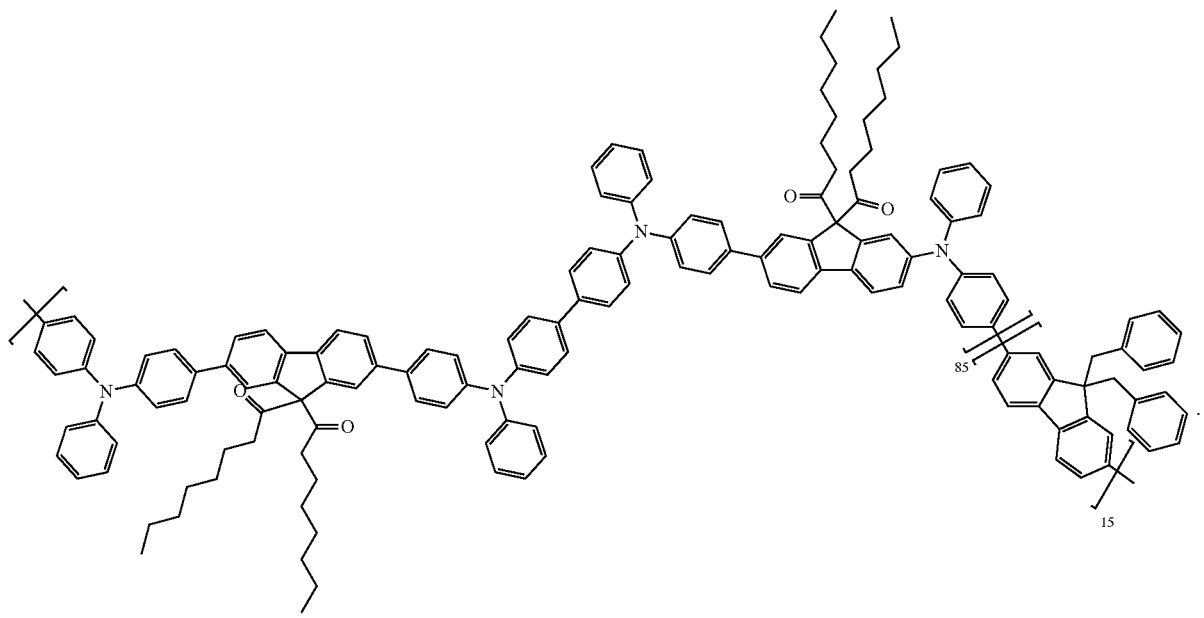

c) EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

d) Hosts:

The light emitting layer of the organic EL device of the present disclosure preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

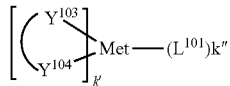

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

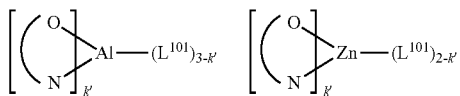

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

In one aspect, the host compound contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroalyl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

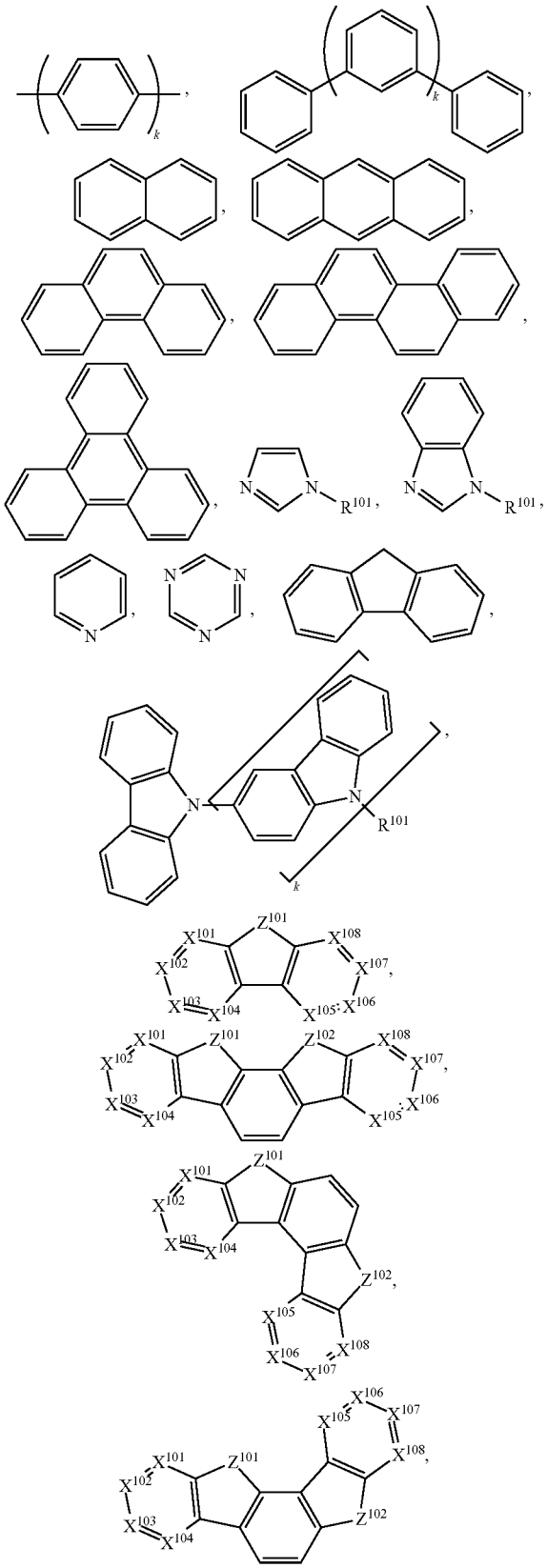

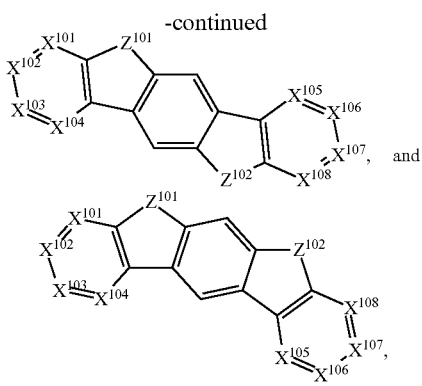

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803,

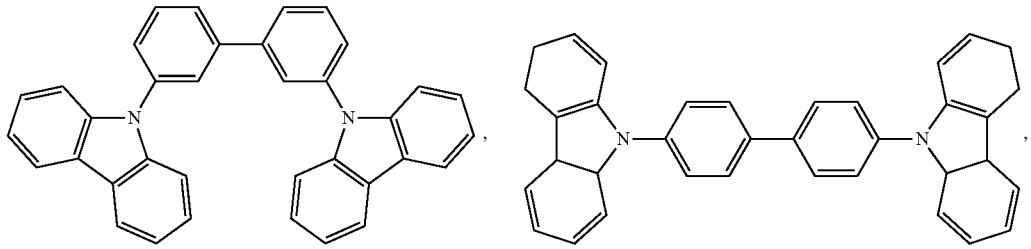

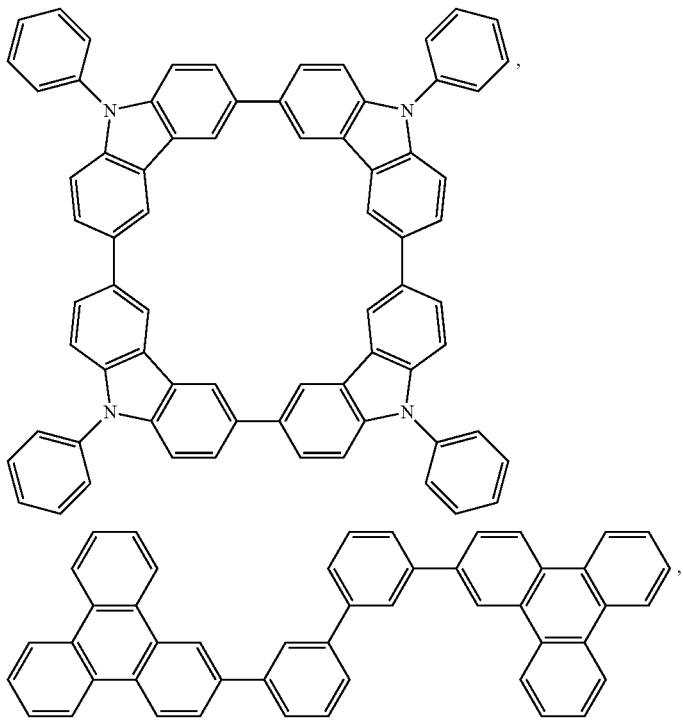

83
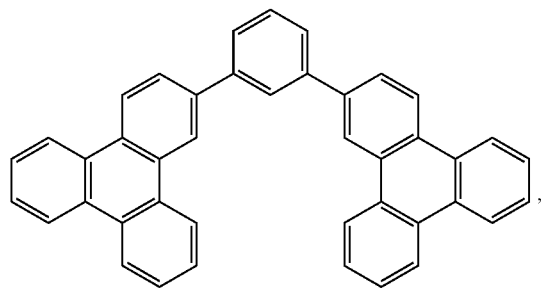
84
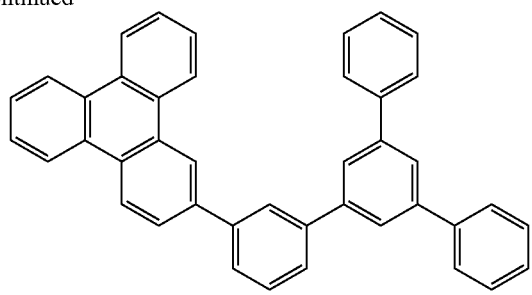
-continued
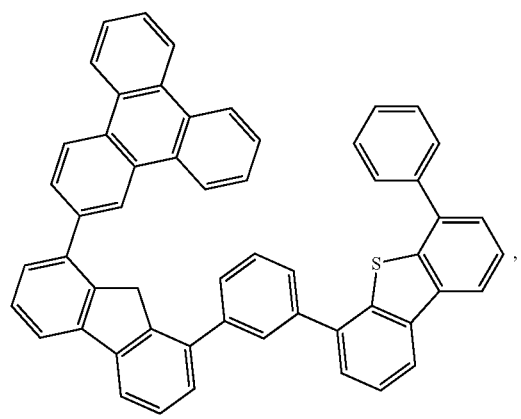
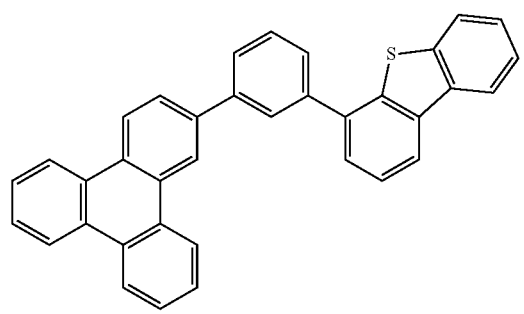
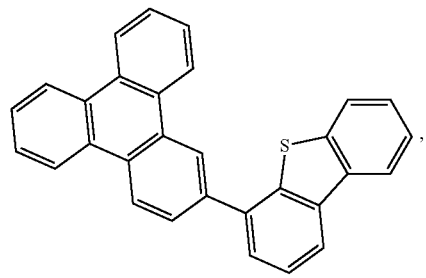
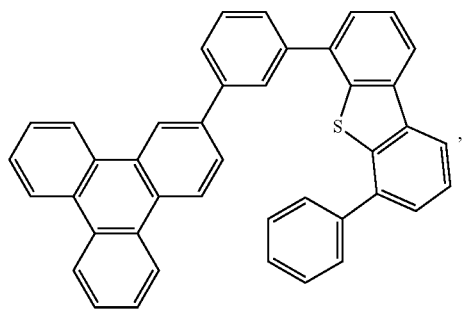
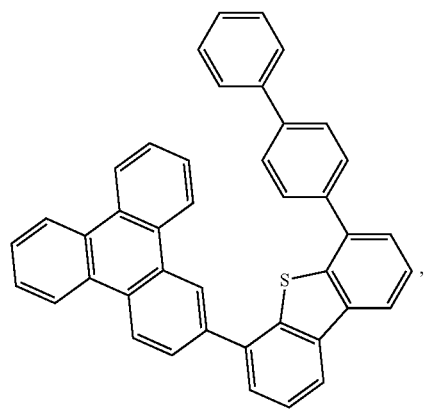
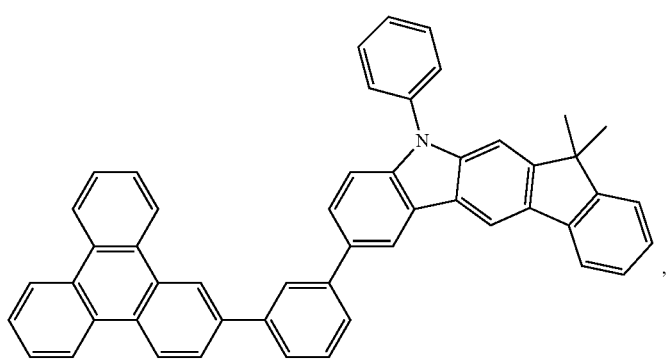

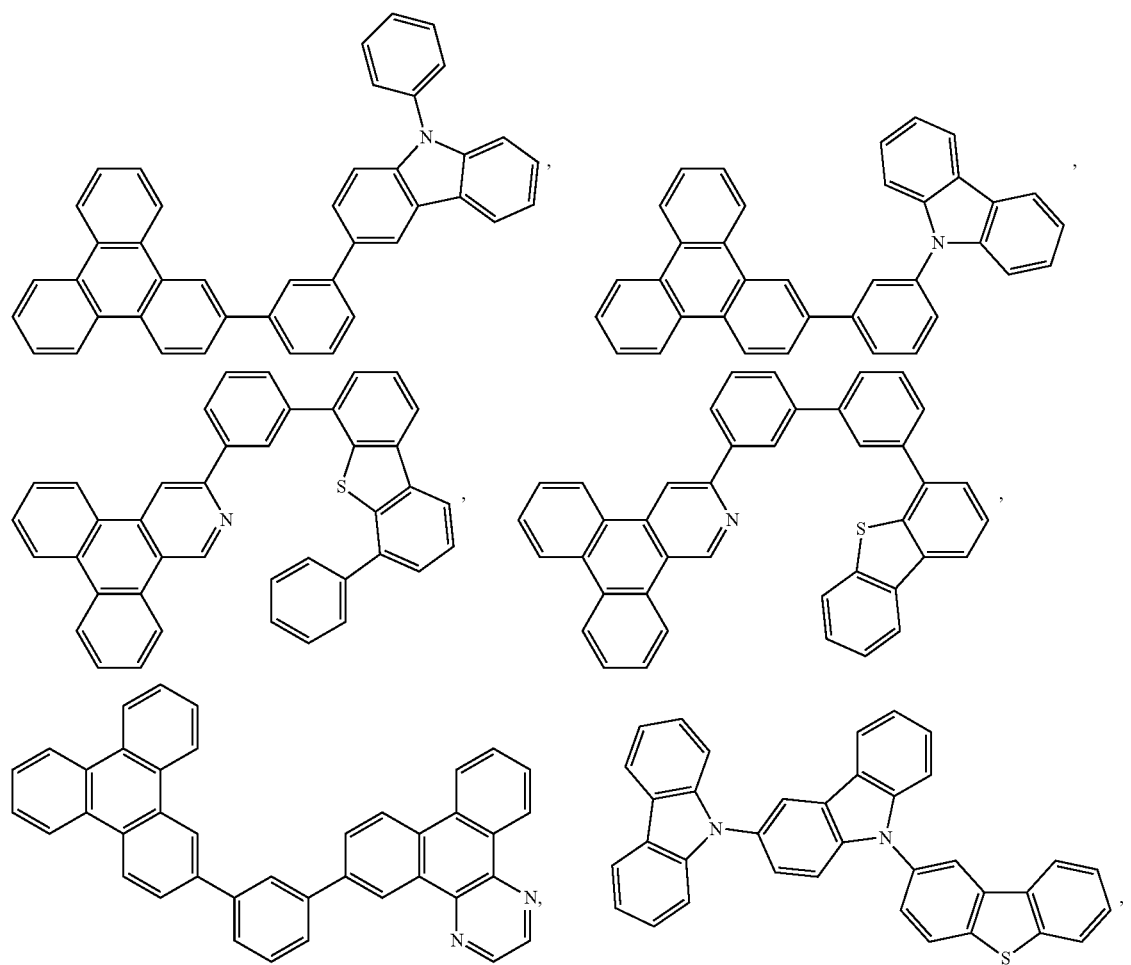
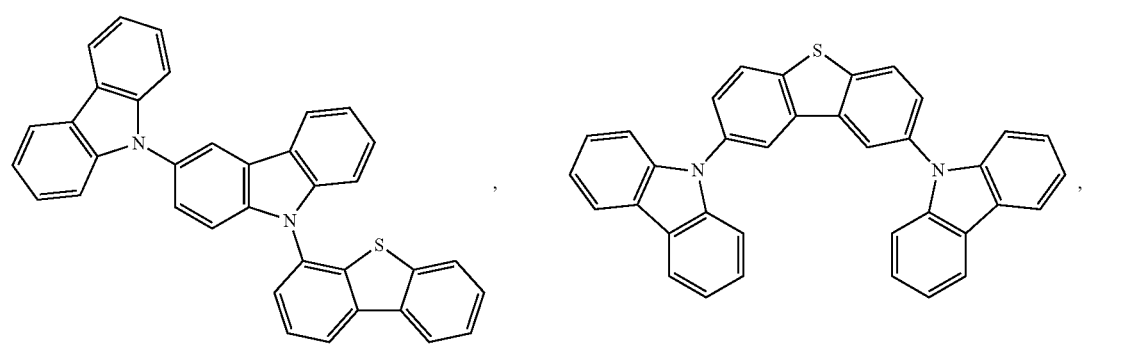
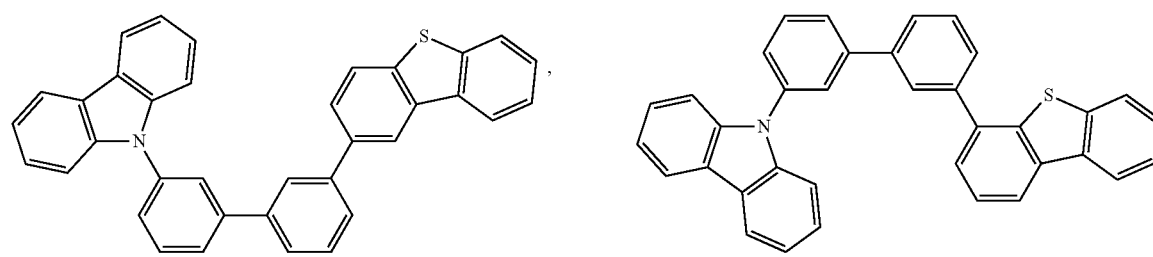

-continued
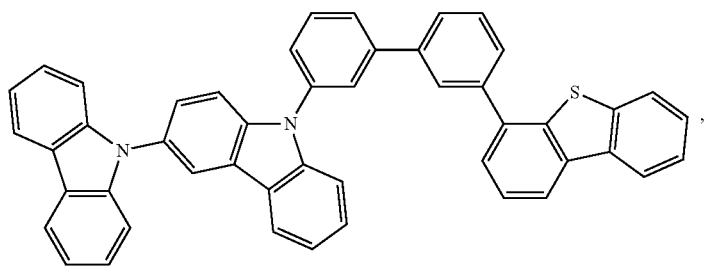
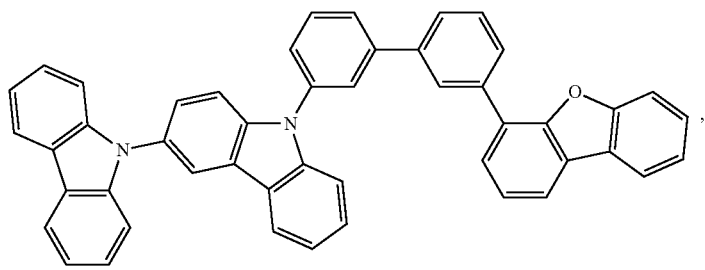
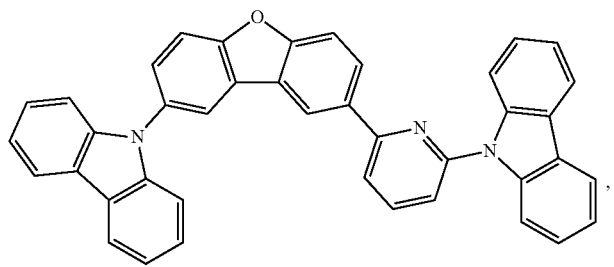
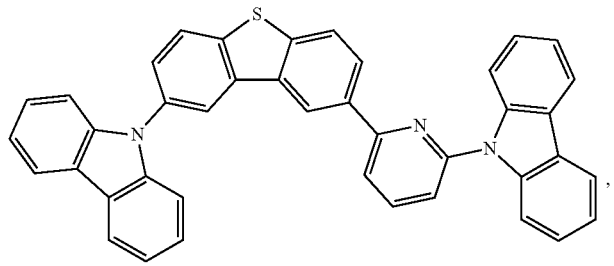
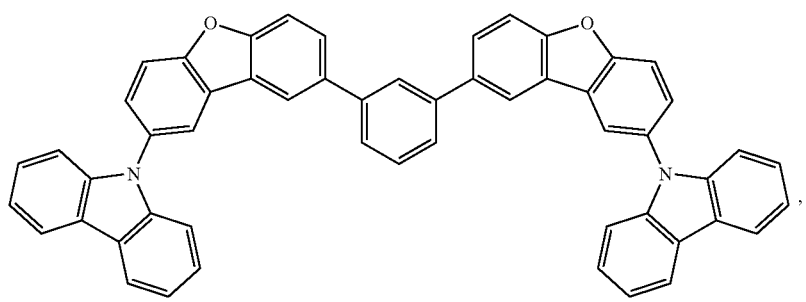
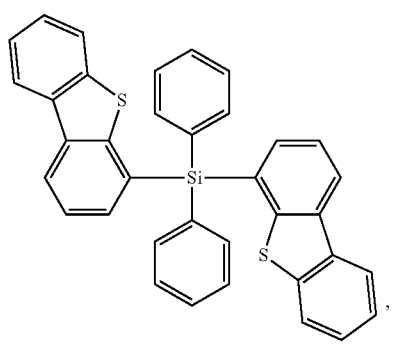
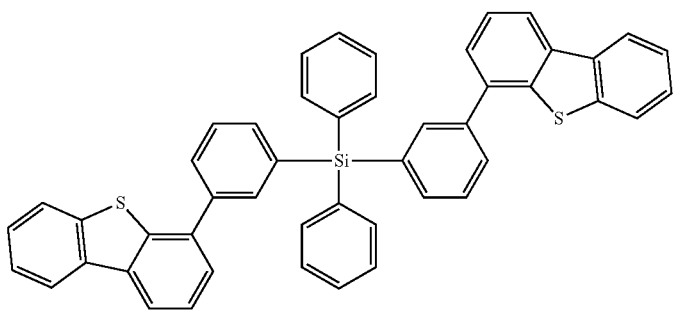

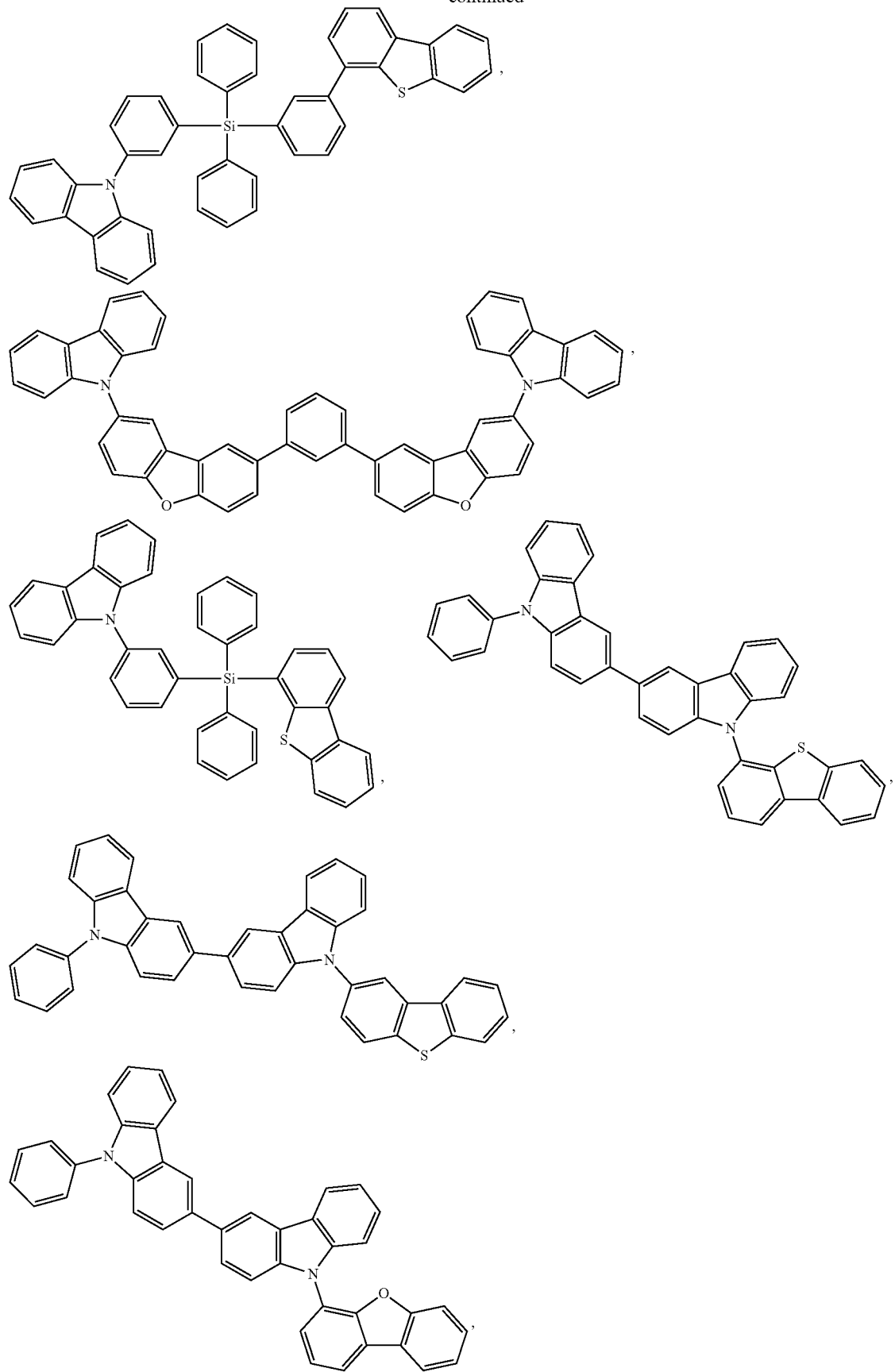

-continued
91
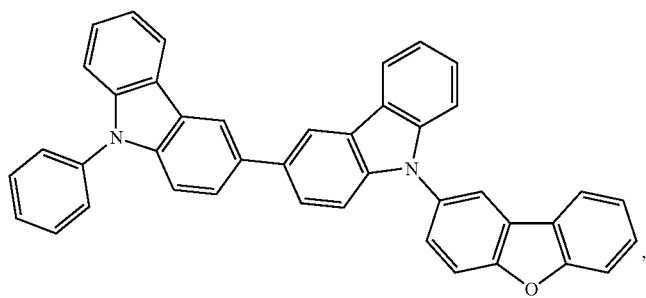
92
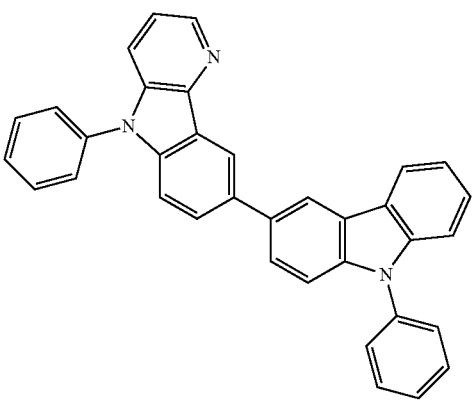
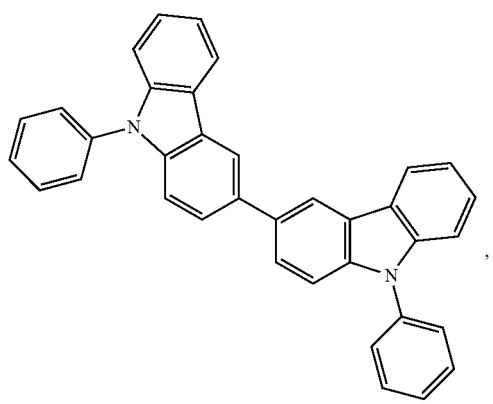
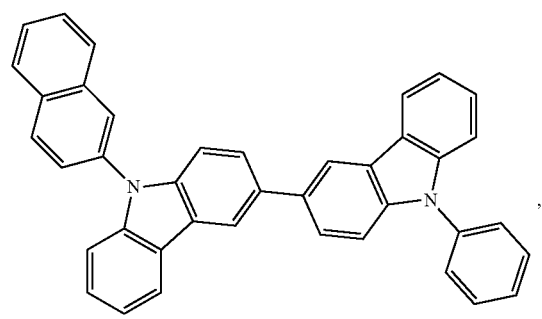
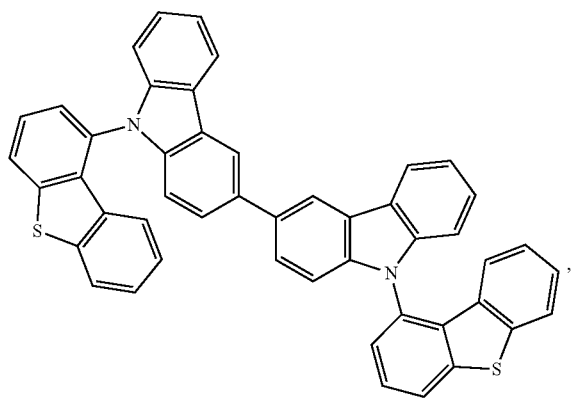
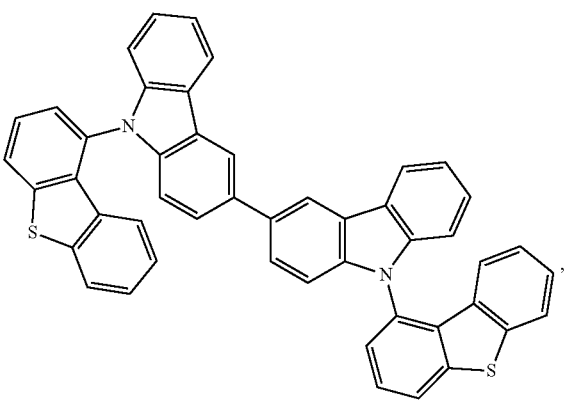
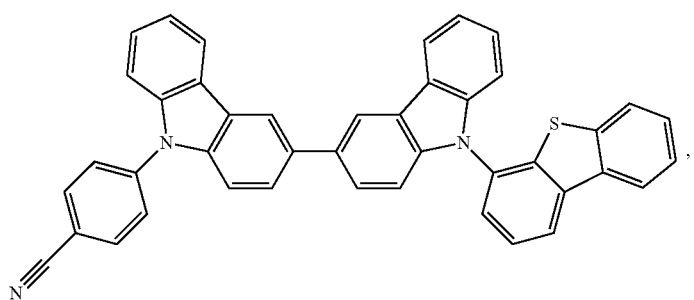

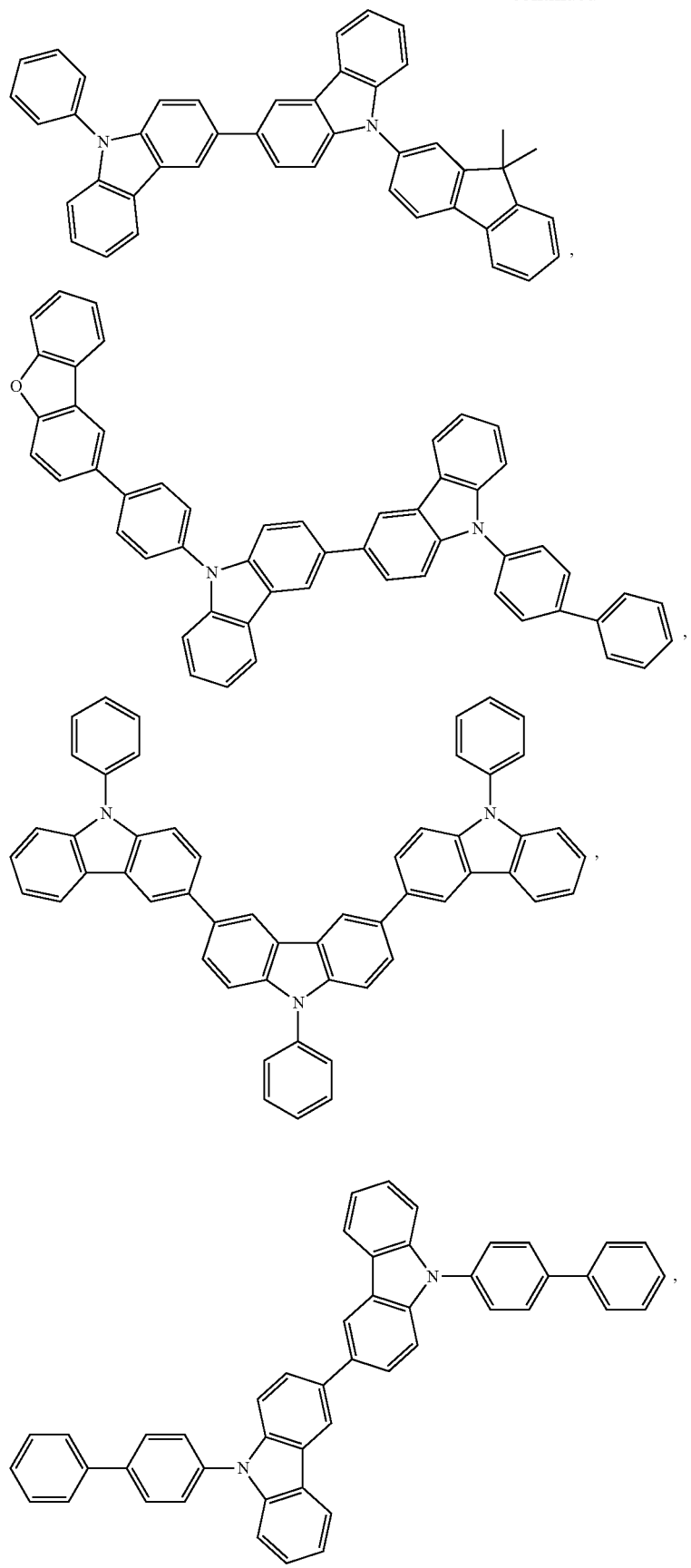

-continued
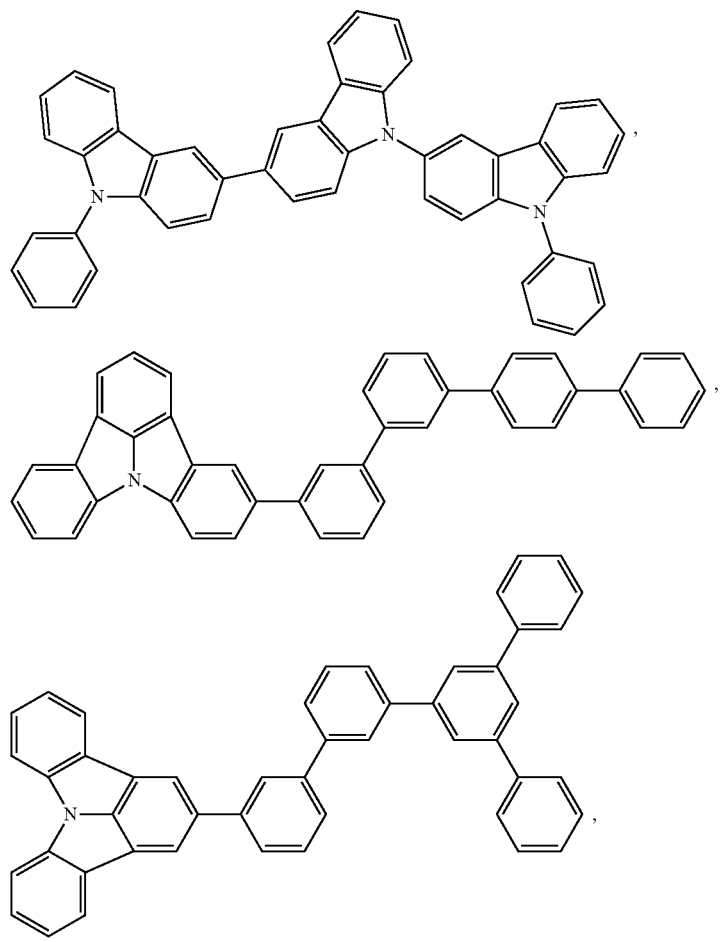
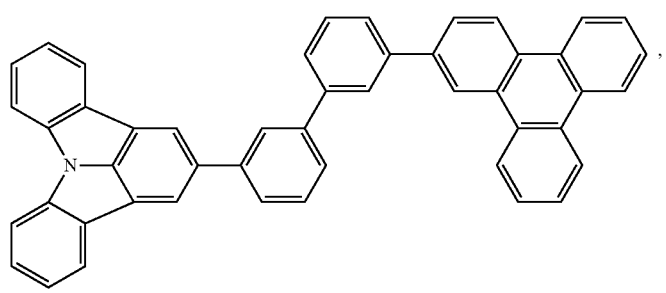
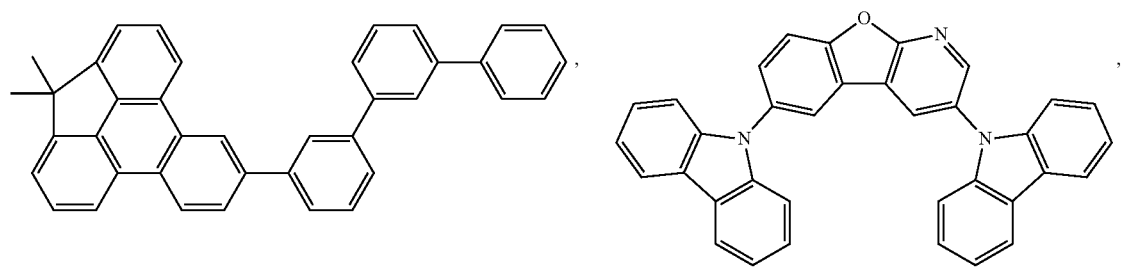

-continued
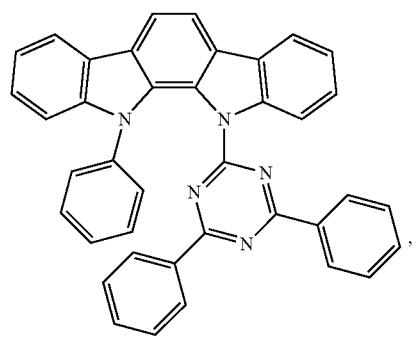
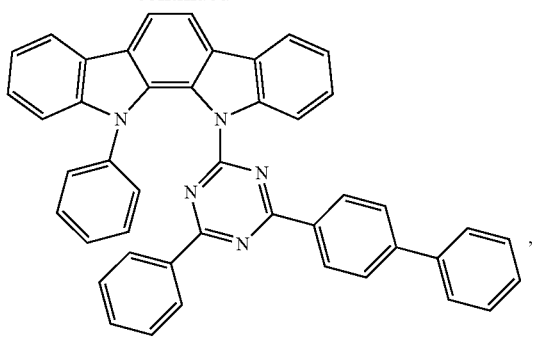
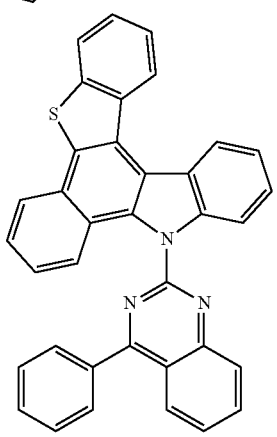
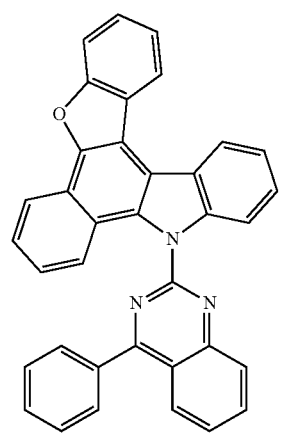
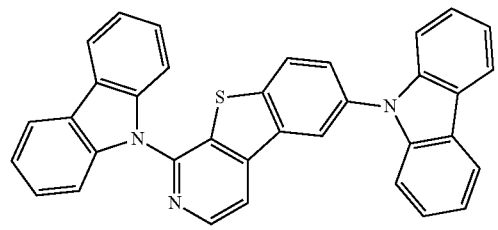
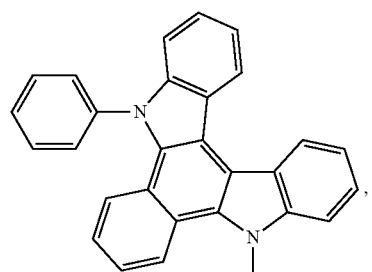
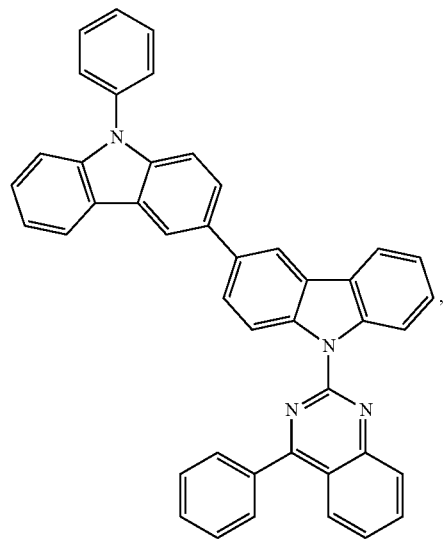
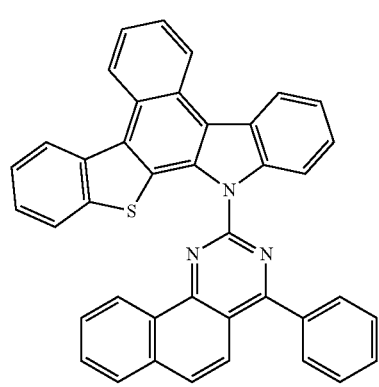
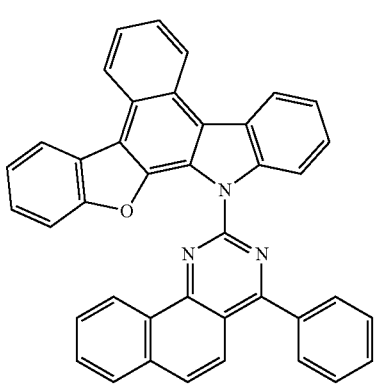
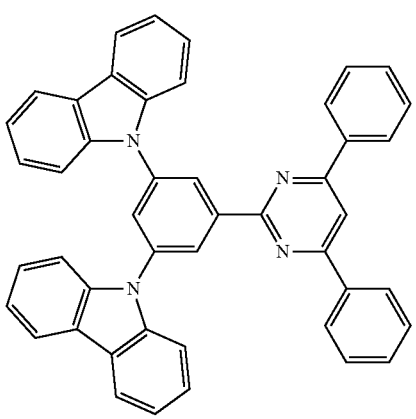

-continued
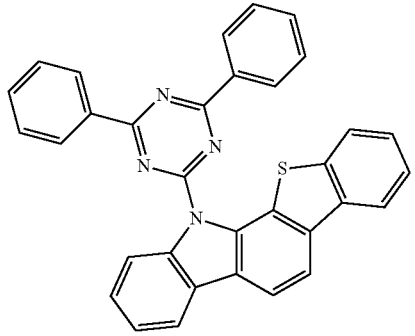,
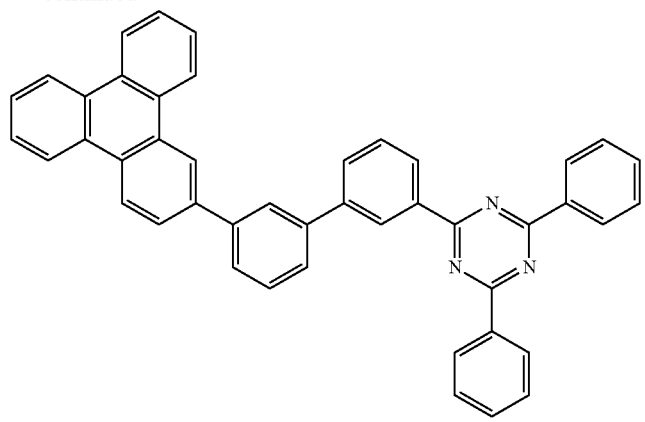,
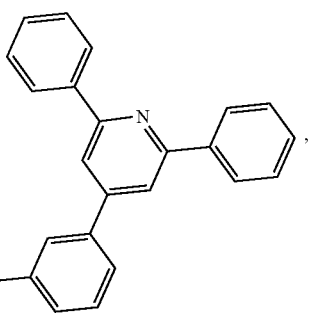,
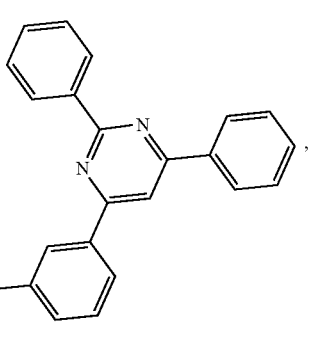,
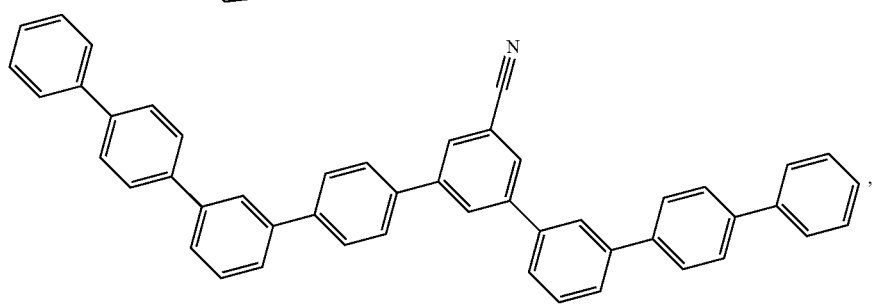,
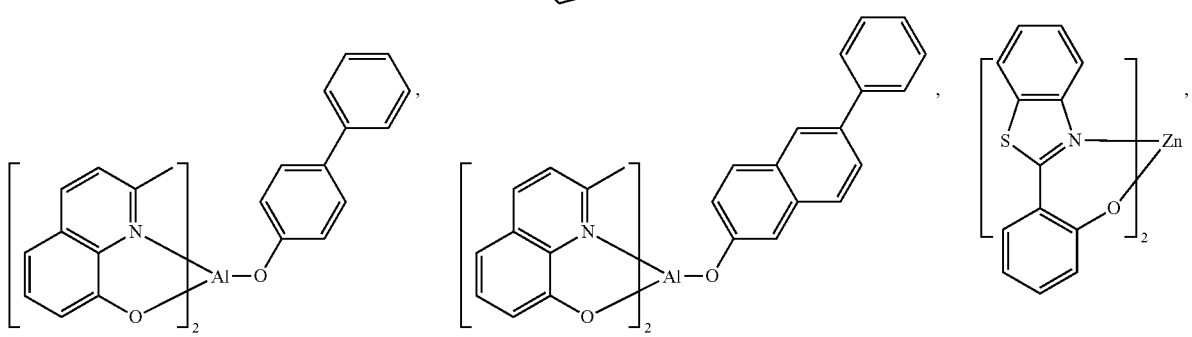, -continued

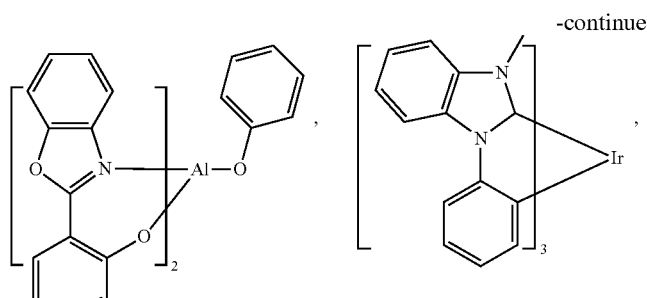

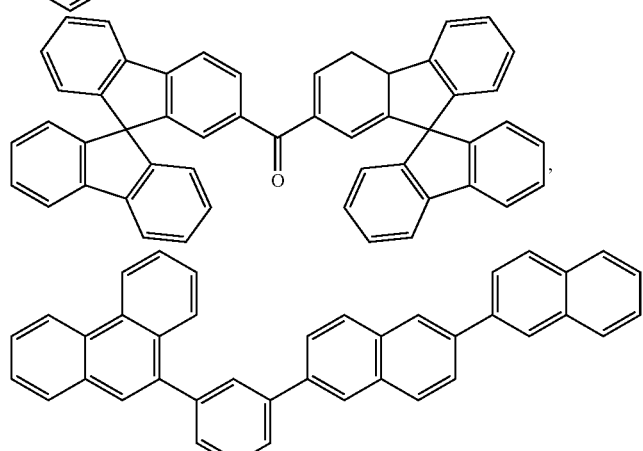

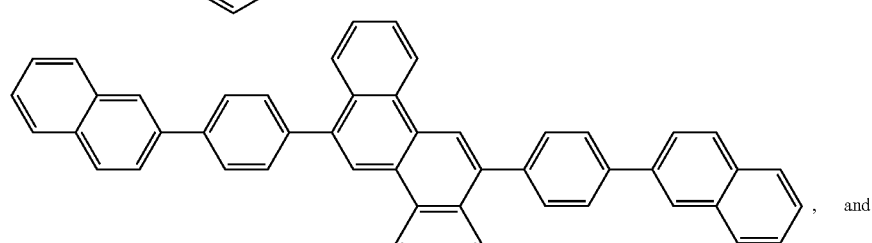

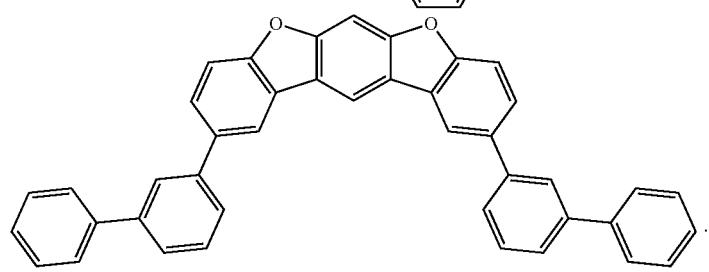

, and e) Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, US06699599, US06916554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.
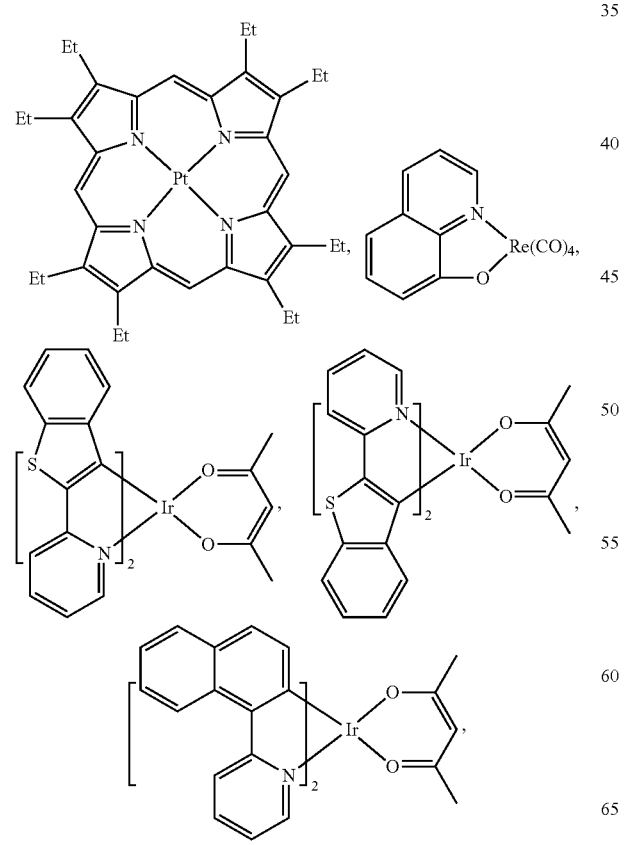
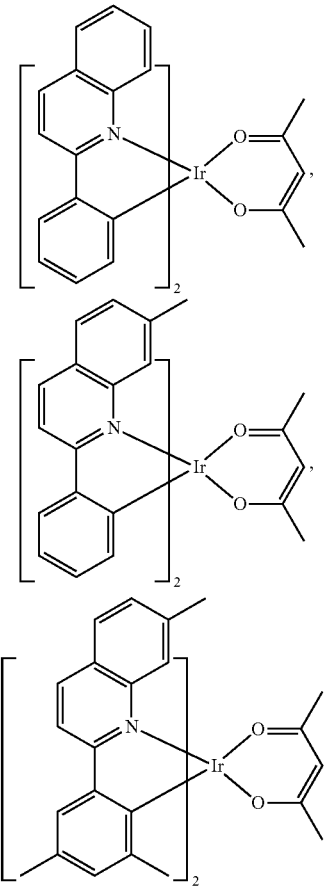

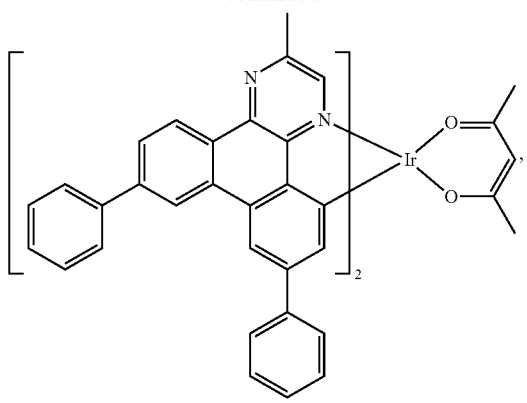
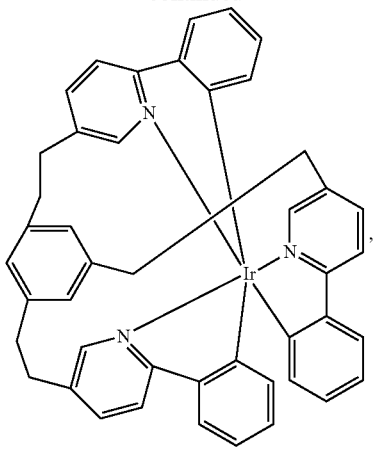
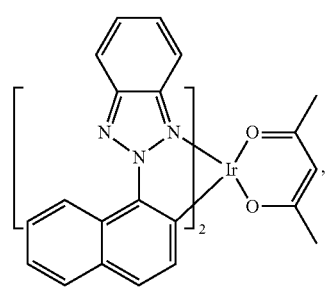
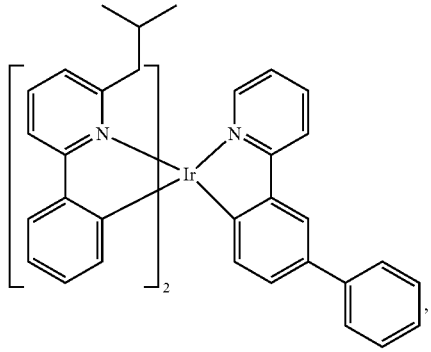
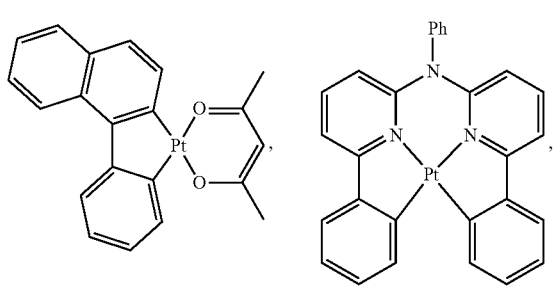
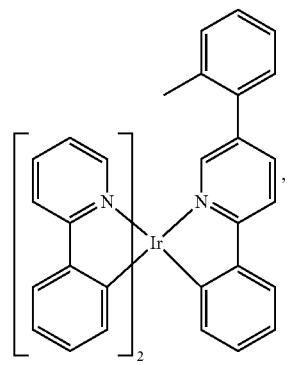
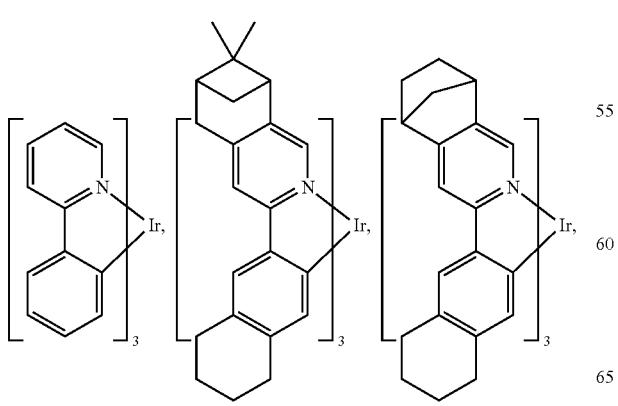
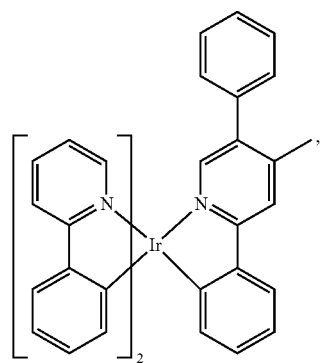

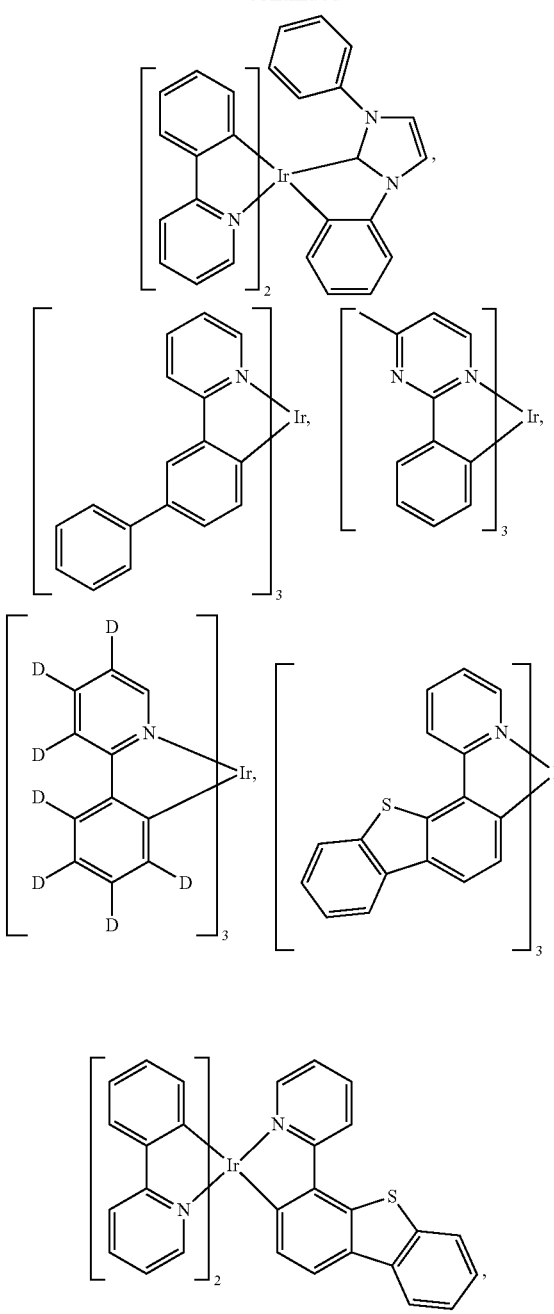
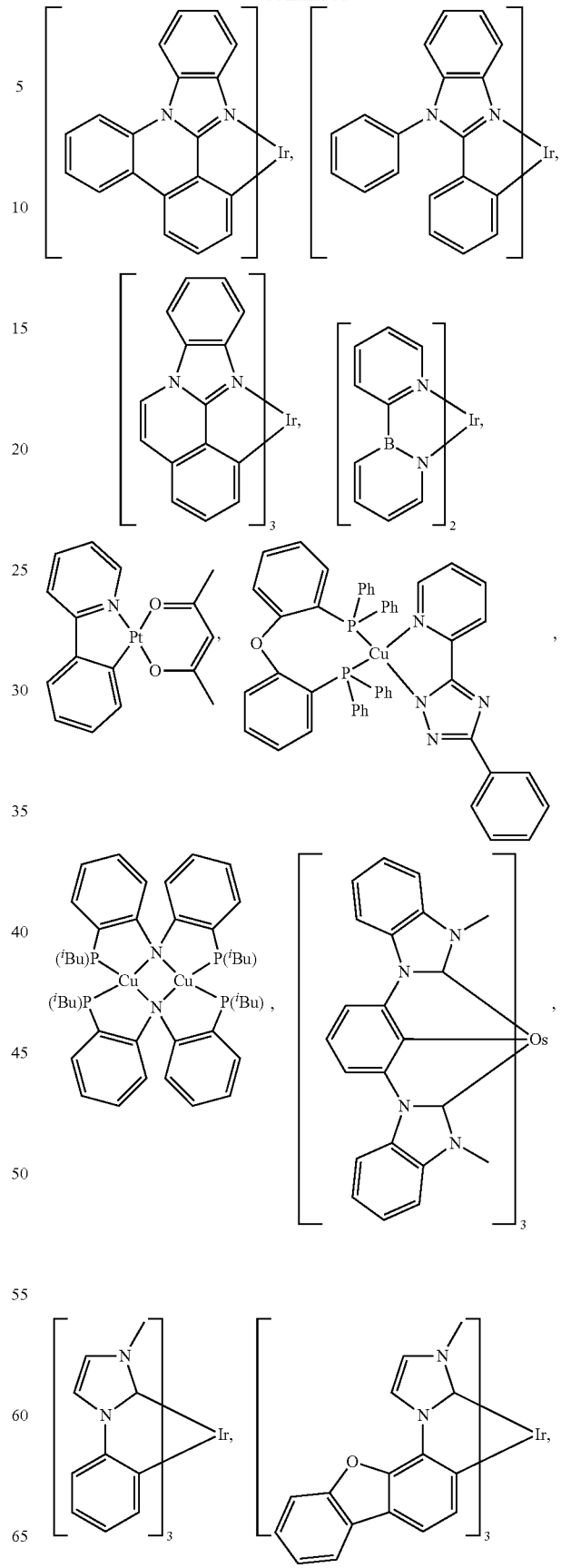

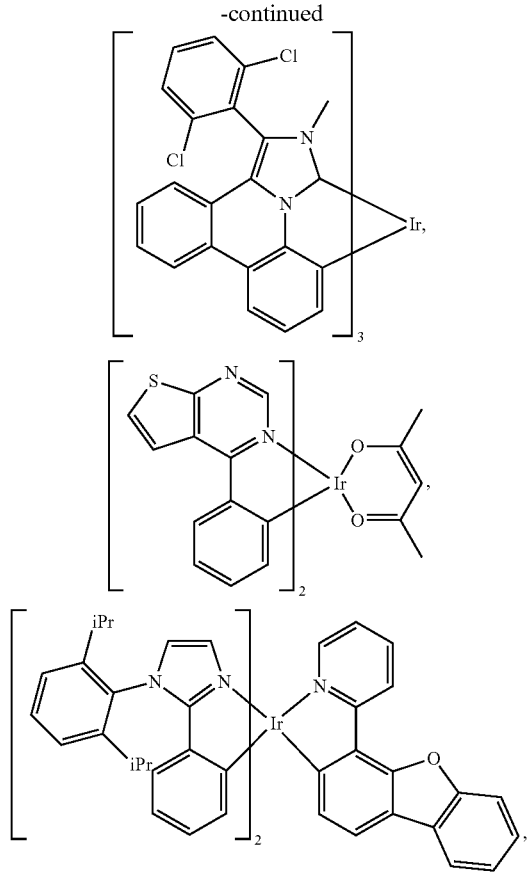
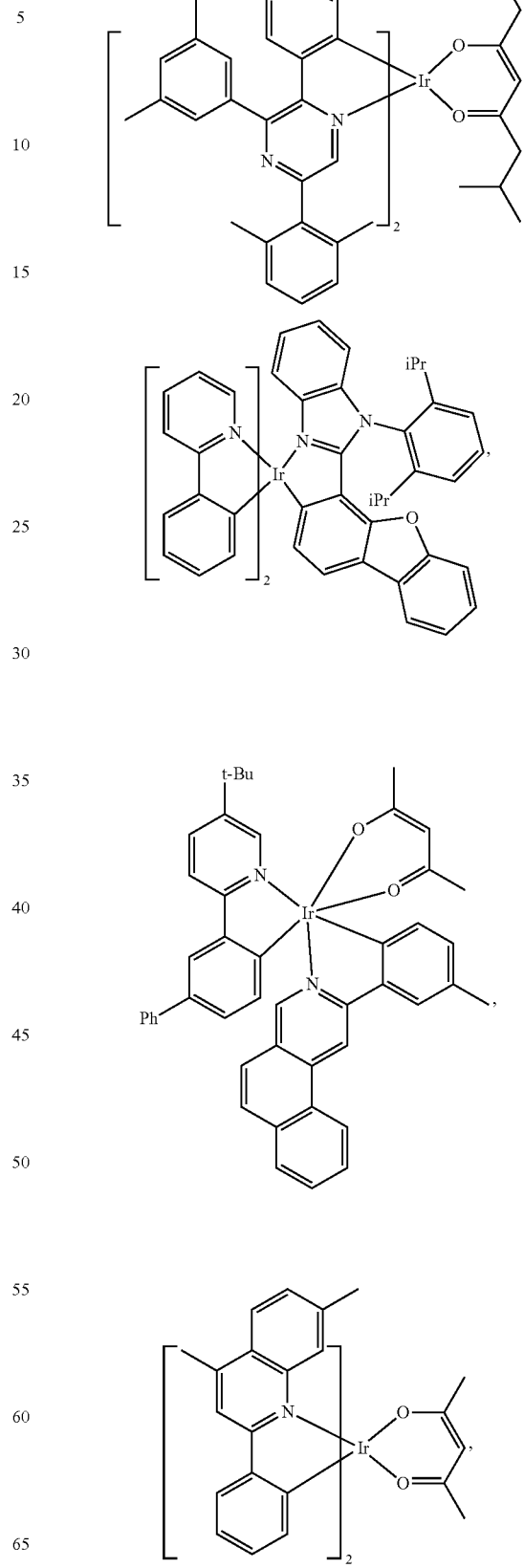

-continued
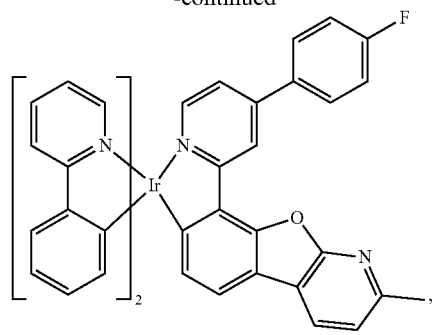
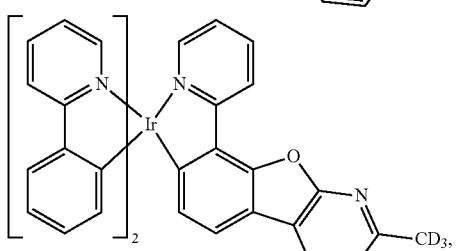
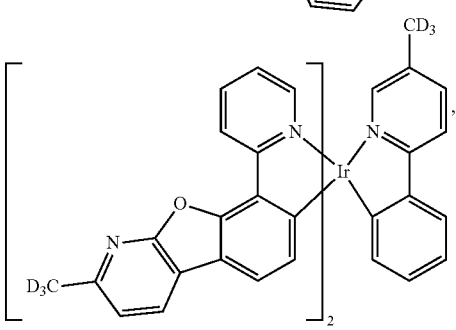
-continued
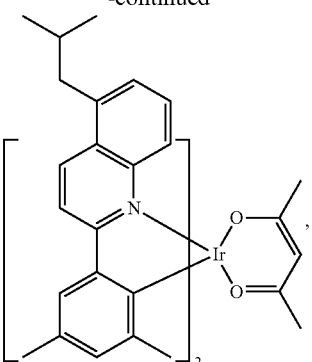
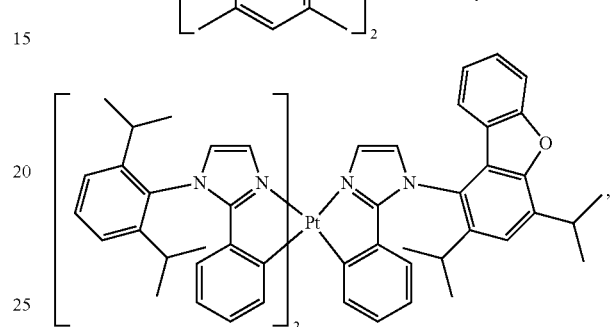
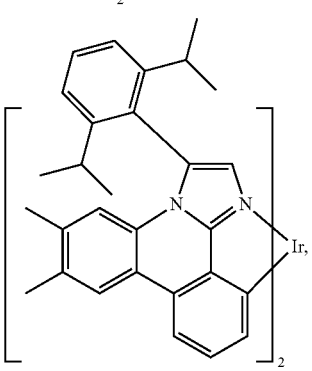

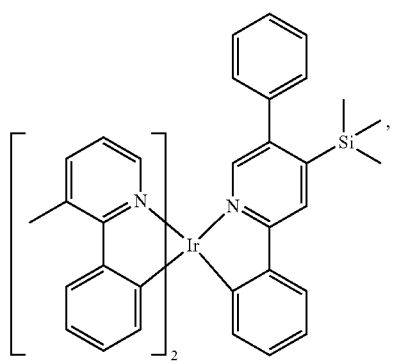
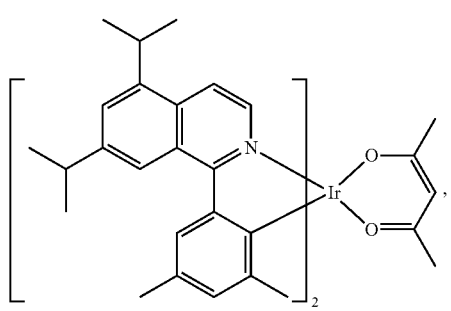
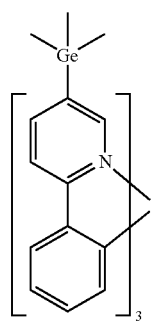
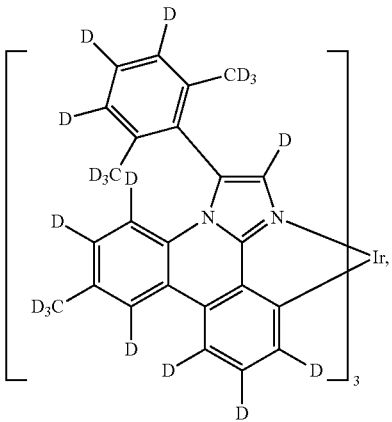
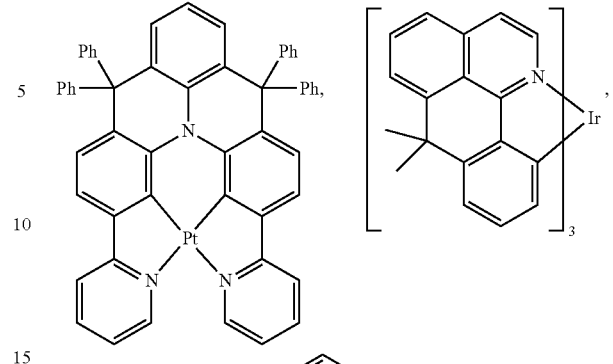
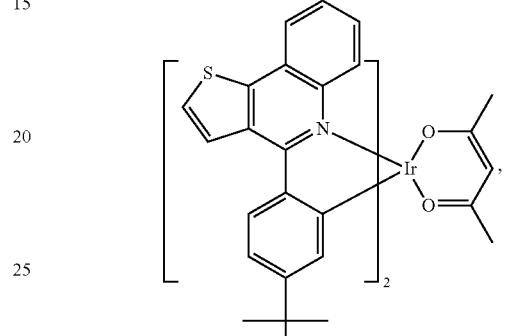
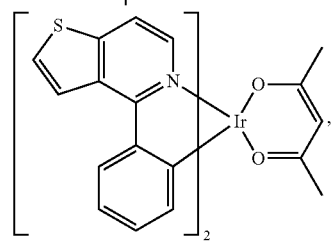
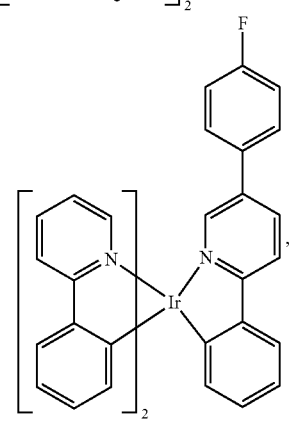
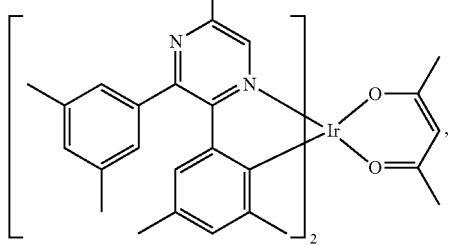

-continued
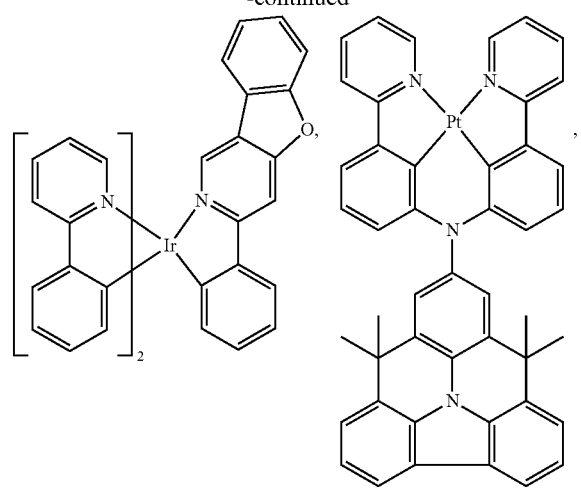
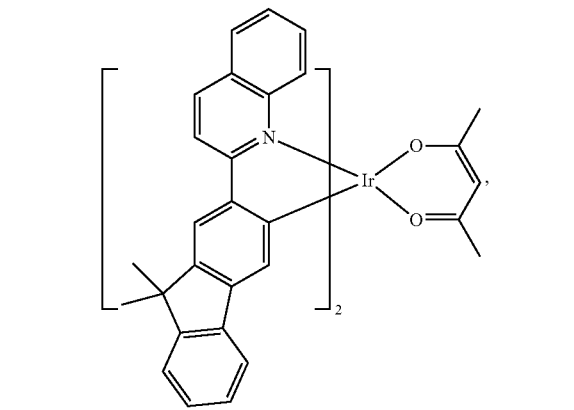
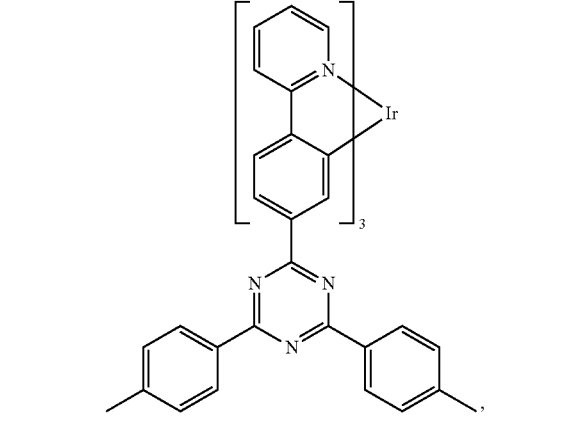
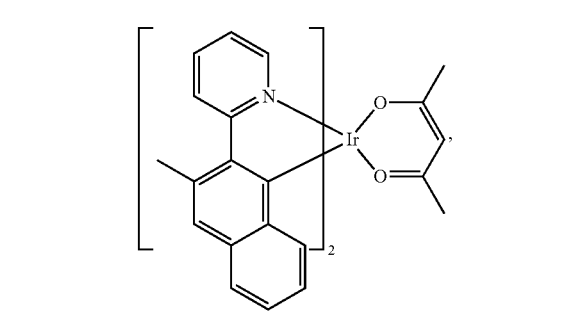
-continued
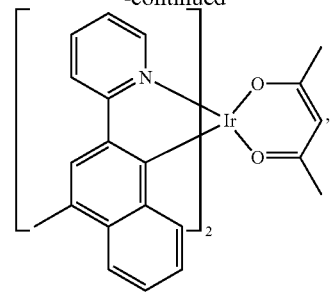
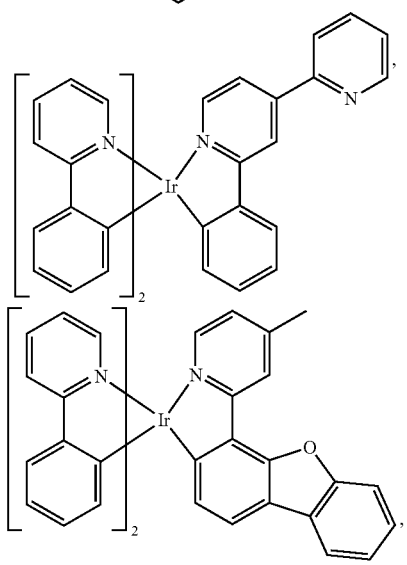
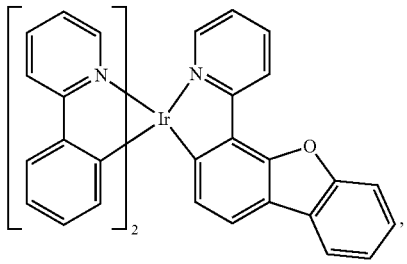
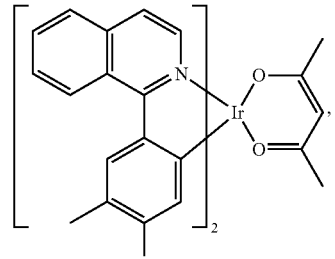
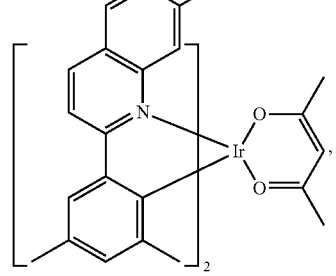

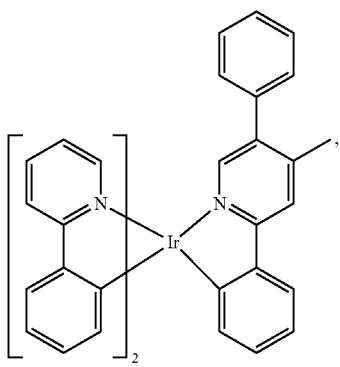
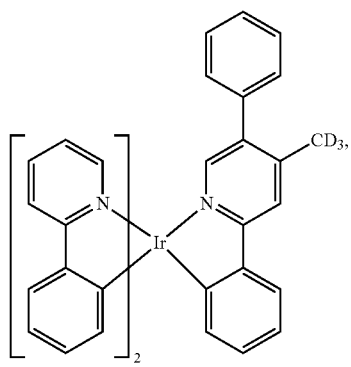
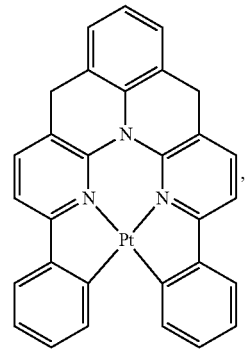
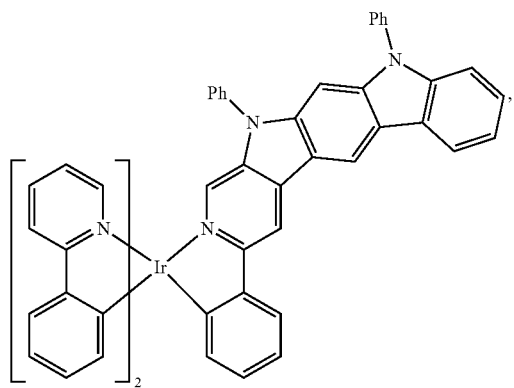
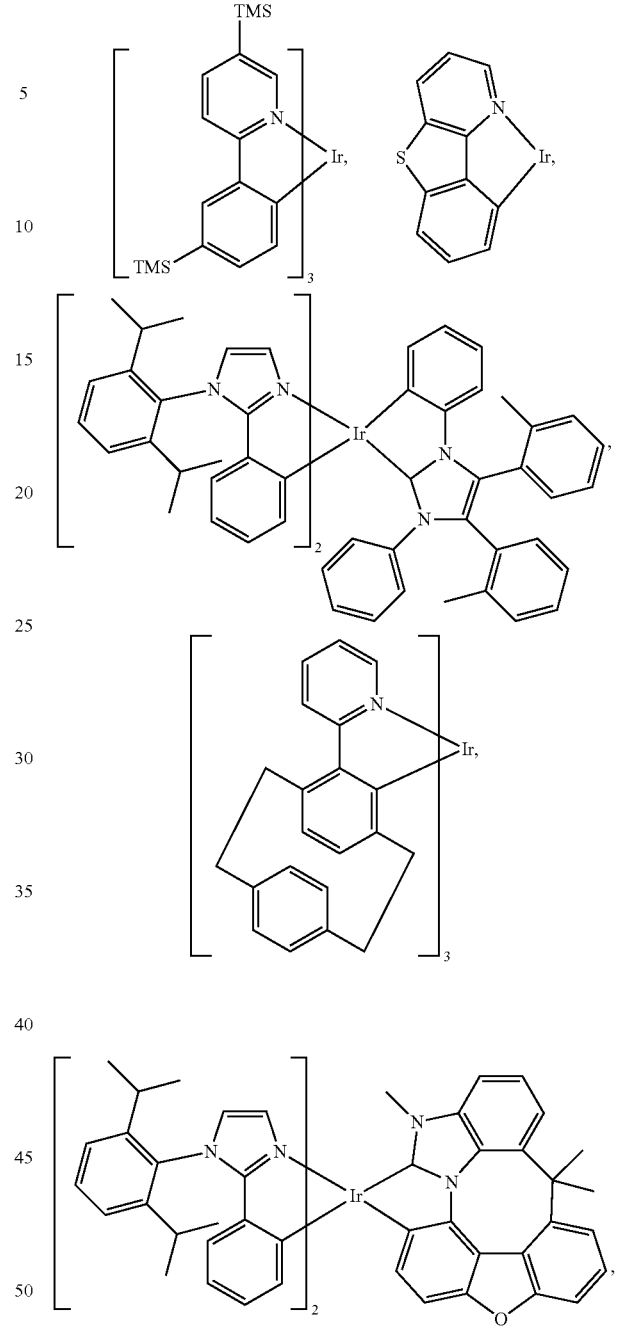
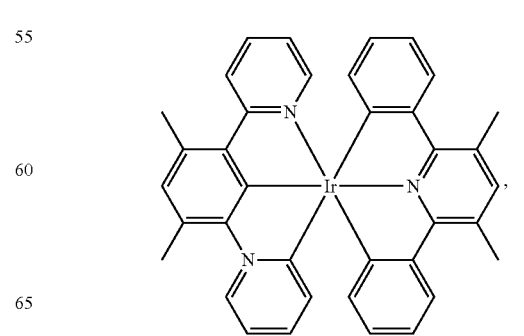

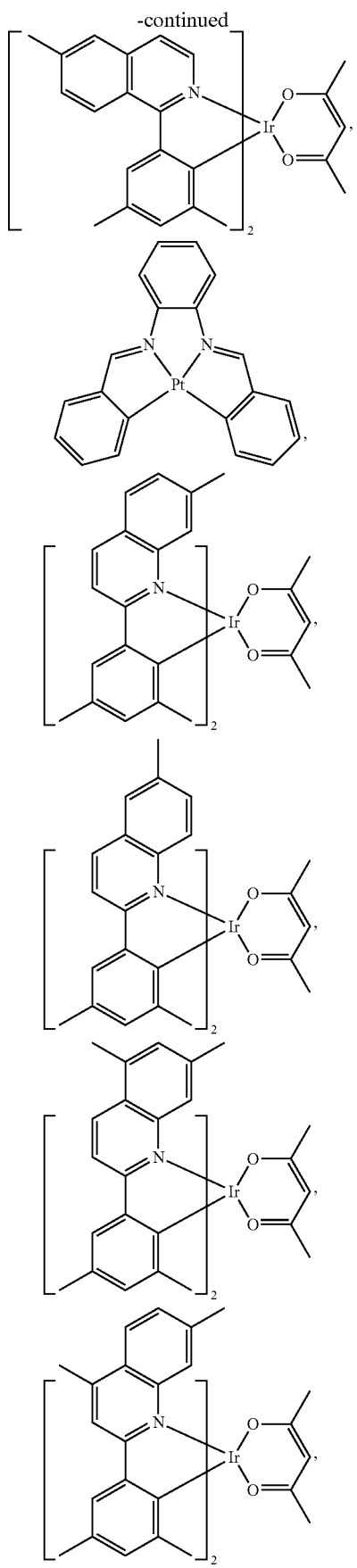
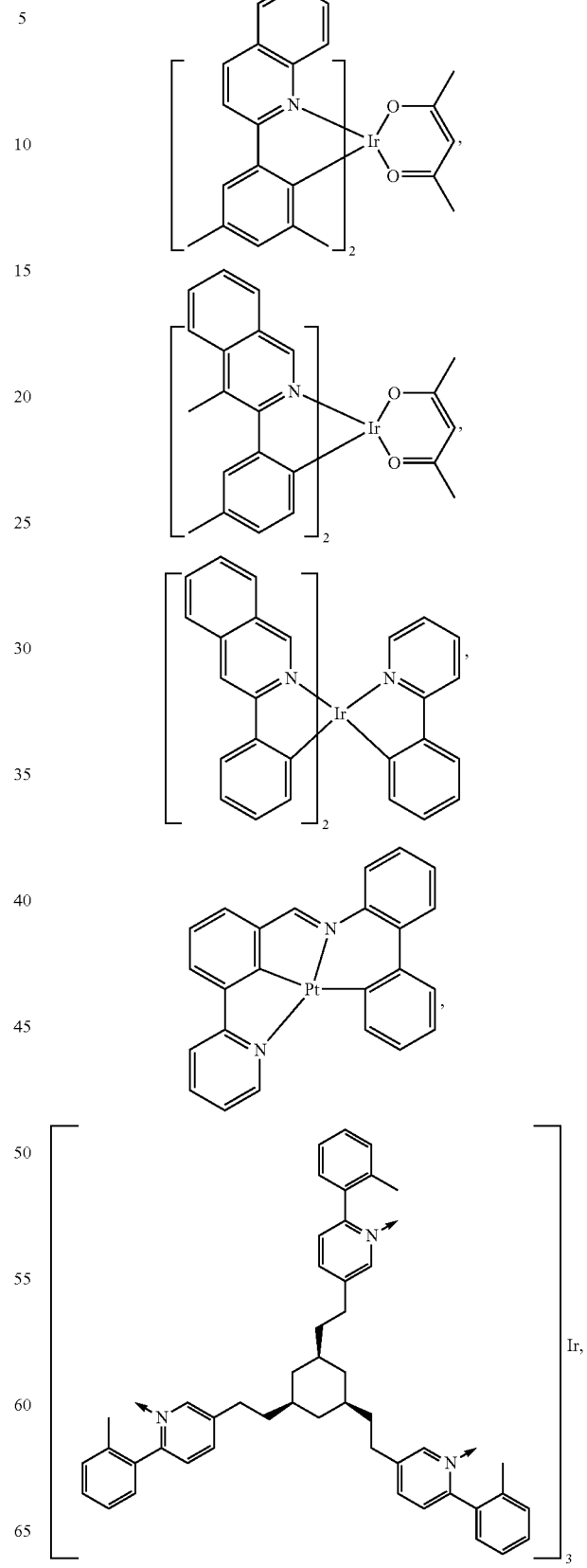

121
-continued
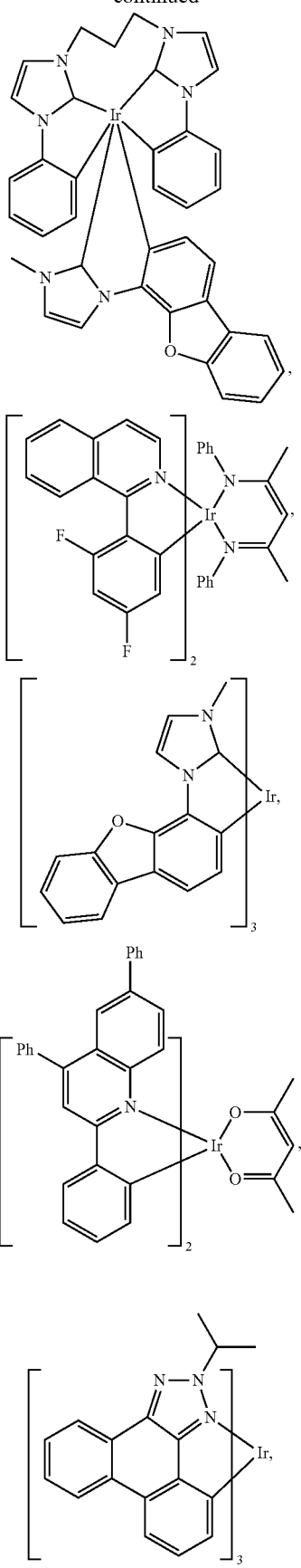
122
-continued
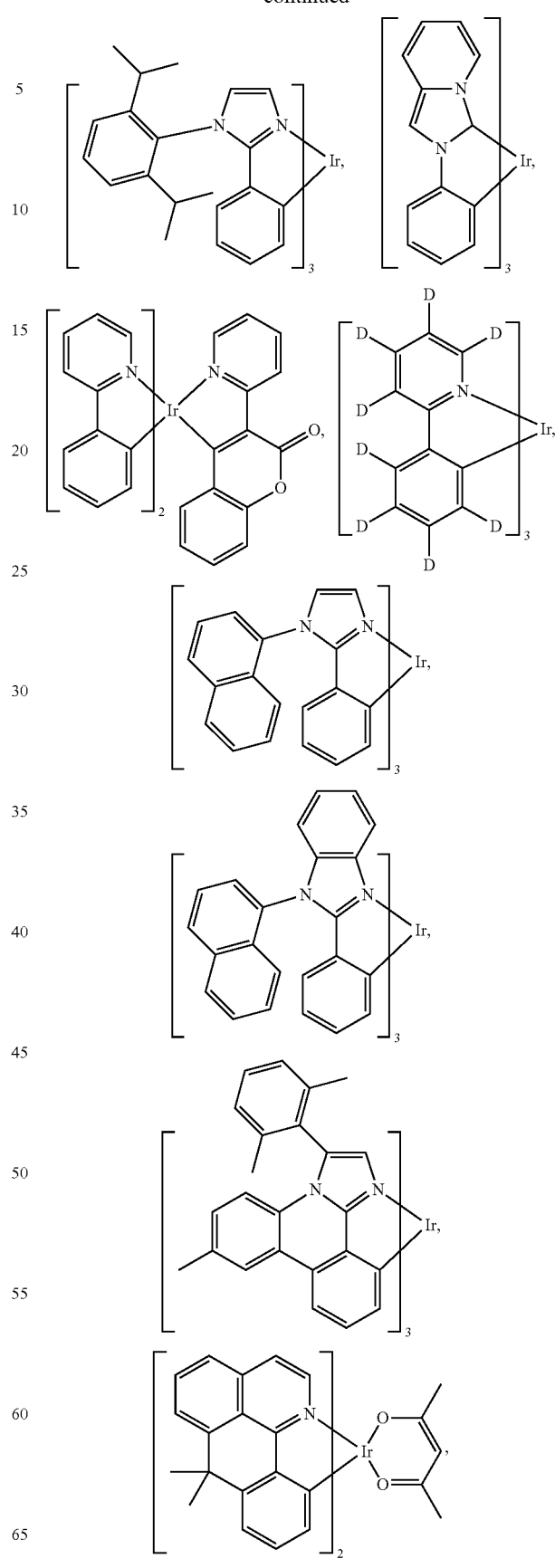

123
-continued

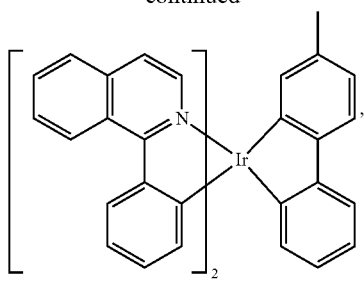

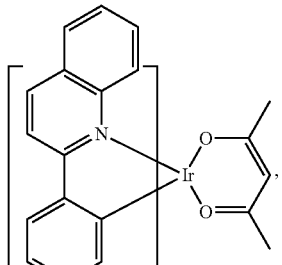

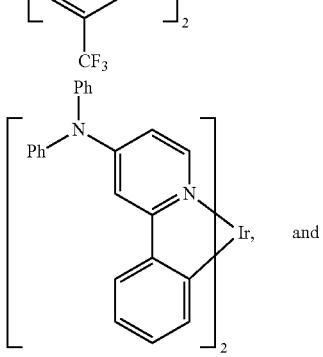

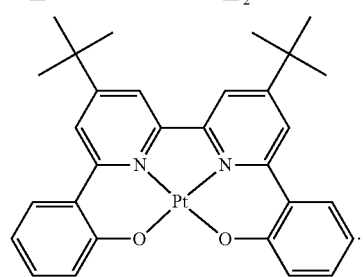

f) HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

124

In another aspect, compound used in HBL contains at least one of the following groups in the molecule:

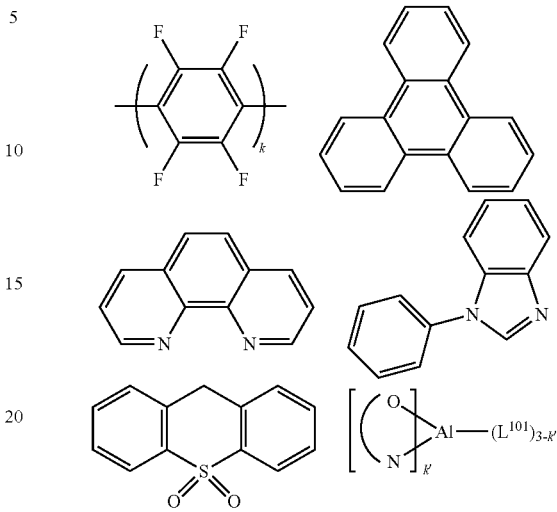

wherein k is an integer from 1 to 20; $L^{101}$ is another ligand, k' is an integer from 1 to 3.

g) ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

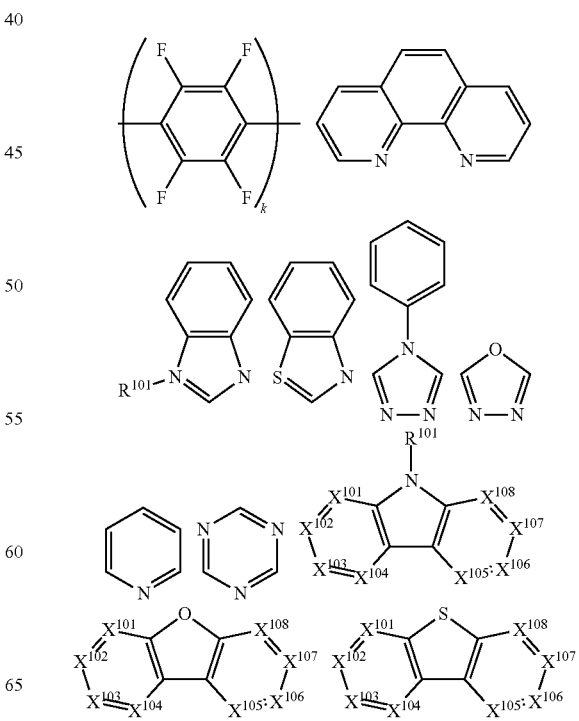

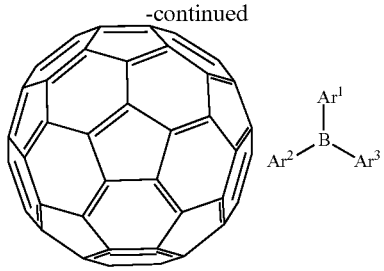

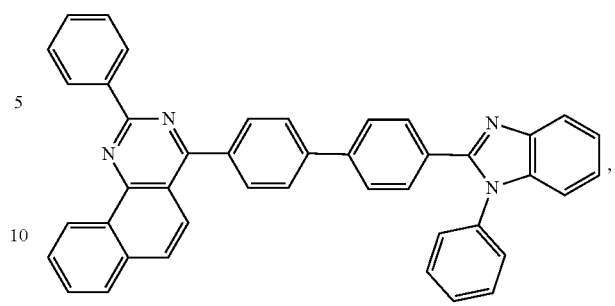

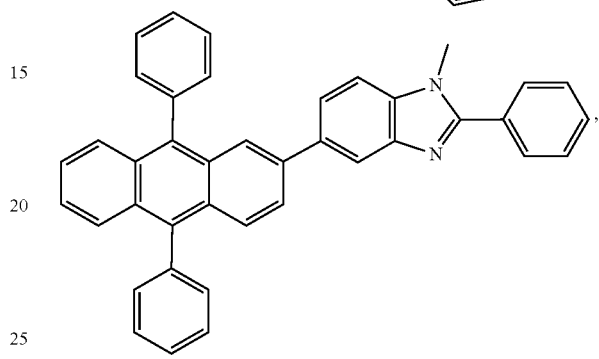

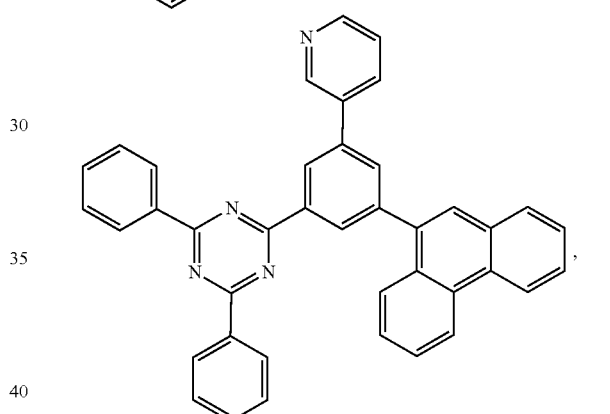

wherein R¹⁰¹ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. Ar¹ to Ar³ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

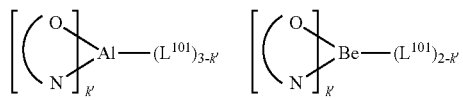

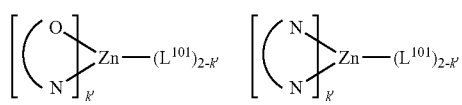

wherein (O—N) or (N—N) is a bidentate ligand, having metal coordinated to atoms O, N or N, N; is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

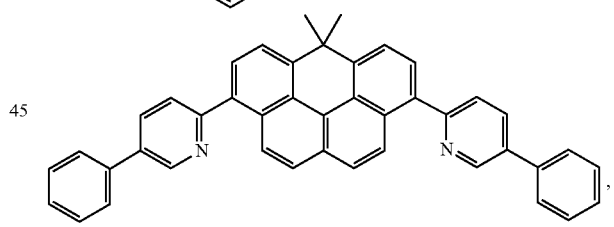

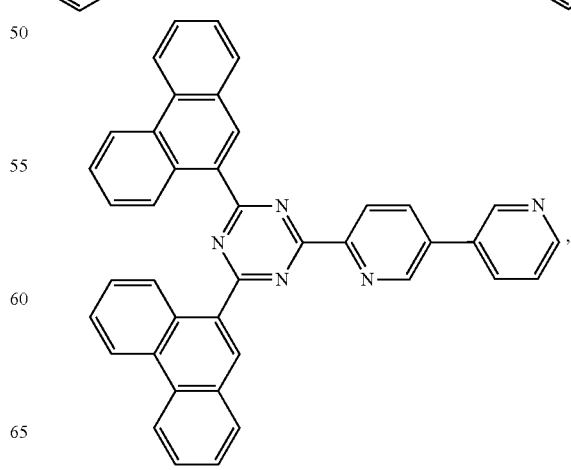

127
-continued
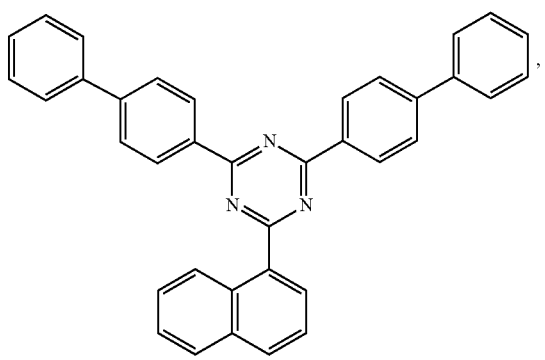
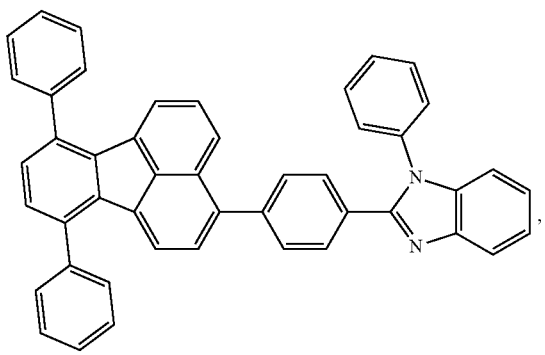
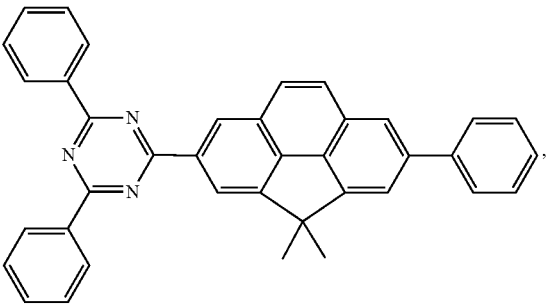
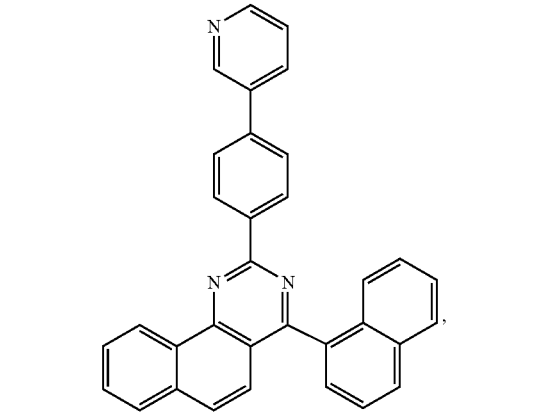
128
-continued
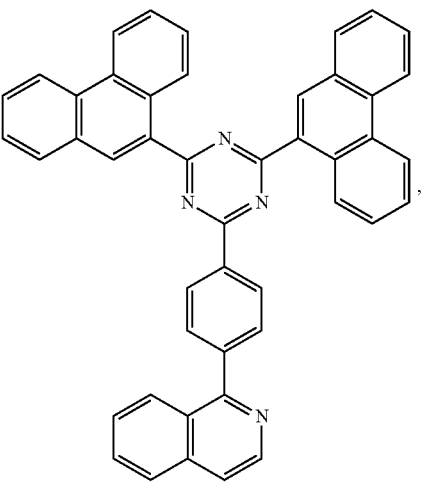
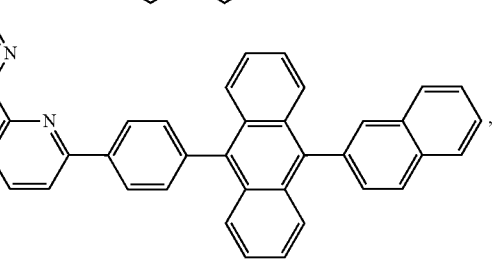
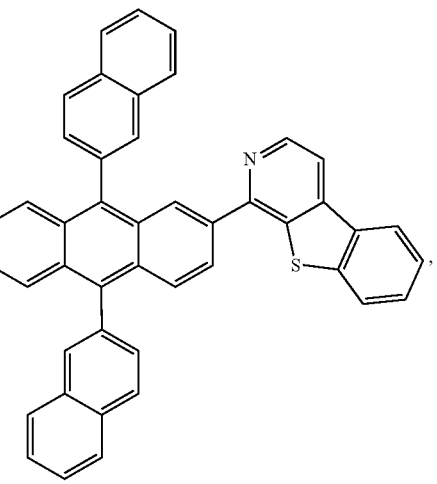
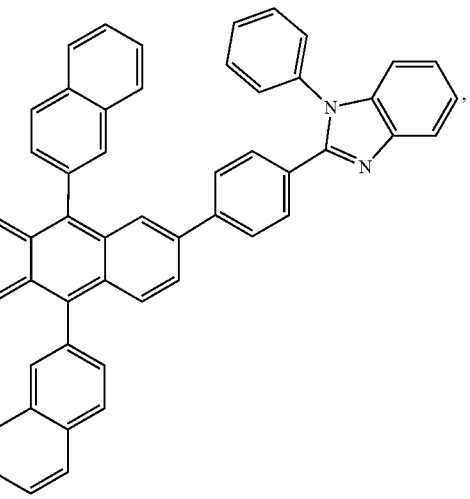

129
-continued
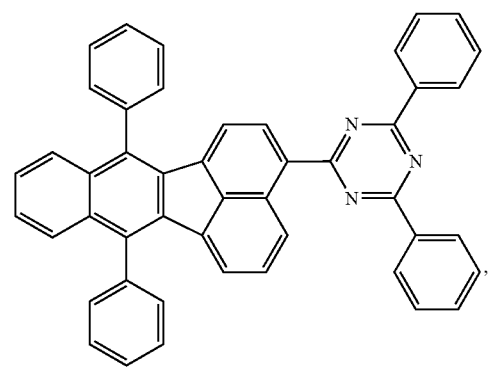
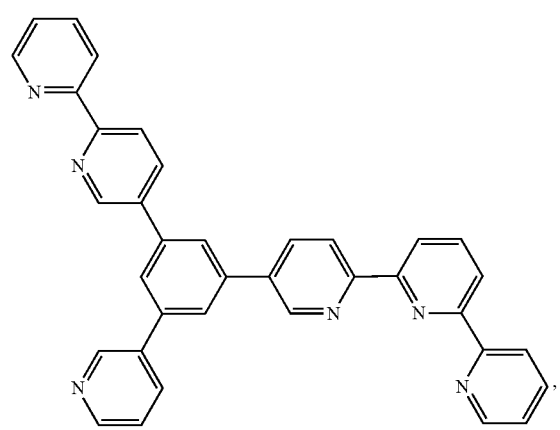
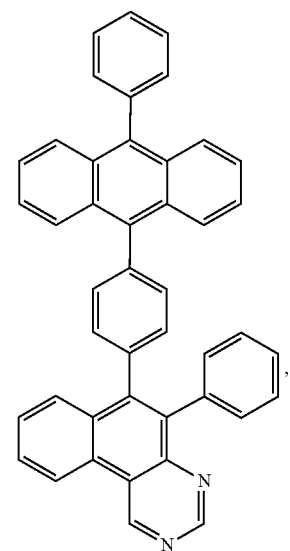
130
-continued
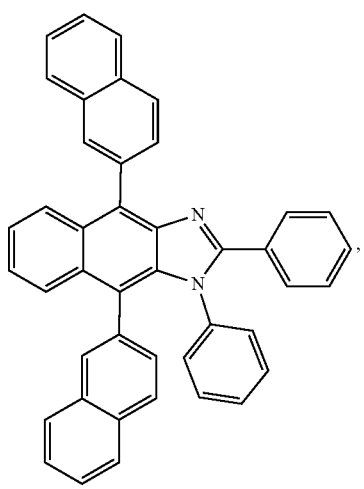
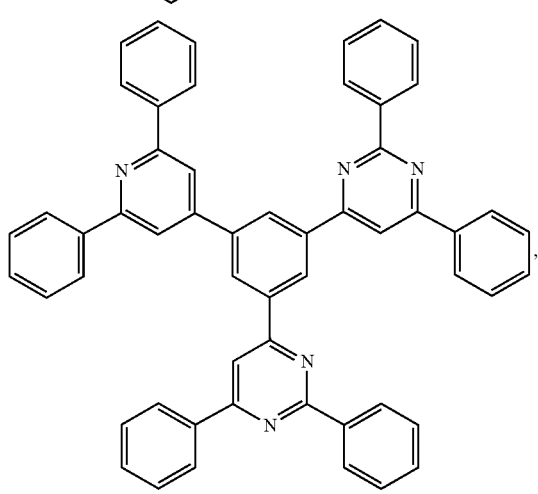
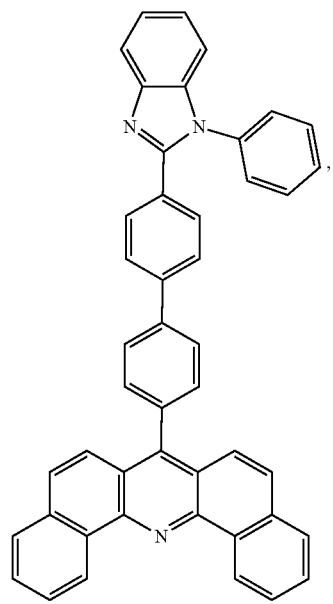

131
-continued
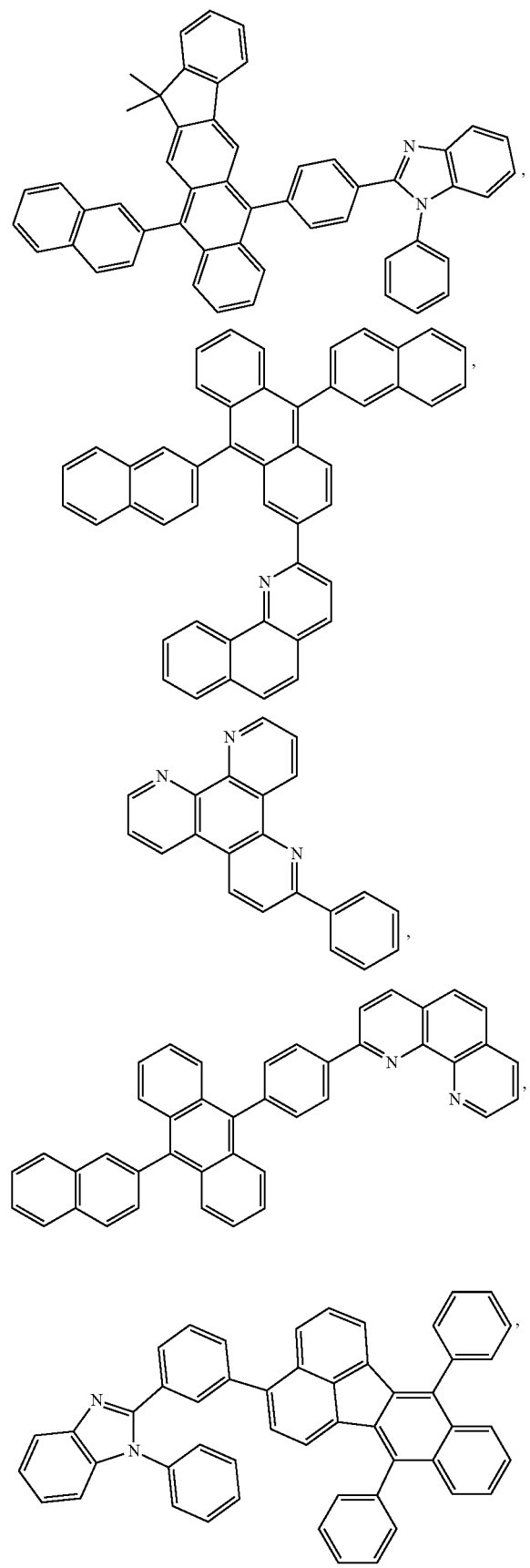
132
-continued
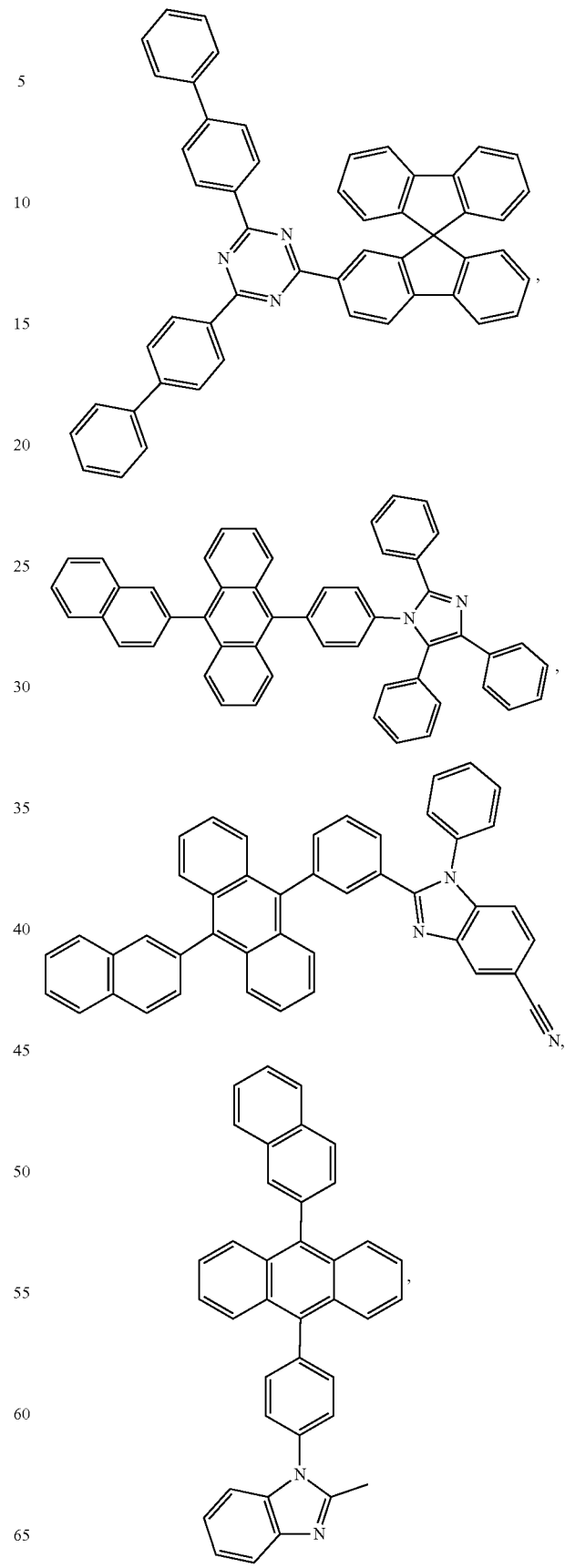

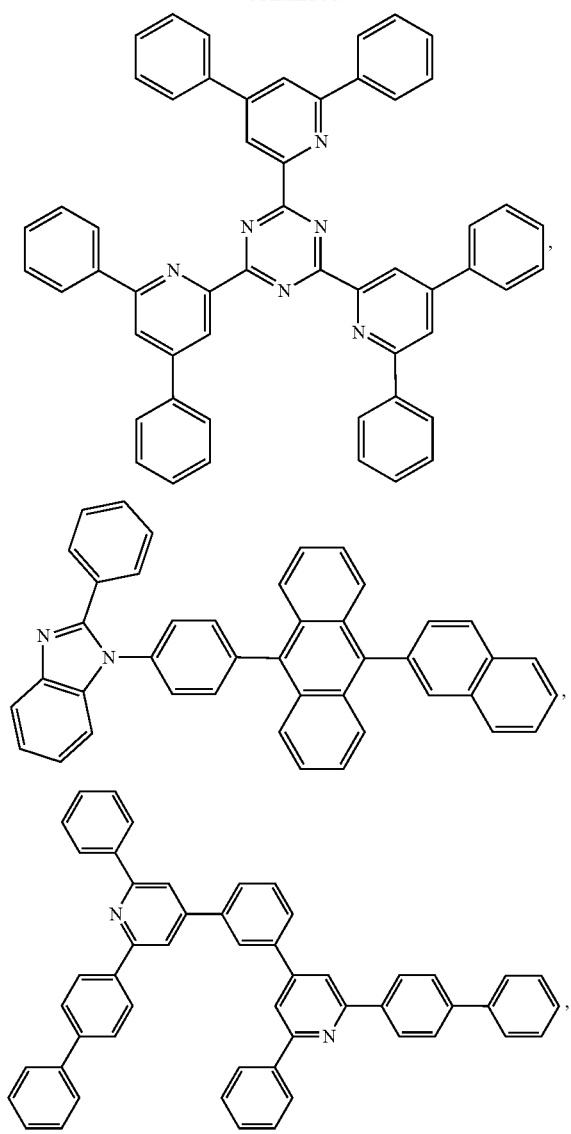

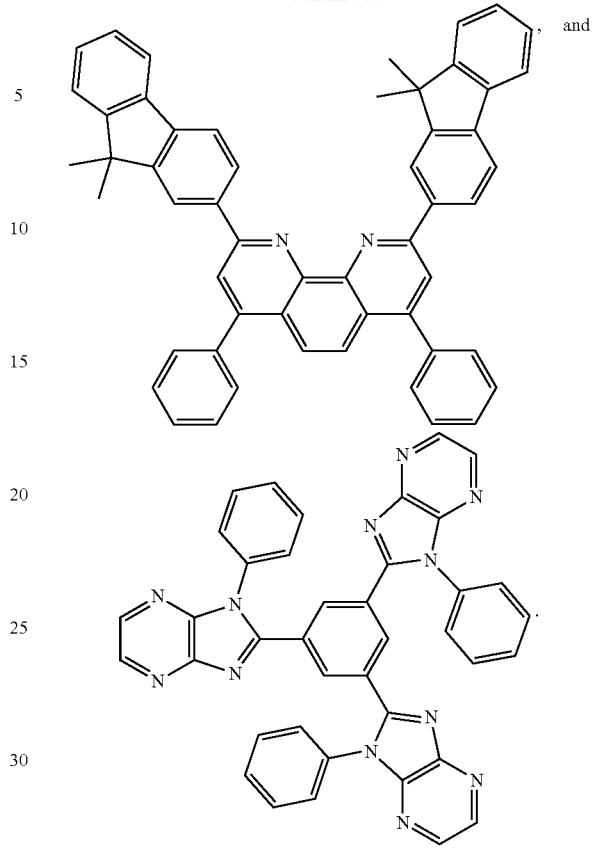

h) Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

It is understood that the various embodiments described herein are by way of example only and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

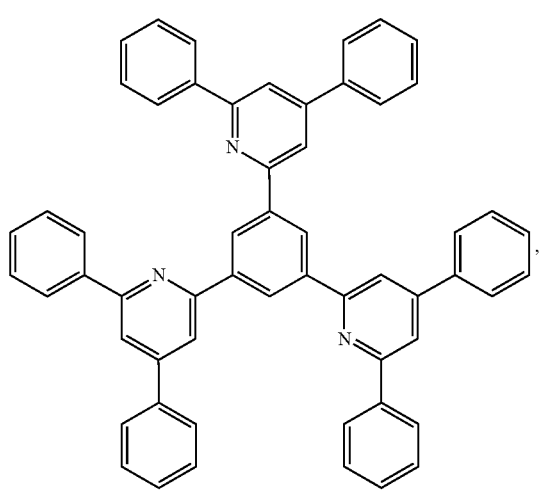

What is claimed is:

1. An organic light emitting device (OLED) comprising, sequentially:
   an anode;
   a first emissive region; and
   a cathode;
   wherein the first emissive region comprises:
      a first compound; and
      a second compound;
   wherein the first compound is a perovskite emitter that emits light from the OLED at room temperature;
   wherein the second compound is capable of functioning as an emitter in an OLED at room temperature, wherein the second compound is selected from the group consisting of phosphorescent emitters, fluorescent emitters, and delayed fluorescent emitters, wherein the phosphorescent emitters are selected from metal coordination complexes where the metal M is Rh, Re, Ru, Os, Pt, Au, Ag, or Cu; and
   wherein the first emissive region comprises a mixture of the first compound and the second compound.

2. The OLED of claim 1, wherein the first emissive region comprises one or more layers; wherein each of the one or more layers comprises at least one of the first compound and the second compound.

3. The OLED of claim 1, wherein the first emissive region emits light when a voltage is applied across the OLED, wherein emission energy of the second compound is higher than emission energy of the first compound; and excited states are transferred from the second compound to the first compound.

4. The OLED of claim 1, wherein the OLED emits a luminescent emission comprising an emission component from both the first compound and the second compound when a voltage is applied across the OLED; wherein at least 30% of the emission spectrum of the second compound is overlapped with the absorption spectrum of the first compound.

5. The OLED of claim 1, wherein the first compound is a perovskite compound having the formula of $[A]_a[B]_b[X]_c$;
   wherein [A] is one or more types of organic cation or metal cation; [B] is one or more types of metal or metalloid cation; and [X] is one or more types of anions; a is an integer from 1 to 6; b is an integer from 1 to 6; and c is an integer from 1 to 21.

6. The OLED of claim 1, wherein the second compound is capable of emitting light from a triplet excited state to a ground singlet state in the OLED at room temperature, wherein the second compound is a metal coordination complex having a metal-carbon bond or a metal-nitrogen bond, wherein the metal is selected from the group consisting of Rh, Re, Ru, Os, Pt, Au, Ag, and Cu.

7. The OLED of claim 1, wherein the second compound comprises at least one donor group and at least one acceptor group; and
   the second compound is a non-metal complex, or a Cu, Ag, or Au complex.

8. The OLED of claim 1, wherein the second compound comprises at least one of the chemical moieties selected from the group consisting of:

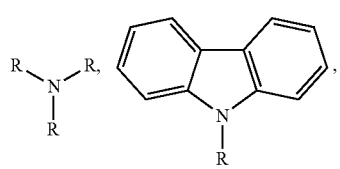

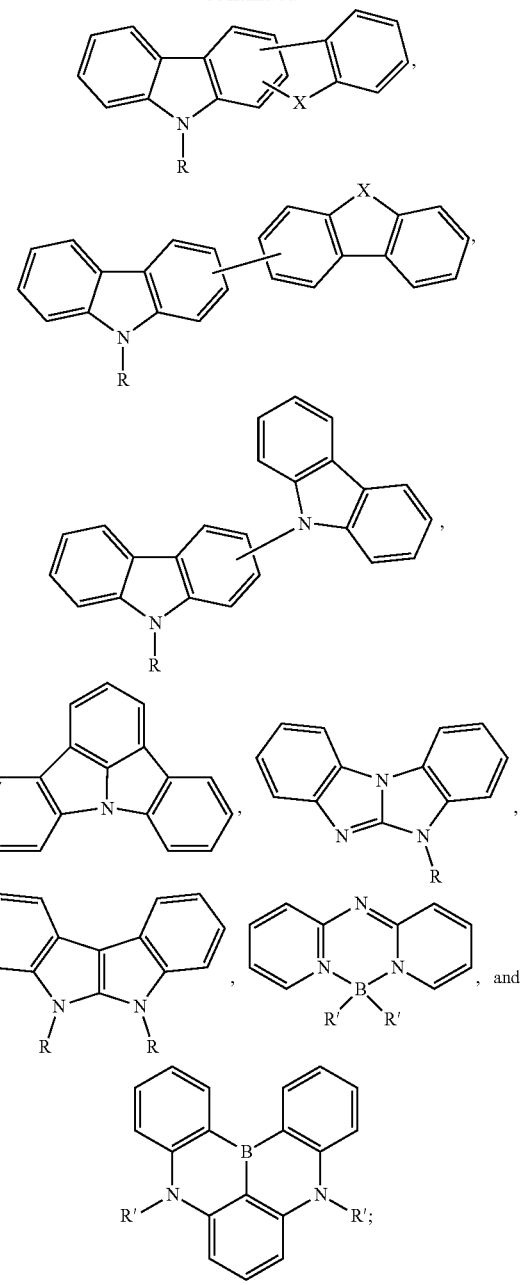

wherein:

X is selected from the group consisting of O, S, Se, and NR;

each R can be same or different and is an acceptor group, or an organic linker bonded to an acceptor group, or a terminal group selected from the group consisting of alkyl, cycloalkyl, heteroalkyl, heterocycloalkyl, arylalkyl, aryl, heteroaryl, and combinations thereof; and each R' can be same or different and is selected from the group consisting of alkyl, cycloalkyl, aryl, heteroaryl, and combinations thereof.

9. The OLED of claim 1, wherein the second compound comprises at least one organic group selected from the group consisting of:

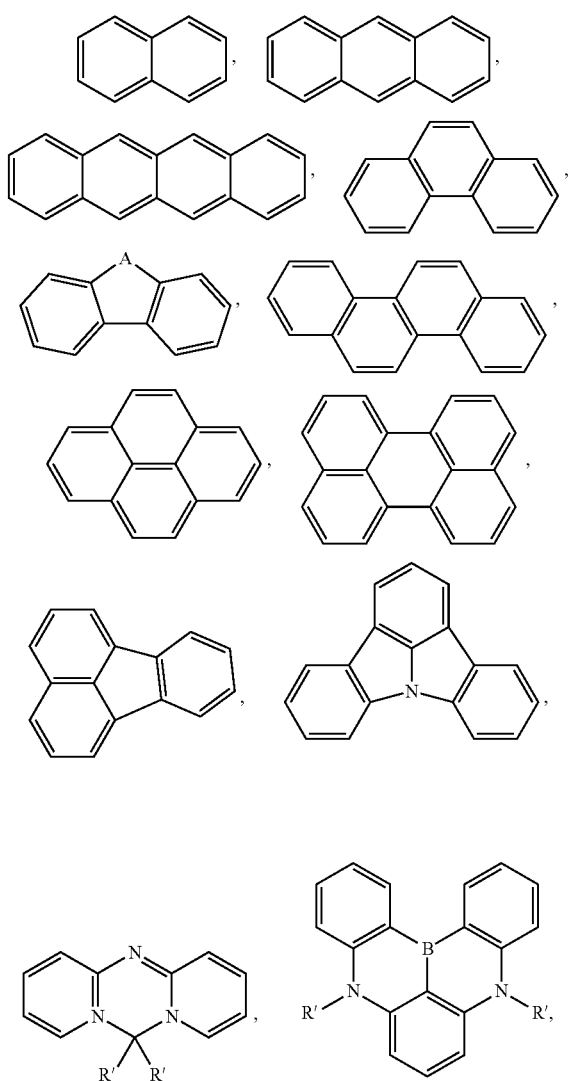
and aza analogues thereof;
wherein A is selected from the group consisting of O, S, Se, NR' and CR'R";
wherein each R' can be same or different and is selected from the group consisting of alkyl, cycloalkyl, aryl, heteroaryl, and combinations thereof.
10. The OLED of claim 1, wherein the second compound is selected from the group consisting of:
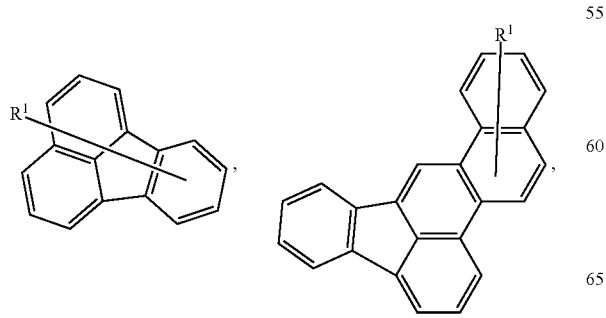
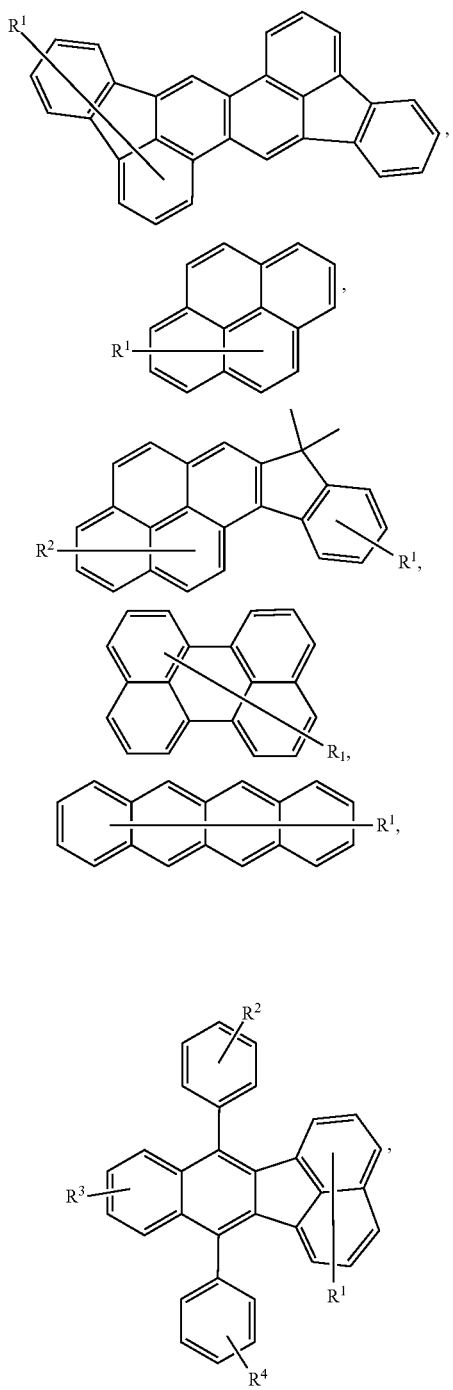
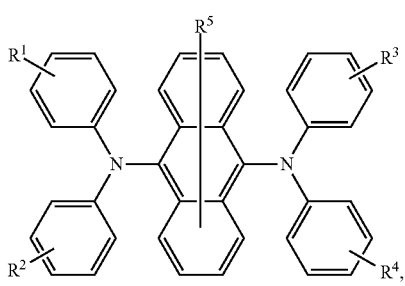

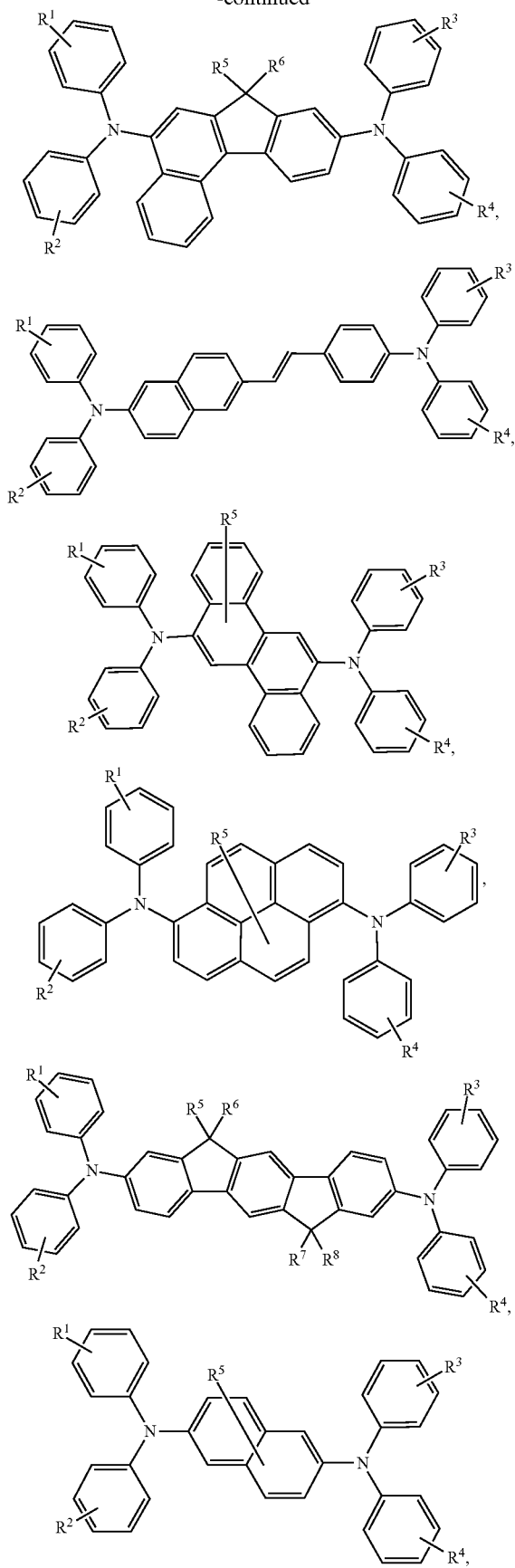

wherein $R^1$ to $R^5$ each independently represents from mono to maximum number of substitutions they can have, or no substitution;

wherein $R^1$ to $R^5$ are each independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof.

11. The OLED of claim 1, wherein the first emissive region further comprises a first host; wherein the first host has highest $S_1$ and $T_1$ energies among all materials in the first emissive region; and wherein the first and second compounds are dopants.

12. The OLED of claim 1, wherein the first compound and the second compound each has an emission energy, and difference between the emission energy of the first compound and emission energy of the second compound is at least 0.25 eV.

13. The OLED of claim 1, wherein at least one of the first compound and the second compound has photoluminescent quantum yield of at least 0.90.

14. The OLED of claim 1, wherein the OLED further comprises a second emissive region deposited between the anode and the cathode; wherein the second emissive region comprises a phosphorescent emitting material.

15. An organic light emitting device (OLED) comprising, sequentially:

an anode;

a first emissive region; and a cathode;

wherein the first emissive region comprises:

a first compound; and a second compound;

wherein the first compound is capable of functioning as a perovskite emitter in an OLED at room temperature;

wherein the second compound is capable of functioning as an emitter in an OLED at room temperature, wherein the second compound has the formula of $M(L^1)_x(L^2)_y(L^3)_z$;

wherein, metal M is Rh, Re, Ru, Os, Pt, Au, Ag, or Cu;

$L^1$, $L^2$ and $L^3$ can be the same or different;

x is 1, 2, or 3;

y is 0, 1, or 2;

z is 0, 1, or 2;

x+y+z is the oxidation state of the metal M;

$L^1$, $L^2$ and $L^3$ are each independently selected from the group consisting of:

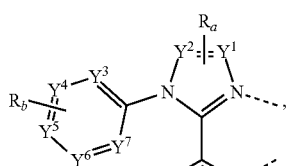

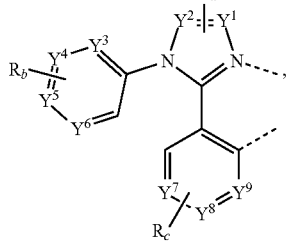

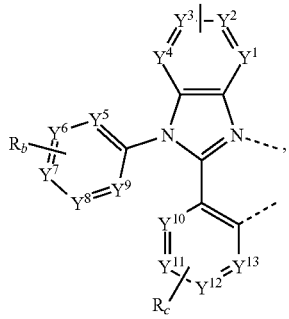

-continued

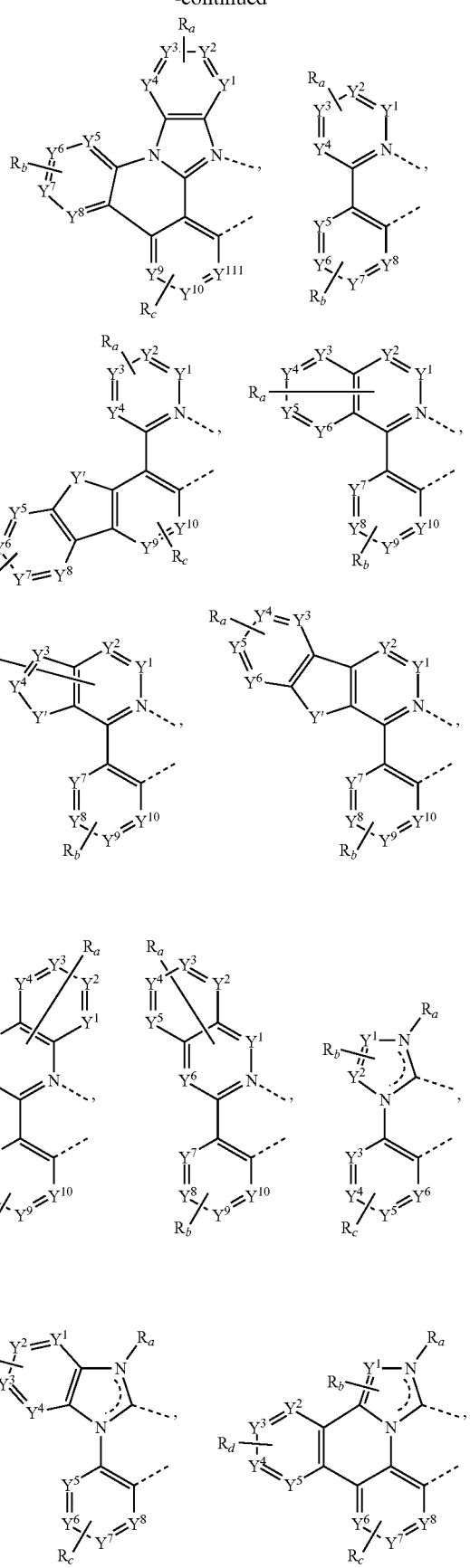

-continued

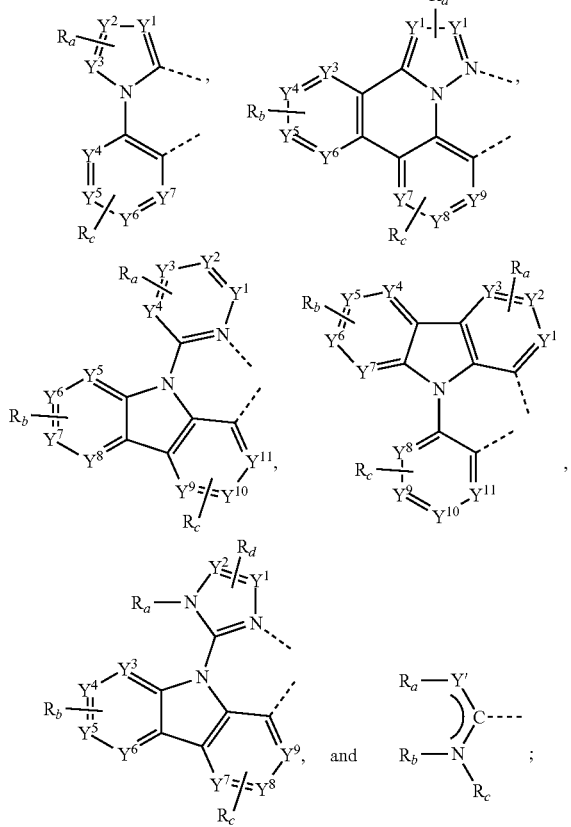

wherein:
L² and L³ can also be

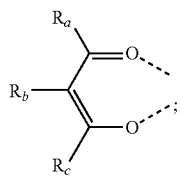

each $Y^1$ to $Y^{13}$ are independently selected from the group consisting of carbon and nitrogen;

Y' is selected from the group consisting of $BR_e$, $NR_e$, $PR_e$, O, S, Se, C=O, S=O, $SO_2$, $CR_eR_f$, $SiR_eR_f$, and $GeR_eR_f$;

$R_e$ and $R_f$ can be fused or joined to form a ring;

each $R_a$, $R_b$, $R_c$, and $R_d$ can independently represent from mono substitution to the maximum possible number of substitution, or no substitution;

each $R_a$, $R_b$, $R_c$, $R_d$, $R_e$ and $R_f$ is independently selected from the group consisting of hydrogen, deuterium, halogen, alkyl, cycloalkyl, heteroalkyl, heterocycloalkyl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof; and any two adjacent substituents of $R_a$, $R_b$, $R_c$, and $R_d$ can be fused or joined to form a ring or form a multidentate ligand.

16. The OLED of claim 15, wherein the first compound and the second compound are present as a mixture in the first emissive region.

17. The OLED of claim 15, wherein the second compound is a phosphorescent emitter.

18. An organic light emitting device (OLED) comprising, sequentially:
an anode;
a first emissive region; and
a cathode;
wherein the first emissive region comprises:
a first compound; and
a second compound;
wherein the first compound is capable of functioning as a perovskite emitter in an OLED at room temperature;
wherein the second compound is capable of functioning as an emitter in an OLED at room temperature, wherein the second compound is selected from the group consisting of phosphorescent emitters, fluorescent emitters, and delayed fluorescent emitters, wherein the phosphorescent emitters are selected from metal coordination complexes where the metal M is Rh, Re, Ru, Os, Pt, Au, Ag, or Cu; and
wherein:
the first emissive region emits light when a voltage is applied across the OLED, wherein emission energy of the second compound is higher than emission energy of the first compound and excited states are trahsferred from the second compound to the first compound.

19. The OLED of claim 18, wherein each of the first compound and the second compound are in separate layers within the first emissive region.

20. The OLED of claim 18, wherein each of the first compound and the second compound are in separate layers within the first emissive region.

* * * * *